(12) United States Patent
Lee et al.

(10) Patent No.: US 11,195,898 B2
(45) Date of Patent: Dec. 7, 2021

(54) ORGANIC LIGHT EMITTING DIODE DISPLAY DEVICE

(71) Applicant: Samsung Display Co., Ltd., Yongin-si (KR)

(72) Inventors: Minsu Lee, Yongin-si (KR); Yong Sung Park, Seoul (KR); Dae-Hyun Noh, Hwaseong-si (KR); Seung Bin Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 26 days.

(21) Appl. No.: 16/547,519

(22) Filed: Aug. 21, 2019

(65) Prior Publication Data
US 2020/0243637 A1 Jul. 30, 2020

(30) Foreign Application Priority Data
Jan. 29, 2019 (KR) .......................... 10-2019-0011439

(51) Int. Cl.
| | | |
|---|---|---|
| *H01L 27/32* | (2006.01) | |
| *H01L 51/52* | (2006.01) | |
| *H01L 23/528* | (2006.01) | |
| *H01L 23/50* | (2006.01) | |
| *G09G 3/3233* | (2016.01) | |

(52) U.S. Cl.
CPC .......... *H01L 27/3276* (2013.01); *H01L 23/50* (2013.01); *H01L 23/5286* (2013.01); *H01L 27/3244* (2013.01); *H01L 27/3258* (2013.01); *H01L 51/529* (2013.01); *G09G 3/3233* (2013.01)

(58) Field of Classification Search
CPC ... H01L 27/3276–3279; H01L 27/3258; H01L 27/3244; H01L 23/5286; H01L 23/50; H01L 51/5253–5256; H01L 51/529
See application file for complete search history.

(56) References Cited

U.S. PATENT DOCUMENTS

| | | |
|---|---|---|
| 9,424,777 B2 | 8/2016 | Kong et al. |
| 10,096,594 B2 | 10/2018 | Chung |

(Continued)

FOREIGN PATENT DOCUMENTS

KR 10-2017-0027901 3/2017

*Primary Examiner* — Errol V Fernandes
*Assistant Examiner* — Jeremy J Joy
(74) *Attorney, Agent, or Firm* — H.C. Park & Associates, PLC

(57) ABSTRACT

An organic light emitting diode display device includes a substrate, a light emitting layer, a first power supply wire, a second power supply wire, a connection pattern, and an upper electrode. The substrate has a display region, a peripheral region surrounding the display region and including first, second, and third peripheral regions, and a pad region disposed on one side of the peripheral region. The light emitting layer is disposed in the display region on the substrate. The first power supply wire is disposed in the second and third peripheral regions and a part of the first peripheral region on the substrate. The second power supply wire is disposed in the display region, the first peripheral region, and the third peripheral region on the substrate without being disposed in the second peripheral region, and is located inward of the first power supply wire.

27 Claims, 34 Drawing Sheets

(56) References Cited

U.S. PATENT DOCUMENTS

| | | | | |
|---|---|---|---|---|
| 2006/0060850 A1* | 3/2006 | Kwak | ............... | H01L 27/124 |
| | | | | 257/59 |
| 2006/0145606 A1* | 7/2006 | Lee | ............... | H01L 27/3276 |
| | | | | 313/509 |
| 2015/0008400 A1* | 1/2015 | Kim | ............... | H01L 51/56 |
| | | | | 257/40 |
| 2017/0249896 A1* | 8/2017 | Kim | ............... | G09G 3/3266 |
| 2017/0287995 A1* | 10/2017 | Kim | ............... | H01L 27/3276 |
| 2019/0006442 A1* | 1/2019 | Byun | ............... | H01L 27/3246 |

\* cited by examiner

ORGANIC LIGHT EMITTING DIODE DISPLAY DEVICE

CROSS-REFERENCE TO RELATED APPLICATION

This application claims priority from and the benefit of Korean Patent Application No. 10-2019-0011439, filed on Jan. 29, 2019, which is hereby incorporated by reference for all purposes as if fully set forth herein.

BACKGROUND

Field

Exemplary embodiments of the invention relate generally to an organic light emitting diode display device and, more specifically, to an organic light emitting diode display device including a low and high power supply wires.

Discussion of the Background

Flat panel display devices are used as display devices in favor of cathode ray tube display devices due to their lightweight and thin characteristics. As representative examples of such flat panel display devices, there are a liquid crystal display device and an organic light emitting diode display device.

The organic light emitting diode display device may include a display region, a peripheral region surrounding the display region, and a pad region located on one side of the peripheral region. A plurality of pixel circuits and a plurality of organic light emitting diodes may be disposed in the display region, and first and second power supply wires may be disposed in the peripheral region. In addition, a plurality of pad electrodes may be disposed in the pad region. For example, a low power supply voltage and a high power supply voltage may be generated from an external device, and the voltages may be provided to the first and second power supply wires through the pad electrodes, respectively. In addition, the low power supply voltage applied to the first power supply wire may be provided to a cathode electrode of the organic light emitting diode, and the high power supply voltage applied to the second power supply wire may be provided to an anode electrode of the organic light emitting diode. In other words, the first and second power supply wires are disposed together in the peripheral region, so that the width of the first power supply wire may be relatively small.

The above information disclosed in this Background section is only for understanding of the background of the inventive concepts, and, therefore, it may contain information that does not constitute prior art.

SUMMARY

Applicant discovered that when organic light emitting diode display device having first and second power supply wires are driven at a high luminance, current may be concentrated in the first power supply wire disposed in the peripheral region adjacent to the pad region (e.g., both lower side ends of the peripheral region), thereby increasing temperature. In this case, the first power supply wire may be short-circuited or an insulating layer located around the first power supply wire may be deformed due to heat generation.

Display devices constructed according to exemplary implementations of the invention avoid short circuits and heat damage by reducing the heat generated in the power supply wire in part of the peripheral region.

For example, the first power supply wire and the connection pattern of the display may have relatively wide widths, so that heat generated in the first power supply wire located in parts of the peripheral region of the display may be reduced relative to conventional displays.

In addition, a relatively greater number of openings may be provided to allow the connection pattern to make direct contact with the first power supply wire disposed in part of the peripheral region. In other words, in the display device, the heat generated in the first power supply wire in the peripheral region may be further reduced. Accordingly, defects in display device due to the heat generation of the first power supply wire occurring in peripheral region may be reduced compared to conventional designs.

Additional features of the inventive concepts will be set forth in the description which follows, and in part will be apparent from the description, or may be learned by practice of the inventive concepts.

According to some exemplary embodiments, an organic light emitting diode display device includes a substrate, a light emitting layer, a first power supply wire, a second power supply wire, a connection pattern, and an upper electrode. The substrate has a display region, a peripheral region at least partially surrounding the display region and including first, second, and third peripheral regions, and a pad region disposed on one side of the peripheral region. The light emitting layer is disposed on the substrate in the display region. The first power supply wire is disposed in the second and third peripheral regions and a part of the first peripheral region on the substrate. The second power supply wire is disposed in the display region, the first peripheral region, and the third peripheral region on the substrate without being disposed in the second peripheral region, and is being at least partially surrounded by the first power supply wire. The conductive pattern is partially overlapped with the first power supply wire in the second and third peripheral regions and the part of the first peripheral region on the first power supply wire, and is electrically connected to the first power supply wire. The upper electrode is disposed in the display region and a part of the peripheral region on the conductive pattern and the light emitting layer, and is partially overlapped with the first power supply wire and the conductive pattern. The upper electrode is electrically connected to the conductive pattern.

The organic light emitting diode display device may further include a plurality of pad electrodes disposed in a first part of the pad region. The first peripheral region may be adjacent to the first part of the pad region where the pad electrodes are disposed, and the second peripheral region may be located on opposed sides of the first peripheral region while being adjacent to a second part of the pad region where the pad electrodes are not disposed.

The first power supply wire includes a wire that may be electrically connected to the pad electrodes in the first peripheral region.

At least one of the conductive pattern and the upper electrode may have an undulating shape in the first peripheral region.

A low power supply voltage may be applied to the first power supply wire, and a high power supply voltage may be applied to the second power supply wire.

The second power supply wire includes a wire that may include a first portion disposed in the first peripheral region, a second portion disposed in the display region and having a grid shape, and a third portion disposed in a part of the third peripheral region to at least partially surround the second portion. The first, second, and third portions of the second power supply wire may be formed integrally with each other.

The first and second portions of the second power supply wire may be connected to each other in the first peripheral region adjacent to a part of a boundary between the display region and the peripheral region, and the second and third portions of the second power supply wire may be connected to each other in the third peripheral region adjacent to another part of the boundary between the display region and the peripheral region.

The third portion of the second power supply wire may be spaced apart from an inner side of the first power supply wire.

The third portion of the second power supply wire might not be disposed in the second peripheral region.

The second portion of the second power supply wire may have a lattice shape in one part of the display region, and may have a bar shape in another part of the display region.

The display region may have a rectangular shape with curved corners. the curved corners of the display region may include first corners adjacent to the pad region and second corners facing the first corners.

The first corners may be adjacent to the second peripheral region, and the second corners may be adjacent to the third peripheral region.

The first power supply may have a first width in the second peripheral region, and may have a second width in the third peripheral region, the second width being smaller than the first width.

The organic light emitting diode display device may further include a protective insulating layer, a first planarization layer, and a second planarization layer. The protective insulating layer may be disposed in the display region and the peripheral region between the substrate and the light emitting layer, and may define an opening in the second peripheral region. The first planarization layer may be disposed in the display region and a part of the peripheral region on the protective insulating layer to expose the opening of the protective insulating layer. The second planarization layer may be disposed in the display region and a part of the peripheral region on the first planarization layer, and may have a plurality of openings exposing the first power supply wire in the second peripheral region.

The second planarization layer located in the first peripheral region may be formed without the plurality of openings exposing the first power supply wire.

The second planarization layer located in the first peripheral region may have an undulating shape.

The organic light emitting diode display device may further include a plurality of concave convex patterns disposed between the first planarization layer and the second planarization layer.

The light emitting layer may extend from the display region to the peripheral region, and the light emitting layer located in the peripheral region might not be overlapped with the plurality of openings of the second planarization layer in the second peripheral region.

The organic light emitting diode display device may further include a lower electrode disposed in the display region on the second planarization layer. The upper electrode may be disposed on the lower electrode and the upper electrode extends from the display region to the peripheral region.

The upper electrode may make direct contact with the conductive pattern in the second peripheral region.

The upper electrode may have an undulating shape in the first peripheral region, and the upper electrode may make direct contact with the conductive pattern in the first peripheral region.

The lower electrode may be located on a same layer with the conductive pattern.

The first power supply wire may include a first sub-power supply wire and a second sub-power supply wire. The first sub-power supply wire may be disposed between the substrate and the protective insulating layer, and may be exposed by the opening of the protective insulating layer. The second sub-power supply wire may be disposed between the first planarization layer and the second planarization layer, and may be in direct contact with the first sub-power supply wire through the opening of the protective insulating layer. The second sub-power supply wire may be exposed by the openings of the second planarization layer.

The conductive pattern includes a connection pattern may be in direct contact with the second sub-power supply wire through the plurality of openings of the second planarization layer.

The organic light emitting diode display device may further include a semiconductor element disposed in the display region between the substrate and the protective insulating layer and a wire pattern and a connection electrode disposed in the display region between the first planarization layer and the second planarization layer.

The wire pattern and the connection electrode may be located on the same layer as the second sub-power supply wire.

The semiconductor elements may include an active layer disposed in the display region on the substrate, a gate insulating layer disposed on the active layer, a gate electrode disposed on the gate insulating layer, an insulating interlayer disposed on the gate electrode, and source and drain electrodes disposed on the insulating interlayer.

The source and drain electrodes may be located on a same layer with the first sub-power supply wire.

According to some exemplary embodiments, an organic light emitting diode display device includes a substrate, a light emitting layer, a first power supply wire, a second power supply wire, a planarization layer, a connection pattern, and an upper electrode. The substrate has a display region, a peripheral region at least partially surrounding the display region and including first, second, and third peripheral regions, and a pad region disposed on one side of the peripheral region. The light emitting layer is disposed on the substrate in the display region. The first power supply wire is disposed in the second and third peripheral regions and a part of the first peripheral region on the substrate. The second power supply wire is disposed in the display region, the first peripheral region, and the third peripheral region on the substrate without being disposed in the second peripheral region, and is being at least partially surrounded by the first power supply wire. The planarization layer is disposed in the display region and a part of the peripheral region on the first power supply wire and the second power supply wire, and have an undulating shape in at least one of the first, second, and third peripheral regions. The conductive pattern is partially overlapped with the first power supply wire in the second and third peripheral regions and the part of the first peripheral region on the planarization layer, and is electrically connected to the first power supply wire. The connection pattern has an undulating shape in at least one of the first, second, and third peripheral regions. The upper electrode is disposed in the display region and the part of the peripheral region on the conductive pattern and the light emitting layer, and is partially overlapped with the first power supply wire and the conductive pattern. The upper electrode is electrically connected to the conductive pattern, and has an undulating shape in at least one of the first, second, and third peripheral regions.

The organic light emitting diode display device may further include a plurality of concave convex patterns disposed between the planarization layer and the first power supply wire.

The second power supply wire includes a wire that may include a first portion disposed in the first peripheral region, a second portion disposed in the display region and having a grid shape, and a third portion disposed in a part of the third peripheral region to at least partially surround the second portion. The first, second, and third portions of the second power supply wire may be formed integrally with each other.

The second portion of the second power supply wire may have a lattice shape in one part of the display region, and has a bar shape in another part of the display region.

According to some exemplary embodiments, a method of driving a display device having a substrate including a display region, a peripheral region at least partially surrounding the display region and including a first peripheral region, a second peripheral region, and a third peripheral region, and a pad region; a light emitting layer disposed on the substrate in the display region; a first power supply wire disposed in at least two of the first, second and third peripheral regions; a second power supply wire disposed in the display region on only two of the first, second. and third peripheral regions, the method comprising the steps of: applying a low power supply voltage to the first power supply wire, and applying a high power supply voltage to the second power supply wire.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
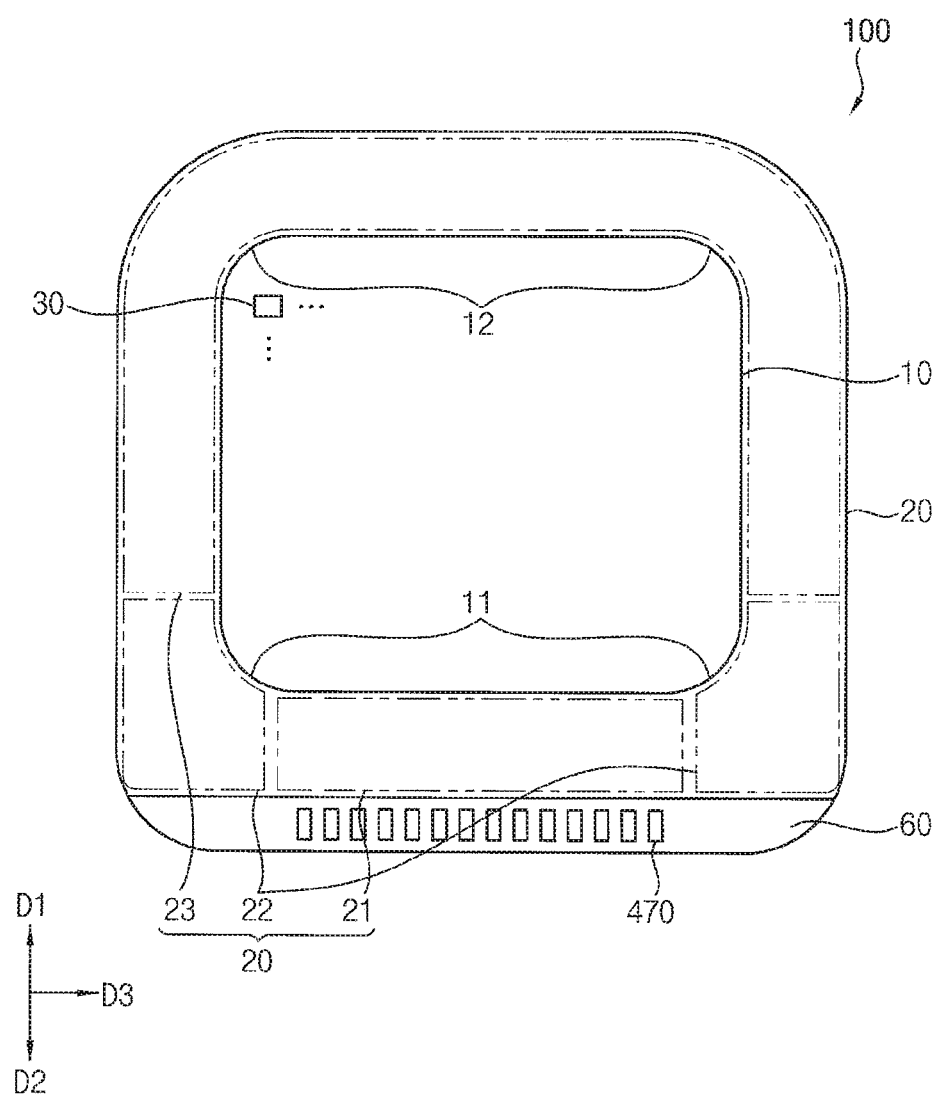
FIG. 1 is a plan view showing an organic light emitting diode display device constructed according to exemplary embodiments of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be explained in detail with reference to the accompanying drawings.

Figure 2A:
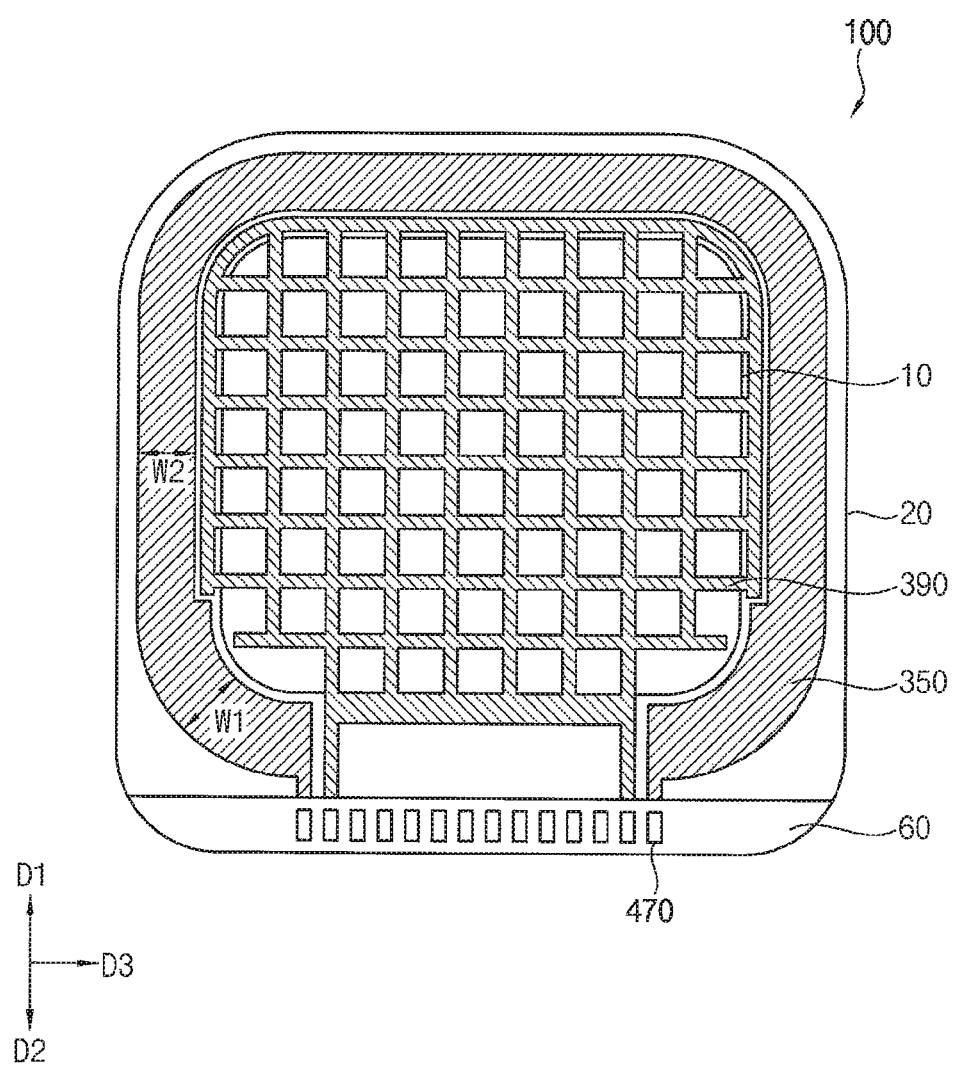
FIG. 2A is a plan view illustrating first and second power supply wires included in the organic light emitting diode display device of FIG. 1.
Figure 2B:
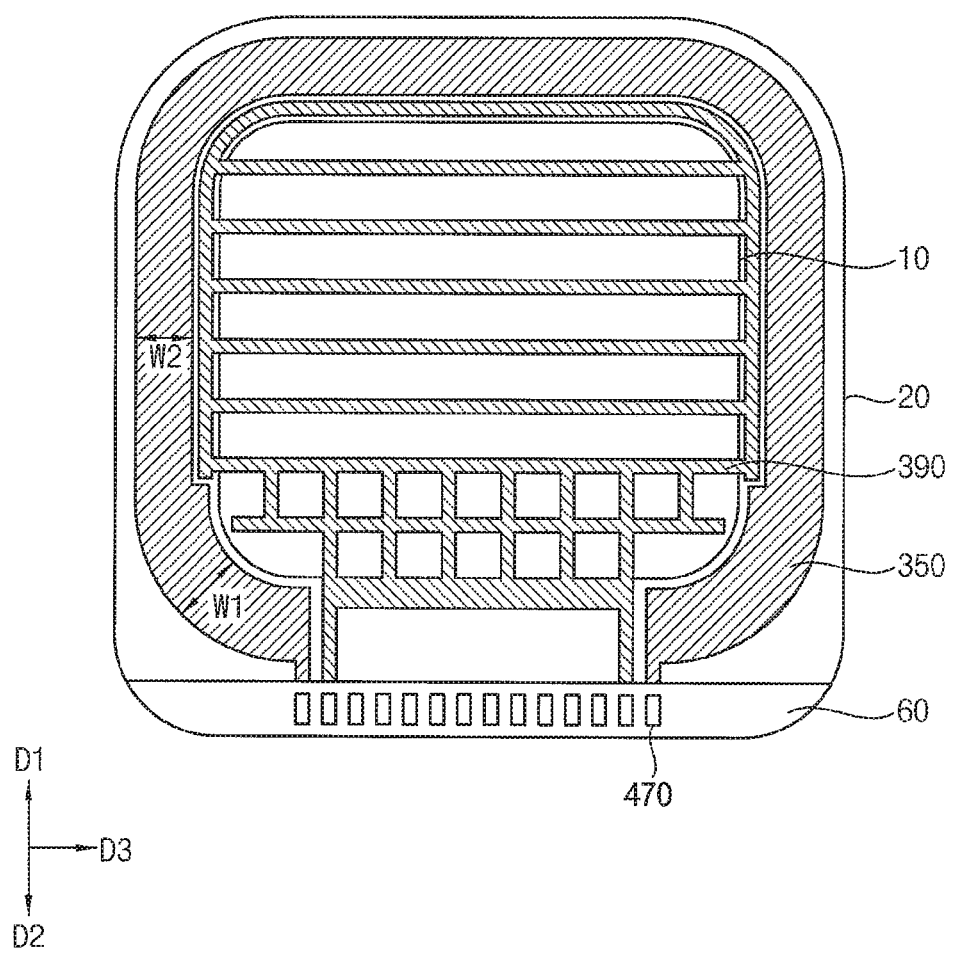
FIG. 2B is a plan view illustrating one exemplary embodiment having the second power supply wire included in the organic light emitting diode display device of FIG. 2A.
Figure 2C:
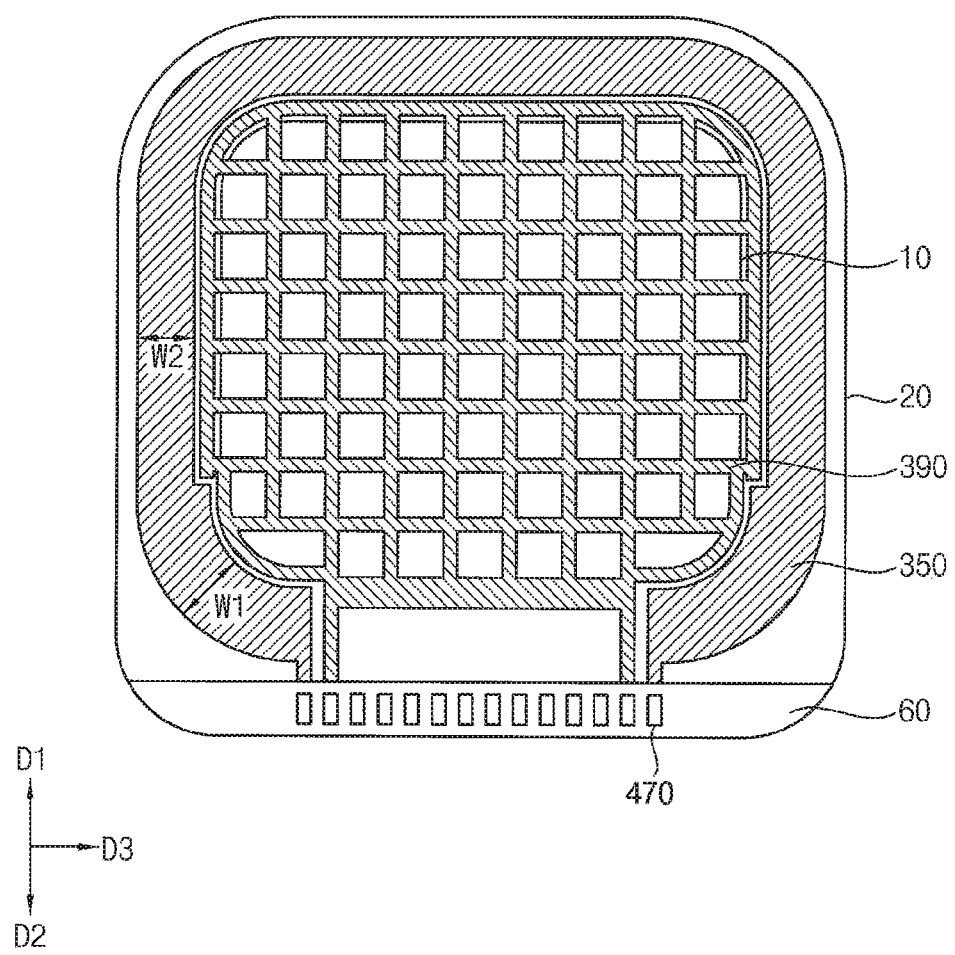
FIG. 2C is a plan view showing another exemplary embodiment having the second power supply wire included in the organic light emitting diode display device of FIG. 2A.
Figure 2D:
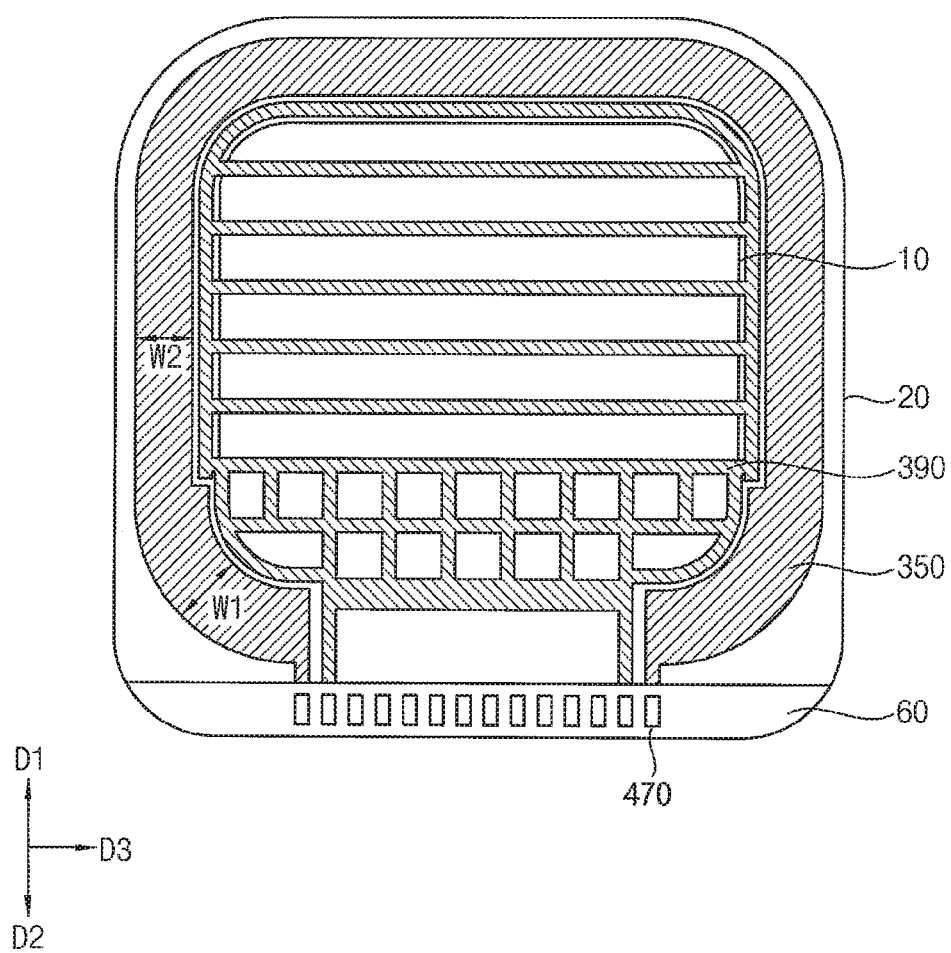
FIG. 2D is a plan view showing still another exemplary embodiment having the second power supply wire included in the organic light emitting diode display device of FIG. 2A.
Figure 3A:
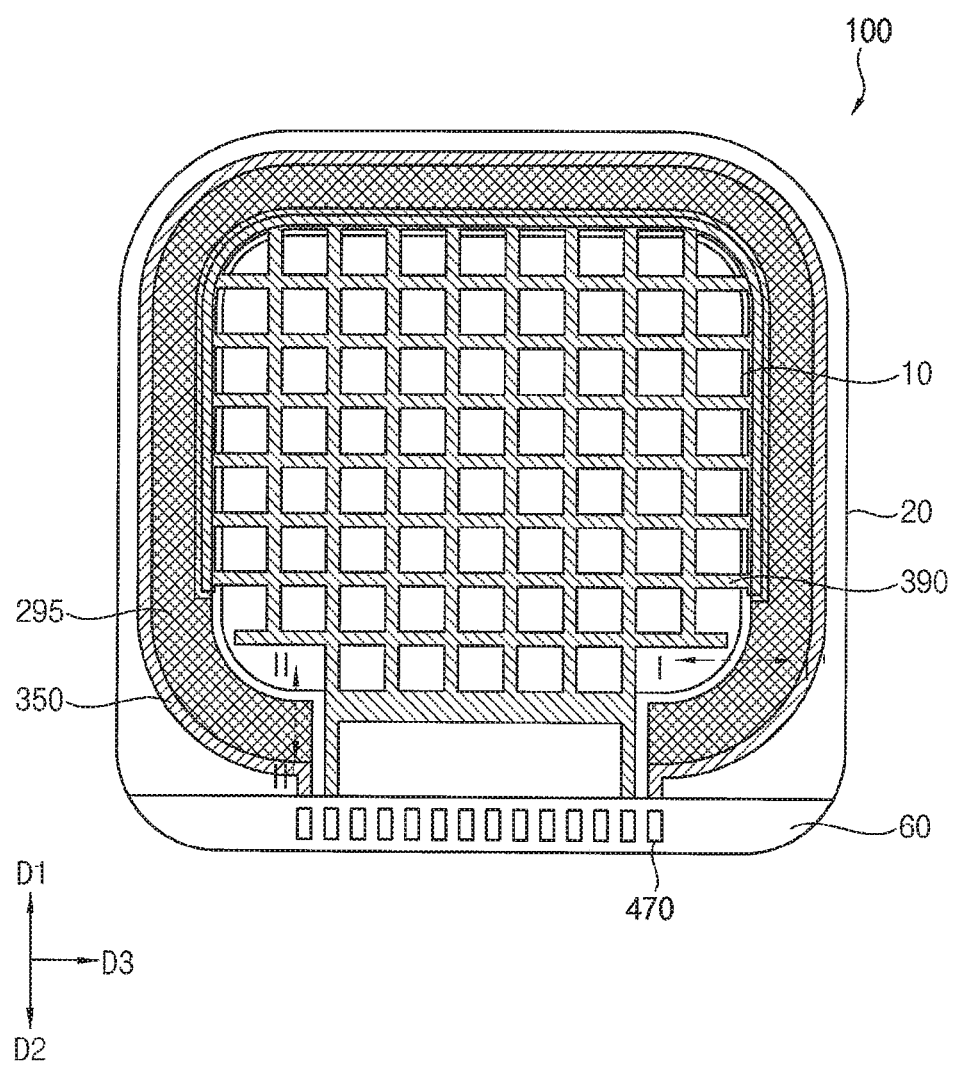
FIG. 3A is a plan view illustrating a connection pattern disposed on the first power supply wire of FIG. 2A.
Figure 3B:
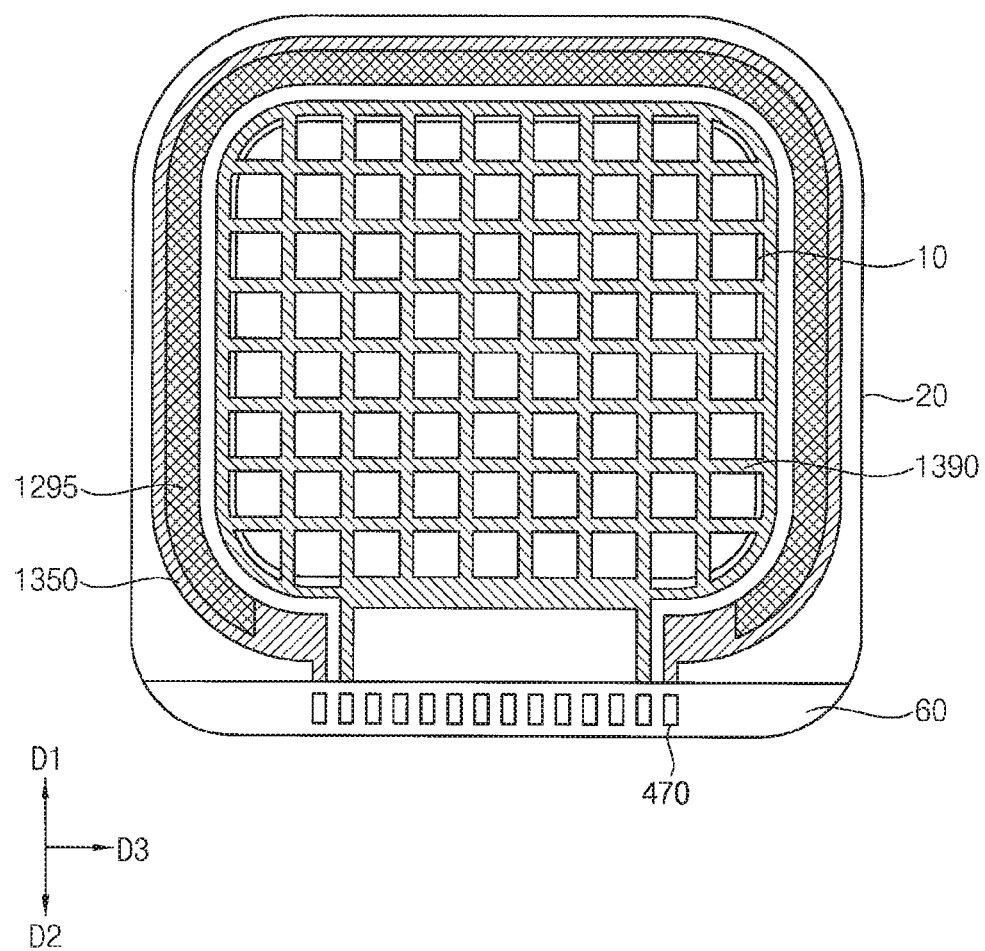
FIG. 3B is a plan view illustrating a conventional organic light emitting diode display device.
Figure 4:
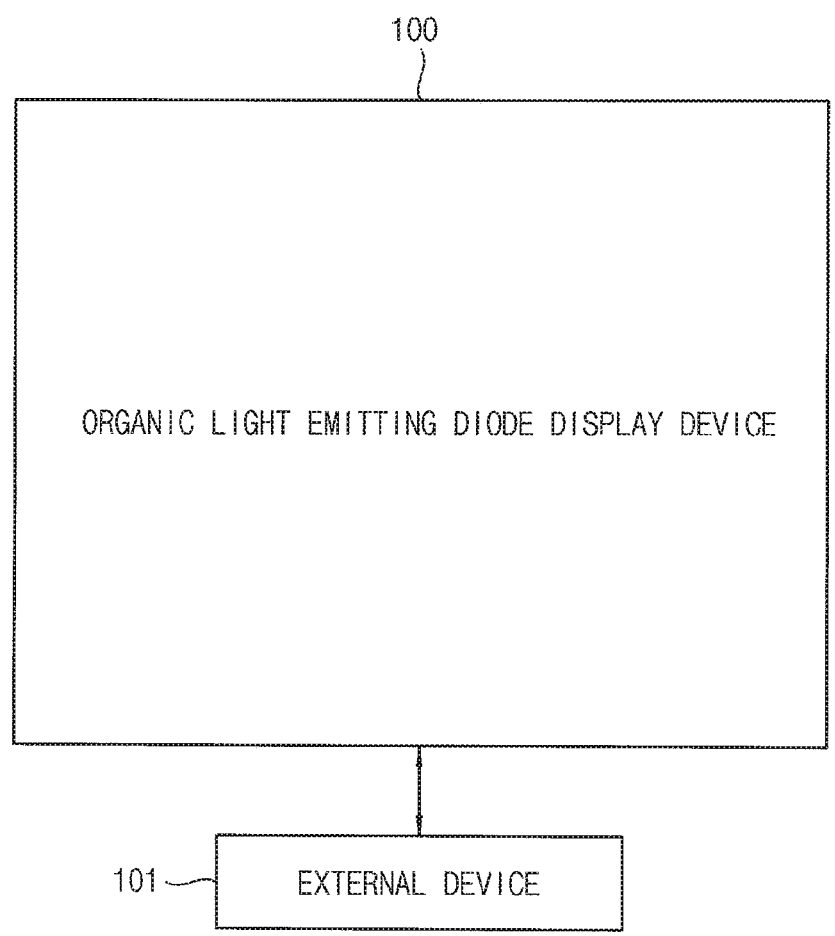
FIG. 4 is a schematic block diagram illustrating an external device electrically connected to the organic light emitting diode display device of FIG. 1.

FIG. 1 is a plan view showing an organic light emitting diode display device according to exemplary embodiments of the invention, FIG. 2A is a plan view for explaining first and second power supplies, which may be in the form of wires, included in the organic light emitting diode display device of FIG. 1, FIG. 2B is a plan view for explaining one example of the second power supply wire included in the organic light emitting diode display device of FIG. 2A, FIG. 2C is a plan view showing another example of the second power supply wire included in the organic light emitting diode display device of FIG. 2A, FIG. 2D is a plan view showing still another example of the second power supply wire included in the organic light emitting diode display device of FIG. 2A, FIG. 3A is a plan view for explaining a connection pattern disposed on the first power supply wire of FIG. 2A, FIG. 3B is a plan view showing a conventional organic light emitting diode display device, and FIG. 4 is a block diagram for explaining an external device electrically connected to the organic light emitting diode display device of FIG. 1.

Referring to FIGS. 1, 2A, 3A, and 4, an organic light emitting diode ("OLED") display device 100 may include a first power supply wire 350, a second power supply wire 390, a conductive pattern, which may be in the form of a connection pattern 295, pad electrodes 470, and the like, and may include a display region 10, a peripheral region 20, and a pad region 60. In this case, the peripheral region 20 may substantially surround the display region 10, and the pad region 60 may be located on one side of the peripheral region 20. In addition, the display region 10 may include a plurality of sub-pixel circuit regions 30. In some exemplary embodiments, the display region 10 may have a rectangular shape with curved corners when viewed from a top, and the OLED display device 100 (or substrate 110 of FIGS. 6 and 7) may also have a rectangular shape with curved corners when viewed in plan. For example, the display region 10 may include first corners 11 adjacent the pad region 60 and second opposing corners 12 facing the first corners.

The peripheral region 20 may include a first peripheral region 21, a second peripheral region 22, and a third peripheral region 23. For example, the first peripheral region 21 of the peripheral region 20 may be adjacent to the pad electrodes 470 disposed in the pad region 60 (or may be located to correspond to a first part where the pad electrodes 470 are disposed), the second peripheral region 22 may be located on both sides of the first peripheral region 21 (or both lower side ends of the peripheral region 20), and the third peripheral region 23 may correspond to a remaining part of the peripheral region 20 excluding the first peripheral region 21 and the second peripheral region 22. In other words, the second peripheral region 22 may be located to correspond to a second part of the pad region 60 where the pad electrodes 470 are not disposed. In this case, the second part may be located on both sides of the first part of the pad region 60. In addition, the second peripheral region 22 may be adjacent to the first corners 11 of the display region 10. In other words, the first peripheral region 21, the second peripheral region 22, and the third peripheral region 23 may be different from each other, and might not be overlapped with each other. In some exemplary embodiments, the second peripheral region 22 might not be overlapped with the pad electrodes 470 in a longitudinal direction (e.g., first direction D1 or second direction D2 opposite to first direction D1) in the plan view of the OLED display device 100, and may be located at both lower side ends of the peripheral region 20. For example, the peripheral region 20 may have an annular or ring-type shape similar to a running track with a hollow center when viewed in plan.

The sub-pixel circuit regions 30 may be arranged on the display region 10. For example, a representative sub-pixel circuit SPC of FIG. 5 (e.g., semiconductor element 250 of FIGS. 6 and 7) may be disposed in each of the sub-pixel circuit regions 30, and an organic light emitting diode OLED (e.g., sub-pixel structure 200 of FIGS. 6 and 7) may be disposed on the sub-pixel circuit SPC. An image may be displayed on the display region 10 through the sub-pixel circuit SPC and the organic light emitting diode OLED.

For example, first, second, and third sub-pixel circuits may be disposed in the sub-pixel circuit regions 30. The first sub-pixel circuit may be connected to a first organic light emitting diode for emitting red light, the second sub-pixel circuit may be connected to a second organic light emitting diode for emitting green light, and the third sub-pixel circuit may be connected to a third organic light emitting diode for emitting blue light.

In some exemplary embodiments, the first organic light emitting diode may be overlapped with the first sub-pixel circuit, the second organic light emitting diode may be overlapped with the second sub-pixel circuit, and the third organic light emitting diode may be overlapped with the third sub-pixel circuit. Alternatively, the first organic light emitting diode may be overlapped with a part of the first sub-pixel circuit and a part of other sub-pixel circuits different from the first sub-pixel circuit, the second organic light emitting diode may be overlapped with a part of the second sub-pixel circuit and a part of other sub-pixel circuits different from the second sub-pixel circuit, and the third organic light emitting diode may be overlapped with a part of the third sub-pixel circuit and a part of other sub-pixel circuits different from the third sub-pixel circuit. For example, the first to third organic light emitting diodes may be arranged by using an RGB stripe scheme in which rectangles having an identical size are arranged in order, an S-stripe scheme including a blue organic light emitting diode having a relatively large area, a WRGB scheme further including a white organic light emitting diode, a PenTile scheme in which RG-GB patterns are repeatedly arranged, etc.

In addition, at least one driving transistor, at least one switching transistor, at least one capacitor, and the like may be disposed in each of the sub-pixel circuit regions 30. In some exemplary embodiments, one driving transistor (e.g., first transistor TR1 of FIG. 5) and six switching transistors (e.g., second to seventh transistors TR2, TR3, TR4, TR5, TR6, and TR7 of FIG. 5), one storage capacitor (e.g., storage capacitor CST of FIG. 5), and the like may be disposed in each of the sub-pixel circuit regions 30.

Although the OLED display device 100 of the invention has been described as having a rounded rectangle shape when viewed in plan, the shape is not limited thereto. For example, the OLED display device 100 may have a rectangular shape, a triangular shape, a rhombic shape, a polygonal shape, a circular shape, an elliptical shape, or other shape known in the art, when viewed in plan.

A plurality of wires may be disposed in the peripheral region 20. For example, the wires may include a data signal wire, a gate signal wire, a light emission control signal wire, a gate initialization signal wire, an initialization voltage wire, a power supply wire, etc. The wires may extend from the peripheral region 20 to the display region 10, and may be electrically connected to the sub-pixel circuit SPC and the organic light emitting diode OLED. Furthermore, a gate driver, a data driver, and the like may be disposed in the peripheral region 20.

As shown in FIGS. 2A and 3A, the first power supply wire 350 may be disposed in a part of the peripheral region 20. In other words, the first power supply wire 350 may be disposed in the second peripheral region 22, the third peripheral region 23, and a part of the first peripheral region 21. The first power supply wire 350 may have a generally hook-type shape (a ring with a lower opening). In some exemplary embodiments, the first power supply wire 350 may have a first width W1 in the second peripheral region 22, and may have a second width W2 that is smaller than the first width W1 in the third peripheral region 23. The first power supply wire 350 may be electrically connected to the pad electrodes 470 in the first peripheral region 21. For example, the first power supply wire 350 may be electrically connected to outermost pad electrodes 470 among the pad electrodes 470. A low power supply voltage may be applied to the first power supply wire 350, and the low power supply voltage may be provided to a cathode electrode (e.g., upper electrode 340 of FIGS. 6 and 7) through the connection pattern 295.

Although the first power supply wire 350 is shown as a single wire in FIG. 2A for convenience, the first power supply wire 350 may be at least two wires overlapped with each other. In other words, the first power supply wire 350 may have a structure in which at least two wires are stacked (e.g., first sub-power supply wire 351 and second sub-power supply wire 352 in FIGS. 6 and 7).

In addition, the second power supply wire 390 may be disposed in the display region 10 and a part of the peripheral region 20. In other words, the second power supply wire 390 may be disposed in the display region 10, the first peripheral region 21, and a part of the third peripheral region 23. The second power supply wire 390 may be disposed between ends of the first power supply wire 350 in the first peripheral region 21 so as to be electrically connected to the pad electrodes 470, may have a lattice shape in the display region 10, and may be spaced apart from an inner side of the first power supply wire 350 in the third peripheral region 23. In this case, a portion of the second power supply wire 390 disposed in the first peripheral region 21 is defined as a first portion, a portion of the second power supply wire 390 disposed in the display region 10 is defined as a second portion, and a portion of the second power supply wire 390 surrounding the second portion is defined as a third portion. The first, second, and third portions may be formed integrally with each other. The first and second portions of the second power supply wire 390 may be connected to each other in the first peripheral region 21 adjacent to a boundary between the display region 10 and the peripheral region 20, and the second and third portions of the second power supply wire 390 may be connected to each other in the third peripheral region 23 adjacent to the boundary between the display region 10 and the peripheral region 20. In some exemplary embodiments, the third portion of the second power supply wire 390 might not be disposed in the second peripheral region 22. In other words, the third portion of the second power supply wire 390 is not disposed in the second peripheral region 22, so that the second portion of the second power supply wire 390 located at a lower end of the display region 10 might not be connected to the third portion of the second power supply wire 390. Accordingly, the second power supply wire 390 is not disposed in the second peripheral region 22, so that the first power supply wire 350 may be disposed in the second peripheral region 22 with the first width W1 which is relatively wide. The second power supply wire 390 may be electrically connected to the pad electrodes 470 in the first peripheral region 21. For example, the second power supply wire 390 may be electrically connected to pad electrodes 470, which are located inward of the pad electrodes 470 that are connected to the first power supply wire 350, among the pad electrodes 470. A high power supply voltage may be applied to the second power supply wire 390, and the high power supply voltage may be provided to an anode electrode (e.g., lower electrode 290 of FIGS. 6 and 7).

Although the second power supply wire 390 is shown as a single wire in FIG. 2A for convenience, the second power supply wire 390 may be at least two wires overlapped with each other. In other words, the second power supply wire 390 may have a structure in which at least two wires are stacked.

In another exemplary embodiment, as shown in FIG. 2B, the second power supply wire 390 may be disposed in the display region 10 and a part of the peripheral region 20. In other words, the second power supply wire 390 may be disposed in the display region 10, the first peripheral region 21, and a part of the third peripheral region 23. The second power supply wire 390 may be disposed between the ends of the first power supply wire 350 in the first peripheral region 21 so as to be electrically connected to the pad electrodes 470, may have a lattice shape in a part of the display region 10, and may be spaced apart from an inner side of the first power supply wire 350 in the third peripheral region 23. In this case, a portion of the second power supply wire 390 disposed in the first peripheral region 21 is defined as a first portion, a portion of the second power supply wire 390 disposed in the display region 10 is defined as a second portion, and a portion of the second power supply wire 390 surrounding the second portion is defined as a third portion. The first, second, and third portions may be formed integrally with each other. In some exemplary embodiments, the second portion located at one part of the display region 10 (e.g., lower end of display region 10) may have a lattice shape, and the second portion located at the remaining part of the display region 10 (center and upper end of display region 10) may have a shape characterized by longitudinal bars spaced apart from in each other in the direction D1 and extending along direction D3 when viewed in plan. The first and second portions of the second power supply wire 390 may be connected to each other in the first peripheral region 21 adjacent to a boundary between the display region 10 and the peripheral region 20, and the second and third portions of the second power supply wire 390 may be connected to each other in the third peripheral region 23 adjacent to the boundary between the display region 10 and the peripheral region 20. In some exemplary embodiments, the third portion of the second power supply wire 390 might not be disposed in the second peripheral region 22. In other words, the third portion of the second power supply wire 390 is not disposed in the second peripheral region 22, so that the second portion of the second power supply wire 390 located at a lower end of the display region 10 might not be connected to the third portion of the second power supply wire 390.

Although the second power supply wire 390 is shown as a single wire in FIG. 2B for convenience, the second power supply wire 390 may be at least two wires overlapped with each other. In other words, the second power supply wire 390 may have a structure in which at least two wires are stacked.

In still another exemplary embodiment, as shown in FIG. 2C, the second power supply wire 390 of FIG. 2C may be disposed at the first corners 11 as compared with FIG. 2A. The second power supply wire 390 located at the first corners 11 may be disposed along a boundary between the display region 10 and the second peripheral region 22. In other words, the second power supply wire 390 may be disposed in a part of the display region 10 and a part of the second peripheral region 22. For example, in the display region 10 located adjacent to the first corners 11, since the first corners 11 have a curved shape, the sub-pixel circuit regions 30 (or sub-pixels) may be arranged in a stepped shape, and an empty space may be formed between the sub-pixel circuit regions 30 and the boundary between the display region 10 and the second peripheral region 22. In other words, the second power supply wire 390 may be disposed in the empty space, and may be spaced inward (e.g., in the direction from peripheral region 20 to display region 10) from the first power supply wire 350 in the second peripheral region 22.

In yet another exemplary embodiment, as shown in FIG. 2D, the second power supply wire 390 of FIG. 2D may be disposed at the first corners 11 as compared with FIG. 2B. The second power supply wire 390 located at the first corners 11 may be disposed along a boundary between the display region 10 and the second peripheral region 22. In other words, the second power supply wire 390 may be disposed in a part of the display region 10 and a part of the second peripheral region 22. For example, in the display region 10 located adjacent to the first corners 11, since the first corners 11 have a curved shape, the sub-pixel circuit regions 30 (or sub-pixels) may be arranged in a stepped shape, and an empty space may be formed between the sub-pixel circuit regions 30 and the boundary between the display region 10 and the second peripheral region 22. In other words, the second power supply wire 390 may be disposed in the empty space, and may be spaced inward (e.g., in the direction from peripheral region 20 to display region 10) from the first power supply wire 350 in the second peripheral region 22.

Referring again to FIGS. 2A and 3A, the connection pattern 295 may be disposed in a part of the first peripheral region 21, the second peripheral region 22, and the third peripheral region 23 on the first power supply wire 350. In some exemplary embodiments, the connection pattern 295 may be overlapped with the first power supply wire 350 disposed in the first peripheral region 21. The connection pattern 295 may have a ring type shape with a lower opening. In other words, the ends of the first power supply wire 350 may be aligned with ends of the connection pattern 295. In addition, the connection pattern 295 may be overlapped with the first power supply wire 350 in the second peripheral region 22 with a width smaller than the width of the first power supply wire 350, and may be overlapped with the third portion of the second power supply wire 390 and the first power supply wire 350 in the third peripheral region 23. Alternatively, the width of the connection pattern 295 may be equal to or greater than the width of the first power supply wire 350 in the second peripheral region 22, and the connection pattern 295 might not be overlapped with the third portion of the second power supply wire 390 in the third peripheral region 23 with a width equal to or greater than the width of the first power supply wire 350. A low power supply voltage may be applied to the connection pattern 295 from the first power supply wire 350, and the low power supply voltage may be provided to a cathode electrode (e.g., upper electrode 340 of FIGS. 6 and 7).

For example, in the conventional organic light emitting diode display device shown in FIG. 3B, first and second power supply wires 1350 and 1390 may be disposed together in the peripheral region 20. In other words, a second portion of the second power supply wire 1390 may be disposed in a part of the first peripheral region 21 as well as the second peripheral region 22. Therefore, the first power supply wire 1350 may have a relatively reduced width in the part of the first peripheral region 21 and the second peripheral region 22. In other words, the first power supply wire 1350 may have a substantially identical width (e.g., second width W2) in the peripheral region 20. When the conventional organic light emitting diode display device is driven at a high luminance, a current may be concentrated on the first power supply wire 1350 disposed in the part of the first peripheral region 21 and the second peripheral region 22, thereby increasing temperature (e.g., heat generation). In this case, the first power supply wire 1350 may be short-circuited, or an insulating layer located around the first power supply wire 1350 may be deformed due to heat generation. In other words, due to the heat generation of the first power supply wire 1350 occurring in the second peripheral region 22, the conventional OLED display device may become defective.

In some exemplary embodiments of the invention, the first power supply wire 350 and the connection pattern 295 have a relatively wide width in the part of the first peripheral region 21 and the second peripheral region 22, so that in the OLED display device 100, the heat generated in the first power supply wire 350 which is located in the part of the first peripheral region 21 and the second peripheral region 22 may be relatively reduced. For example, when an area of a portion where the heat is generated is increased, the temperature of the generated heat may be relatively reduced as it is spread over a greater area.

Referring again to FIGS. 1, 2, 3A, and 4, the pad electrodes 470 electrically connected to the external device 101 may be disposed in the pad region 60. In addition, connection electrodes may be disposed between the pad electrodes 470 and the first and second power supply wires 350 and 390. For example, the connection electrodes may electrically connect the pad electrodes 470 to each of the first and second power supply wires 350 and 390. Alternatively, ends of each of the first and second power supply wires 350 and 390 may be directly connected to the pad electrodes 470.

As shown schematically in FIG. 4, the external device 101 may be electrically connected to the OLED display device 100 through a flexible printed circuit board or a printed circuit board. For example, one side of the flexible printed circuit board may make direct contact with the pad electrodes 470, and an opposite side of the flexible printed circuit board may make direct contact with the external device 101. The external device 101 may provide a data signal, a gate signal, a light emission control signal, a gate initialization signal, an initialization voltage, a high power supply voltage, a low power supply voltage, and the like to the OLED display device 100. In some exemplary embodiments, the low power supply voltage (e.g., low power supply voltage ELVSS of FIG. 5) may be generated from the external device 101, and the low power supply voltage may be provided to the first power supply wire 350 through the flexible printed circuit board, the pad electrodes 470, and the connection electrodes. In addition, the high power supply voltage (e.g., high power supply voltage ELVDD of FIG. 5) may be generated from the external device 101, and the high power supply voltage may be provided to the second power supply wire 390 through the flexible printed circuit board, the pad electrodes 470, and the connection electrodes. Furthermore, a driver integrated circuit may be mounted on the flexible printed circuit board. In other exemplary embodiments, the driver integrated circuit may be mounted on the OLED display device 100 adjacent to the pad electrodes 470.

Figure 5:
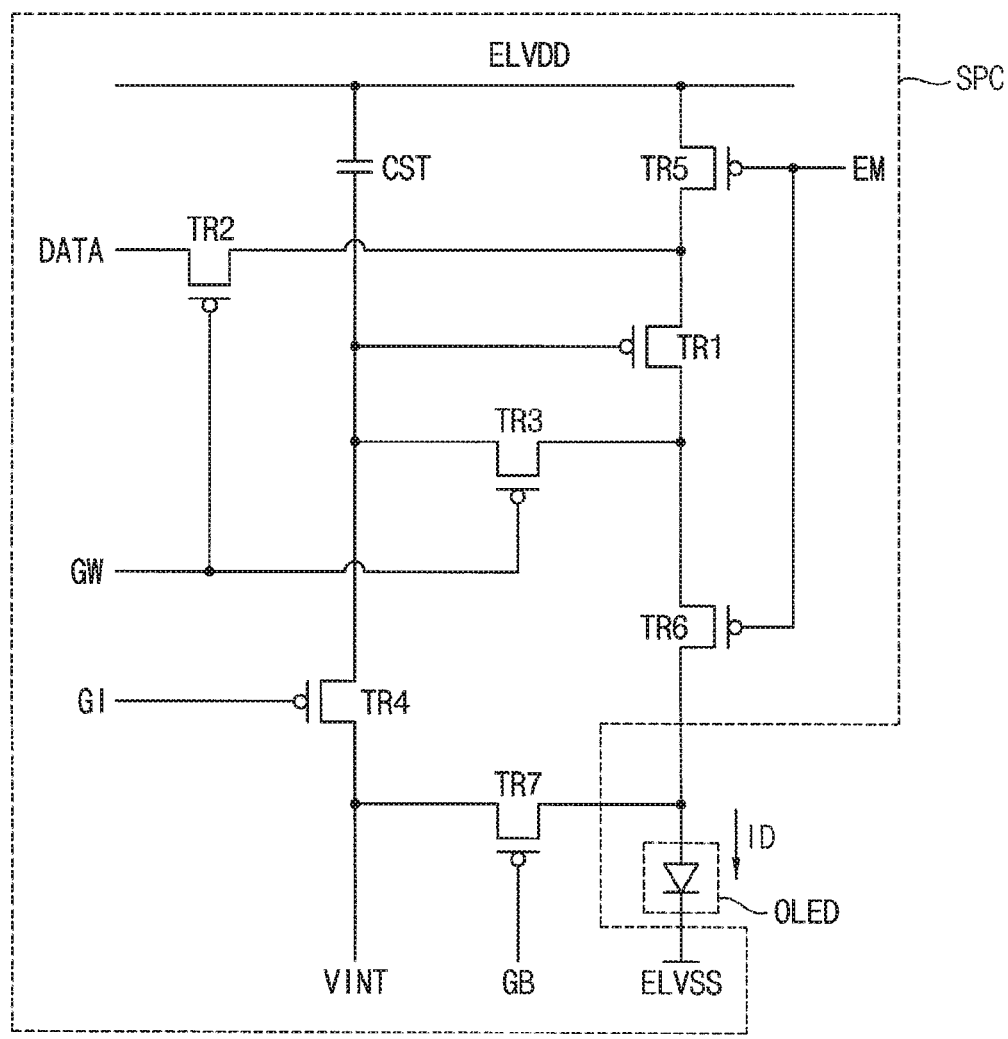
FIG. 5 is a circuit diagram illustrating an exemplary embodiment of a representative sub-pixel circuit disposed in the sub-pixel circuit region of FIG. 1 and an organic light emitting diode OLED disposed on the sub-pixel circuit.

FIG. 5 is a circuit diagram showing a sub-pixel circuit disposed in the sub-pixel circuit region of FIG. 1 and an organic light emitting diode OLED disposed on the sub-pixel circuit.

Referring to FIG. 5, a sub-pixel circuit SPC and an organic light emitting diode OLED (e.g., sub-pixel structure 200 of FIGS. 6 and 7) may be disposed in each of the sub-pixel circuit regions 30 of the OLED display device 100, and one sub-pixel circuit SPC may include first to seventh transistors TR1, TR2, TR3, TR4, TR5, TR6, and TR7 (e.g. semiconductor element 250 of FIGS. 6 and 7), a storage capacitor CST, a wire for a high power supply voltage ELVDD (e.g., second power supply wire 390 of FIGS. 2 and 3), a wire for a low power supply voltage ELVSS (e.g., first power supply wire 350 of FIGS. 2 and 3), a wire for an initialization voltage VINT, a wire for a data signal DATA, a wire for a gate signal GW, a wire for a gate initialization signal GI, a wire for a light emission control signal EM, a wire for a diode initialization signal GB, etc. As described above, the first transistor TR1 may correspond to a driving transistor, and the second to seventh transistors TR2, TR3, TR4, TR5, TR6, and TR7 may correspond to a switching transistor. Each of the first to seventh transistors TR1, TR2, TR3, TR4, TR5, TR6, and TR7 may include a first terminal, a second terminal, a channel, and a gate terminal. In some exemplary embodiments, the first terminal may be a source terminal, and the second terminal may be a drain terminal. Alternatively, the first terminal may be the drain terminal, and the second terminal may be the source terminal.

The organic light emitting diode OLED may output light based on a driving current ID. The organic light emitting diode OLED may include a first terminal and a second terminal. In some exemplary embodiments, the second terminal of the organic light emitting diode OLED may be supplied with the low power supply voltage ELVSS, and the first terminal of the organic light emitting diode OLED may be supplied with the high power supply voltage ELVDD. For example, the first terminal of the organic light emitting diode OLED may be an anode terminal, and the second terminal of the organic light emitting diode OLED may be a cathode terminal. Alternatively, the first terminal of the organic light emitting diode OLED may be the cathode terminal, and the second terminal of the organic light emitting diode OLED may be the anode terminal. In some exemplary embodiments, the anode terminal of the organic light emitting diode OLED may correspond to a lower electrode 290 of FIG. 6, and the cathode terminal of the organic light emitting diode OLED may correspond to an upper electrode 340 of FIG. 6.

The first transistor TR1 may generate the driving current ID. In some exemplary embodiments, the first transistor TR1 may operate in a saturation region. In this case, the first transistor TR1 may generate the driving current ID based on a voltage difference between the gate terminal and the source terminal. In addition, a gradation may be expressed based on a magnitude of the driving current ID supplied to the organic light emitting diode OLED. Alternatively, the first transistor TR1 may operate in a linear region. In this case, the gradation may be expressed based on the sum of times during which the driving current is supplied to the organic light emitting diode OLED within one frame.

The gate terminal of the second transistor TR2 may be supplied with the gate signal GW. The first terminal of the second transistor TR2 may be supplied with the data signal DATA. The second terminal of the second transistor TR2 may be connected to the first terminal of the first transistor TR1. For example, the gate signal GW may be provided from a gate driver, and the gate signal GW may be applied to the gate terminal of the second transistor TR2 through the wire for the gate signal GW. The second transistor TR2 may supply the data signal DATA to the first terminal of the first transistor TR1 during an activation period of the gate signal GW. In this case, the second transistor TR2 may operate in a linear region.

The gate terminal of the third transistor TR3 may be supplied with the gate signal GW. The first terminal of the third transistor TR3 may be connected to the gate terminal of the first transistor TR1. The second terminal of the third transistor TR3 may be connected to the second terminal of the first transistor TR1. For example, the gate signal GW may be provided from the gate driver, and the gate signal GW may be applied to the gate terminal of the third transistor TR3 through the wire for the gate signal GW. The third transistor TR3 may connect the gate terminal of the first transistor TR1 to the second terminal of the first transistor TR1 during the activation period of the gate signal GW. In this case, the third transistor TR3 may operate in a linear region. In other words, the third transistor TR3 may diode-connect the first transistor TR1 during the activation period of the gate signal GW. Since the first transistor TR1 is diode-connected, a voltage difference between the first terminal of the first transistor TR1 and the gate terminal of the first transistor TR1 may be as much as a threshold voltage of the first transistor TR1. As a result, a voltage obtained by adding the voltage difference (i.e., threshold voltage) to a voltage of the data signal DATA supplied to the first terminal of the first transistor TR1 may be supplied to the gate terminal of the first transistor TR1 during the activation period of the gate signal GW. In other words, the data signal DATA may be compensated as much as the threshold voltage of the first transistor TR1, and the compensated data signal DATA may be supplied to the gate terminal of the first transistor TR1. As the threshold voltage compensation is performed, a problem of a non-uniform driving current caused by a threshold voltage deviation of the first transistor TR1 may be solved.

An input terminal of the initialization voltage wire provided with the initialization voltage VINT may be connected to a first terminal of the fourth transistor TR4 and a first terminal of the seventh transistor TR7, and an output terminal of the initialization voltage wire may be connected to a second terminal of the fourth transistor TR4 and a first terminal of the storage capacitor CST.

The gate terminal of the fourth transistor TR4 may be supplied with the gate initialization signal GI. The first terminal of the fourth transistor TR4 may be supplied with the initialization voltage VINT. The second terminal of the fourth transistor TR4 may be connected to the gate terminal of the first transistor TR1.

The fourth transistor TR4 may supply the initialization voltage VINT to the gate terminal of the first transistor TR1 during an activation period of the gate initialization signal GI. In this case, the fourth transistor TR4 may operate in a linear region. In other words, the fourth transistor TR4 may initialize the gate terminal of the first transistor TR1 to the initialization voltage VINT during the activation period of the gate initialization signal GI. In some exemplary embodiments, the initialization voltage VINT may have a voltage level sufficiently lower than a voltage level of the data signal DATA maintained by the storage capacitor CST in a previous frame, and the initialization voltage VINT may be supplied to the gate terminal of the first transistor TR1. In other exemplary embodiments, the initialization voltage may have a voltage level sufficiently higher than the voltage level of the data signal maintained by the storage capacitor in the previous frame, and the initialization voltage may be supplied to the gate terminal of the first transistor.

In some exemplary embodiments, the gate initialization signal GI may be a signal which is substantially identical to the gate signal GW transmitted before one horizontal time. For example, the gate initialization signal GI supplied to a sub-pixel circuit in an $n^{th}$ row (where n is an integer of 2 or more) among the sub-pixel circuits included in the OLED display device 100 may be a signal which is substantially identical to the gate signal GW supplied to a sub-pixel circuit in an $(n-1)^{th}$ row among the sub-pixel circuits. In other words, an activated gate initialization signal GI may be supplied to a first sub-pixel circuit in the $n^{th}$ row among the sub-pixel circuits SPC by supplying an activated gate signal GW to a first sub-pixel circuit in the $(n-1)^{th}$ row among the sub-pixel circuits SPC. As a result, the data signal DATA may be supplied to the sub-pixel circuit in the $(n-1)^{th}$ row among the sub-pixel circuits SPC while the gate terminal of the first transistor TR1 included in the sub-pixel circuit in the $n^{th}$ row among the sub-pixel circuits SPC are initialized to the initialization voltage VINT.

The gate terminal of the fifth transistor TR5 may be supplied with the light emission control signal EM. The first terminal of the fifth transistor TR5 may be connected to the wire for the high power supply voltage ELVDD. The second terminal of the fifth transistor TR5 may be connected to the first terminal of the first transistor TR1. For example, the light emission control signal EM may be provided from a light emission control driver, and the light emission control signal EM may be applied to the gate terminal of the fifth transistor TR5 through the wire for the light emission control signal EM. The fifth transistor TR5 may supply the high power supply voltage ELVDD to the first terminal of the first transistor TR1 during an activation period of the light emission control signal EM. On the contrary, the fifth transistor TR5 may shut off the supply of the high power supply voltage ELVDD during a deactivation period of the light emission control signal EM. In this case, the fifth transistor TR5 may operate in a linear region. The fifth transistor TR5 supplies the high power supply voltage ELVDD to the first terminal of the first transistor TR1 during the activation period of the light emission control signal EM, so that the first transistor TR1 may generate the driving current ID. In addition, the fifth transistor TR5 shuts off the supply of the high power supply voltage ELVDD during the deactivation period of the light emission control signal EM, so that the data signal DATA supplied to the first terminal of the first transistor TR1 may be supplied to the gate terminal of the first transistor TR1.

The gate terminal of the sixth transistor TR6 (e.g., semiconductor element of FIG. 6) may be supplied with the light emission control signal EM. The first terminal of the sixth transistor TR6 may be connected to the second terminal of the first transistor TR1. The second terminal of the sixth transistor TR6 may be connected to the first terminal of the organic light emitting diode OLED. The sixth transistor TR6 may supply the driving current ID generated by the first transistor TR1 to the organic light emitting diode OLED during the activation period of the light emission control signal EM. In this case, the sixth transistor TR6 may operate in a linear region. In other words, the sixth transistor TR6 supplies the driving current ID generated by the first transistor TR1 to the organic light emitting diode OLED during the activation period of the light emission control signal EM, so that the organic light emitting diode OLED may output light. In addition, the sixth transistor TR6 electrically separates the first transistor TR1 from the organic light emitting diode OLED during the deactivation period of the light emission control signal EM, so that the data signal DATA supplied to the second terminal of the first transistor TR1 (more precisely, the data signal which has been subject to threshold voltage compensation) may be supplied to the gate terminal of the first transistor TR1.

The gate terminal of the seventh transistor TR7 may be supplied with the diode initialization signal GB. The first terminal of the seventh transistor TR7 may be supplied with the initialization voltage VINT. The second terminal of the seventh transistor TR7 may be connected to the first terminal of the organic light emitting diode OLED. The seventh transistor TR7 may supply the initialization voltage VINT to the first terminal of the organic light emitting diode OLED during an activation period of the diode initialization signal GB. In this case, the seventh transistor TR7 may operate in the linear region. In other words, the seventh transistor TR7 may initialize the first terminal of the organic light emitting diode OLED to the initialization voltage VINT during the activation period of the diode initialization signal GB.

Alternatively, the gate initialization signal GI and the diode initialization signal GB may be signals which are substantially identical to each other. The operation of initializing the gate terminal of the first transistor TR1 and the operation of initializing the first terminal of the organic light emitting diode OLED might not affect each other. In other words, the operation of initializing the gate terminal of the first transistor TR1 and the operation of initializing the first terminal of the organic light emitting diode OLED may be independent of each other. Accordingly, the diode initialization signal GB is not separately generated, so that economic efficiency of the process can be improved.

The storage capacitor CST may include a first terminal and a second terminal. The storage capacitor CST may be connected between the wire for the high power supply voltage ELVDD and the gate terminal of the first transistor TR1. For example, the first terminal of the storage capacitor CST may be connected to the gate terminal of the first transistor TR1, and the second terminal of the storage capacitor CST may be connected to the wire for the high power supply voltage ELVDD. The storage capacitor CST may maintain a voltage level of the gate terminal of the first transistor TR1 during a deactivation period of the gate signal GW. The deactivation period of the gate signal GW may include the activation period of the light emission control signal EM, and the driving current ID generated by the first transistor TR1 may be supplied to the organic light emitting diode OLED during the activation period of the light emission control signal EM. Therefore, the driving current ID generated by the first transistor TR1 may be supplied to the organic light emitting diode OLED based on the voltage level maintained by the storage capacitor CST.

Although the sub-pixel circuit SPC has been described as including the seven transistors and the one storage capacitor, the configurations of the exemplary embodiment of the invention are not limited thereto. For example, the sub-pixel circuit SPC may have a configuration including at least one transistor and at least one storage capacitor.

Figure 6:
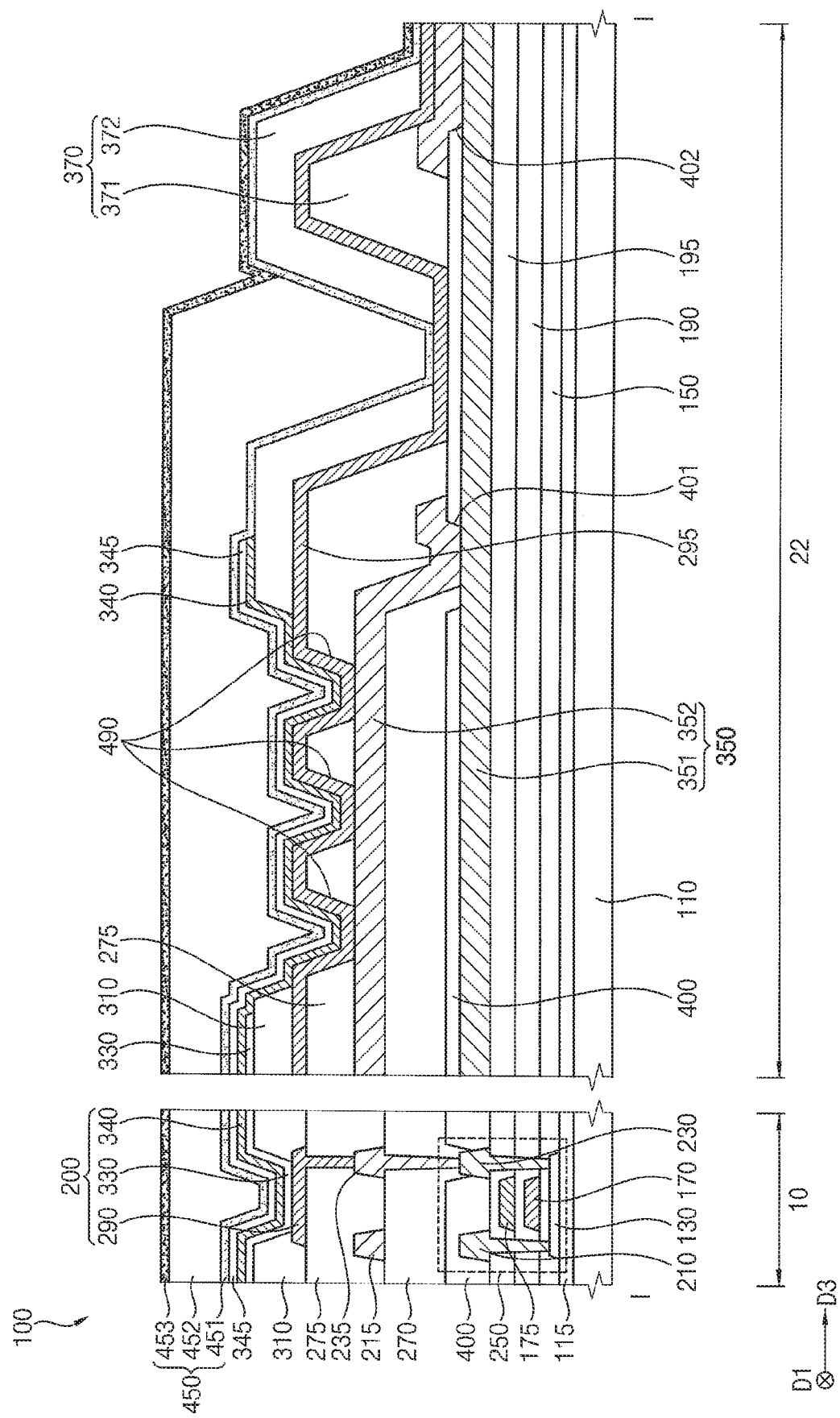
FIG. 6 is a cross-sectional view taken along line I-I' of FIG. 3A.
Figure 7:
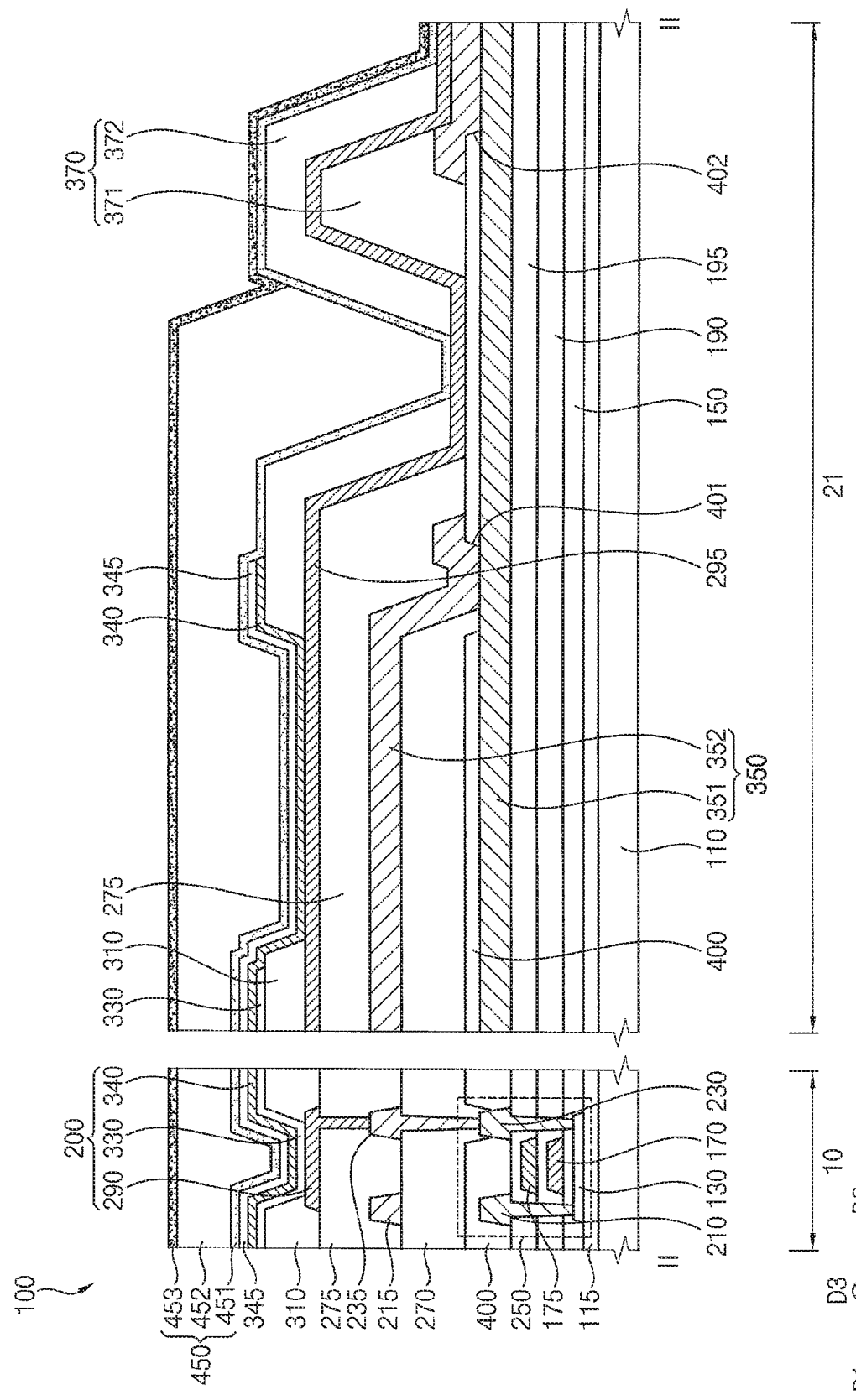
FIG. 7 is a cross-sectional view taken along line II-II' of FIG. 3A.

FIG. 6 is a cross-sectional view taken along line I-I' of FIG. 3A, and FIG. 7 is a cross-sectional view taken along line II-II' of FIG. 3A.

Referring to FIGS. 6 and 7, the OLED display device 100 may include a substrate 110, a buffer layer 115, a semiconductor element 250, a protective insulating layer 400, a first power supply wire 350, a first planarization layer 270, a wire pattern 215, a connection electrode 235, a second planarization layer 275, a pixel defining layer 310, a sub-pixel structure 200, a capping layer 345, a blocking structure 370, a thin film encapsulation structure 450, etc. In this case, the semiconductor element 250 may include an active layer 130, a gate insulating layer 150, a first gate electrode 170, a first insulating interlayer 190, a second gate electrode 175, a second insulating interlayer 195, a source electrode 210, and a drain electrode 230, and the first power supply wire 350 may include a first sub-power supply wire 351 and a second sub-power supply wire 352. In addition, the blocking structure 370 may include a first blocking pattern 371 and a second blocking pattern 372, and the sub-pixel structure 200 may include a lower electrode 290, a light emitting layer 330, and an upper electrode 340. Furthermore, the thin film encapsulation structure 450 may include a first thin film encapsulation layer 451, a second thin film encapsulation layer 452, and a third thin film encapsulation layer 453.

The substrate 110 including transparent or opaque materials may be provided. The substrate 110 may be formed by using a flexible transparent resin substrate. In some exemplary embodiments, the substrate 110 may have a configuration in which a first organic layer, a first barrier layer, a second organic layer, and a second barrier layer are sequentially laminated. The first barrier layer and the second barrier layer may include an inorganic material such as silicon oxide, and may block moisture and/or humidity penetrating through the first and second organic layers. In addition, the first organic layer and the second organic layer may include an organic material such as a polyimide-based resin, and may have flexibility.

Since the substrate 110 is thin and flexible, the substrate 110 may be formed on a rigid glass substrate to support formation of the semiconductor element 250 and the sub-pixel structure 200. For example, after disposing the buffer layer 115 on the second barrier layer, the semiconductor element 250 and the sub-pixel structure 200 may be formed on the buffer layer 115. After the formation of the semiconductor element 250 and the sub-pixel structure 200, the glass substrate may be removed. In other words, due to flexible physical properties of the substrate 110, it may be difficult to directly form the semiconductor element 250 and the sub-pixel structure 200 on the substrate 110. In consideration of the above point, the glass substrate is removed after the semiconductor element 250 and the sub-pixel structure 200 are formed using the rigid glass substrate, so that the first organic layer, the first barrier layer, the second organic layer, and the second barrier layer may be used as the substrate 110.

Since the OLED display device 100 includes the display region 10, the peripheral region 20 including the first peripheral region 21, the second peripheral region 22, and the third peripheral region 23, and the pad region 60, as shown in FIGS. 6 and 7, the substrate 110 may also be divided into the display region 10, the first peripheral region 21, and the second peripheral region 22 (see FIG. 1).

Alternatively, the substrate 110 may include a quartz substrate, a synthetic quartz substrate, a calcium fluoride substrate, a fluorine-doped quartz substrate (F-doped quartz substrate), a soda lime glass substrate, a non-alkali glass substrate, etc.

Although the substrate 110 is described as having four layers, the configuration of the exemplary embodiments is not limited thereto. For example, in other exemplary embodiments, the substrate 110 may include a single layer or a plurality of layers.

The buffer layer 115 may be disposed on the substrate 110. In some exemplary embodiments, the buffer layer 115 may be disposed in the display region 10 and the second peripheral region 22 (e.g., peripheral region 20) on the entire substrate 110. The buffer layer 115 may prevent metal atoms or impurities from being diffused from the substrate 110 into the semiconductor element 250, and may control a heat transfer rate during a crystallization process for forming the active layer 130 to obtain a substantially uniform active layer 130. In addition, the buffer layer 115 may serve to improve flatness of a surface of the substrate 110 when the surface of the substrate 110 is not uniform. Depending on a type of the substrate 110, at least two buffer layers 115 may be provided on the substrate 110, or the buffer layer 115 might not be provided on the substrate 110. The buffer layer 115 may include a silicon compound, metal oxide, etc. For example, the buffer layer 115 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc.

The active layer 130 may be disposed in the display region 10 on the buffer layer 115. The active layer 130 may include an oxide semiconductor, an inorganic semiconductor (e.g., amorphous silicon or poly silicon), an organic semiconductor, etc. The active layer 130 may have a source region, a drain region, and a channel region located between the source region and the drain region.

The gate insulating layer 150 may be disposed on the active layer 130. The gate insulating layer 150 may cover the active layer 130 in the display region 10 on the buffer layer 115, and may extend in a direction from the display region 10 to the peripheral region 20. For example, the gate insulating layer 150 may sufficiently cover the active layer 130 on the buffer layer 115, and may have a substantially flat top surface without creating a step around the active layer 130. Alternatively, the gate insulating layer 150 may cover the active layer 130 on the buffer layer 115 while being disposed along a profile of the active layer 130 with a uniform thickness, or may be disposed in the display region 10 and the second peripheral region 22 on the entire buffer layer 115. The gate insulating layer 150 may include a silicon compound, metal oxide, etc. In other exemplary embodiments, the gate insulating layer 150 may have a multilayer structure with a plurality of insulating layers including materials which are different from each other.

The first gate electrode 170 may be disposed in the display region 10 on the gate insulating layer 150. The first gate electrode 170 may be disposed on a portion of the gate insulating layer 150 under which the active layer 130 is located (e.g., to overlap with channel region of active layer 130). The first gate electrode 170 may include a metal, an alloy of a metal, metal nitride, conductive metal oxide, a transparent conductive material, etc. These may be used alone or in combination with each other. In other exemplary embodiments, the first gate electrode 170 may have a multilayer structure including a plurality of layers.

The first insulating interlayer 190 may be disposed on the first gate electrode 170. The first insulating interlayer 190 may cover the first gate electrode 170 in the display region 10 on the gate insulating layer 150, and may extend in the direction from the display region 10 to the peripheral region 20. For example, the first insulating interlayer 190 may sufficiently cover the first gate electrode 170 on the gate insulating layer 150, and may have a substantially flat top surface without creating a step around the first gate electrode 170. Alternatively, the first insulating interlayer 190 may cover the first gate electrode 170 on the gate insulating layer 150, and may be disposed along a profile of the first gate electrode 170 with a uniform thickness. The first insulating interlayer 190 may include a silicon compound, metal oxide, etc. In other exemplary embodiments, the first insulating interlayer 190 may have a multilayer structure having a plurality of insulating layers including materials which are different from each other.

The second gate electrode 175 may be disposed in the display region 10 on the first insulating interlayer 190. The second gate electrode 175 may be disposed on a portion of the first insulating interlayer 190 under which the first gate electrode 170 is located. Alternatively, the first gate electrode 170 and the second gate electrode 175 may function as the storage capacitor CST of FIG. 5. The second gate electrode 175 may include a metal, an alloy of a metal, metal nitride, conductive metal oxide, a transparent conductive material, etc. These may be used alone or in combination with each other. In other exemplary embodiments, the second gate electrode 175 may have a multilayer structure including a plurality of layers.

The second insulating interlayer 195 may be disposed on the second gate electrode 175. The second insulating interlayer 195 may cover the second gate electrode 175 in the display region 10 on the first insulating interlayer 190, and may extend in the direction from the display region 10 to the peripheral region 20. For example, the second insulating interlayer 195 may sufficiently cover the second gate electrode 175 on the first insulating interlayer 190, and may have a substantially flat top surface without creating a step around the second gate electrode 175. Alternatively, the second insulating interlayer 195 may cover the second gate electrode 175 on the first insulating interlayer 190, and may be disposed along a profile of the second gate electrode 175 with a uniform thickness. The second insulating interlayer 195 may include a silicon compound, metal oxide, etc. In other exemplary embodiments, the second insulating interlayer 195 may have a multilayer structure with a plurality of insulating layers including materials which are different from each other.

The source electrode 210 and the drain electrode 230 may be disposed in the display region 10 on the second insulating interlayer 195. The source electrode 210 may be connected to the source region of the active layer 130 through a contact hole formed by removing first sections of the gate insulating layer 150, the first insulating interlayer 190, and the second insulating interlayer 195, and the drain electrode 230 may be connected to the drain region of the active layer 130 through a contact hole formed by removing second sections of the gate insulating layer 150, the first insulating interlayer 190, and the second insulating interlayer 195. Each of the source electrode 210 and the drain electrode 230 may include a metal, an alloy of a metal, metal nitride, conductive metal oxide, a transparent conductive material, etc. These may be used alone or in combination with each other. In other exemplary embodiments, each of the source electrode 210 and the drain electrode 230 may have a multilayer structure including a plurality of layers.

Accordingly, the semiconductor element 250 including the active layer 130, the gate insulating layer 150, the first gate electrode 170, the first insulating interlayer 190, the second gate electrode 175, the second insulating interlayer 195, the source electrode 210, and the drain electrode 230 may be provided in the above configuration.

Although the semiconductor element 250 has been described as having a top gate structure, the configuration of exemplary embodiments is not limited thereto. For example, the semiconductor element 250 may have a bottom gate structure.

In addition, although the OLED display device 100 has been described as including one semiconductor element, the configuration of exemplary embodiments is not limited thereto. For example, the OLED display device 100 may include at least one semiconductor element and at least one storage capacitor.

Although the semiconductor element 250 of FIG. 6 and the semiconductor element 250 of FIG. 7 are assumed to have an identical reference numeral for convenience of explanation, the semiconductor element 250 of FIG. 6 and the semiconductor element 250 of FIG. 7 may be semiconductor elements that are different from each other. In other words, the semiconductor element 250 of FIG. 6 may be a semiconductor element disposed in the display region 10 adjacent to the second peripheral region 22, and the semiconductor element 250 of FIG. 7 may be a semiconductor element disposed in the display region 10 adjacent to the first peripheral region 21.

The first sub-power supply wire 351 may be disposed in a part of the first peripheral region 21, the second peripheral region 22, and the third peripheral region 23 on the second insulating interlayer 195 (see FIG. 2). The first sub-power supply wire 351 may have a generally ring shape with a lower opening. In some exemplary embodiments, the first sub-power supply wire 351 may have the first width W1 in the part of the first peripheral region 21 and the second peripheral region 22, and may have the second width W2 that is smaller than the first width W1 in the third peripheral region 23. In other words, the first sub-power supply wire 351 may have different widths in the first and second peripheral regions 21 and 22 and the third peripheral region 23.

The first sub-power supply wire 351 may be electrically connected to the pad electrodes 470 of FIG. 2 in the first peripheral region 21. For example, the first sub-power supply wire 351 may be electrically connected to the outermost pad electrodes 470 among the pad electrodes 470. The low power supply voltage ELVSS of FIG. 5 may be applied to the first sub-power supply wire 351, and the low power supply voltage ELVSS may be provided to the upper electrode 340 through the connection pattern 295. The first sub-power supply wire 351 may include a metal, an alloy of a metal, metal nitride, conductive metal oxide, a transparent conductive material, etc. For example, the first sub-power supply wire 351 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), etc. These may be used alone or in combination with each other. Alternatively, the first sub-power supply wire 351 may have a multilayer structure including a plurality of layers. In some exemplary embodiments, the source electrode 210, the drain electrode 230, and the first sub-power supply wire 351 may be located on the same layer with each other.

The protective insulating layer 400 may be disposed on the second insulating interlayer 195, the source and drain electrodes 210 and 230, and the first sub-power supply wire 351. The protective insulating layer 400 may cover the source and drain electrodes 210 and 230 in the display region 10 on the second insulating interlayer 195, and may cover the first sub-power supply wire 351 in the second peripheral region 22 on the second insulating interlayer 195. In some exemplary embodiments, the protective insulating layer 400 may have a first opening 401 and a second opening 402 for exposing a part of the first sub-power supply wire 351 in the peripheral region 20 (or first peripheral region 21 and second peripheral region 22). The second sub-power supply wire 352 may be connected to the first sub-power supply wire 351 through the first opening 401 and the second opening 402. In addition, the protective insulating layer 400 may have an opening for exposing a part of the drain electrode 230 in the display region 10. The connection electrode 235 may be connected to the drain electrode 230 through the opening located in the display region 10. For example, the protective insulating layer 400 may sufficiently cover the source and drain electrodes 210 and 230 and the first sub-power supply wire 351 on the second insulating interlayer 195, and may have a substantially flat top surface without creating a step around the source and drain electrodes 210 and 230, and the first sub-power supply wire 351. Alternatively, the protective insulating layer 400 may cover the source and drain electrodes 210 and 230 and the first sub-power supply wire 351 on the second insulating interlayer 195, and may be disposed as a substantially uniform thickness along profiles of the source and drain electrodes 210 and 230 and the first sub-power supply wire 351. The protective insulating layer 400 may include a silicon compound, metal oxide, etc. In other exemplary embodiments, the protective insulating layer 400 may have a multilayer structure with a plurality of insulating layers including materials which are different from each other.

The first planarization layer 270 may be disposed on the protective insulating layer 400. The first planarization layer 270 may be disposed in the display region 10 and a part of the peripheral region 20 (e.g., part of first peripheral region 21 and part of second peripheral region 22) on the protective insulating layer 400. In other words, the first planarization layer 270 may cover the protective insulating layer 400 in the display region 10 while extending in the direction from the display region 10 to the peripheral region 20, and may expose the first opening 401 and the second opening 402 of the protective insulating layer 400 in the peripheral region 20. In other words, the first planarization layer 270 may extend from the display region to the peripheral region 20 to cover at least a part of the first opening 401. For example, the first planarization layer 270 may have a relatively thick thickness, and in this case, the first planarization layer 270 may have a substantially flat top surface. In order to implement such a flat top surface of the first planarization layer 270, a planarization process may be additionally performed on the first planarization layer 270. Alternatively, the first planarization layer 270 may be disposed along a profile of the protective insulating layer 400 on the protective insulating layer 400 with a uniform thickness. The first planarization layer 270 may be formed of an organic material or an inorganic material. In some exemplary embodiments, the first planarization layer 270 may include the organic material. For example, the first planarization layer 270 may include photoresist, a polyacryl-based resin, a polyimide-based resin, a polyamide-based resin, a siloxane-based resin, an acryl-based resin, an epoxy-based resin, etc.

The wire pattern 215 and the connection electrode 235 may be disposed in the display region 10 on the first planarization layer 270. The wire pattern 215 may transmit a gate signal, a data signal, a light emission signal, an initialization signal, a power supply voltage, etc. The connection electrode 235 may be spaced apart from the wire pattern 215 in the display region 10 on the first planarization layer 270. The connection electrode 235 may be connected to the drain electrode 230 through a contact hole formed by removing a part of the first planarization layer 270 located in the display region 10, and the connection electrode 235 may electrically connect the lower electrode 290 to the drain electrode 230. Alternatively, the connection electrode 235 might not be connected to the drain electrode 230, and may electrically connect the semiconductor element 250 to another semiconductor element through the contact hole in another sectional view of the OLED display device 100. Each of the wire pattern 215 and the connection electrode 235 may include a metal, an alloy of a metal, metal nitride, conductive metal oxide, a transparent conductive material, etc. These may be used alone or in combination with each other. In other exemplary embodiments, each of the wire pattern 215 and the connection electrode 235 may have a multilayer structure including a plurality of layers.

The second sub-power supply wire 352 may be disposed in the peripheral region on the first planarization layer 270. The second sub-power supply wire 352 may have a shape of a lower opening ring. In some exemplary embodiments, the second sub-power supply wire 352 may have the first width W1 in the part of the first peripheral region 21 and the second peripheral region 22, and may have the second width W2 that is smaller than the first width W1 in the third peripheral region 23. In other words, the second sub-power supply wire 352 may have different widths in the first and second peripheral regions 21 and 22 and the third peripheral region 23.

The second sub-power supply wire 352 may make direct contact with the first sub-power supply wire 351 through the first opening 401 in the first and second peripheral regions 21 and 22, and may make direct contact with the first sub-power supply wire 351 through the second opening 402. In addition, the second sub-power supply wire 352 may have an opening for exposing a top surface of the protective insulating layer 400 between the first opening 401 and the second opening 402 in the first and second peripheral regions 21 and 22 (see FIG. 12). Alternatively, the second sub-power supply wire 352 may be continuously disposed without the opening in the first and second peripheral regions 21 and 22.

The second sub-power supply wire 352 may be electrically connected to the pad electrodes 470 of FIG. 2 in the first peripheral region 21. For example, the second sub-power supply wire 352 may be electrically connected to the outermost pad electrodes 470 among the pad electrodes 470. The low power supply voltage ELVSS may be applied to the second sub-power supply wire 352 through the first sub-power supply wire 351, and the low power supply voltage ELVSS may be provided to the upper electrode 340 through the connection pattern 295. The second sub-power supply wire 352 may include a metal, an alloy of a metal, metal nitride, conductive metal oxide, a transparent conductive material, etc. These may be used alone or in combination with each other. Alternatively, the second sub-power supply wire 352 may have a multilayer structure including a plurality of layers. In some exemplary embodiments, the wire pattern 215, the connection electrode 235, and the second sub-power supply wire 352 may be located on the same layer with each other.

Accordingly, the first power supply wire 350 including the first sub-power supply wire 351 and the second sub-power supply wire 352 may be provided in the above configuration.

Although the first power supply wire 350 has been described as including the first sub-power supply wire 351 and the second sub-power supply wire 352, the configuration of exemplary embodiments is not limited thereto. For example, the first power supply wire 350 may have a configuration including only the first sub-power supply wire 351, a configuration including only the second sub-power supply wire 352, or a configuration including the first sub-power supply wire 351, the second sub-power supply wire 352, and an additional wire.

In addition, although the first sub-power supply wire 351 and the second sub-power supply wire 352 have been described as having the first width W1 in the first and second peripheral regions 21 and 22 and as having the second width W2 in the third peripheral region 23, the configuration of exemplary embodiments is not limited thereto. For example, in other exemplary embodiments, only one of the first sub-power supply wire 351 and the second sub-power supply wire 352 may have the first width W1 in the second peripheral region 22.

The second planarization layer 275 may be disposed on the wire pattern 215, the connection electrode 235, the second sub-power supply wire 352, and the first planarization layer 270. The second planarization layer 275 may cover the wire pattern 215 and the connection electrode 235 in the display region 10 on the first planarization layer 270 while extending in the direction from the display region 10 to the peripheral region 20 so as to cover the second sub-power supply wire 352 in the peripheral region 20. In some exemplary embodiments, as shown in FIG. 6, the second planarization layer 275 may have a plurality of openings 490 for exposing a top surface of the second sub-power supply wire 352 in the second peripheral region 22. The connection pattern 295 may make direct contact with the second sub-power supply wire 352 through the openings 490 of the second planarization layer 275. In addition, the openings 490 may be formed in a portion where the first power supply wire 350 and the connection pattern 295 are overlapped with each other in the third peripheral region 23. In other words, the openings 490 may be formed in the second planarization layer 275 so as not to be overlapped with the light emitting layer 330 in the second peripheral region 22 and the third peripheral region 23 on the first planarization layer 270. Alternatively, as shown in FIG. 7, the second planarization layer 275 is configured without the openings for exposing the top surface of the second sub-power supply wire 352 in the first peripheral region 21. In other words, the second planarization layer 275 located in the first peripheral region 21 may cover the second sub-power supply wire 352 adjacent to the display region 10.

Moreover, the second planarization layer 275 may cover an end of the second sub-power supply wire 352 disposed in the first opening 401 in the peripheral region 20.

For example, in the conventional organic light emitting diode display device shown in FIG. 3B, first and second power supply wires 1350 and 1390 may be disposed together in the peripheral region 20. In other words, a second portion of the second power supply wire 1390 may be disposed in a part of the first peripheral region 21 as well as the second peripheral region 22. Therefore, the first power supply wire 1350 may have a relatively reduced width in the part of the first peripheral region 21 and the second peripheral region 22. In other words, the first power supply wire 1350 may have a substantially identical width in the peripheral region 20. In this case, a portion where the first power supply wire 1350 and the connection pattern 1295 are overlapped with each other may be relatively reduced in a part of the first peripheral region 21 and the second peripheral region 22. As a result, the number of the openings formed in the second planarization layer 275 in the second peripheral region 22 may be relatively small. When the conventional organic light emitting diode display device is driven at a high luminance, a current may be concentrated on the first power supply wire 1350 disposed in the part of the first peripheral region 21 and the second peripheral region 22, thereby increasing a temperature (e.g., heat generation). In this case, the first power supply wire 1350 may be short-circuited, or an insulating layer located around the first power supply wire 1350 may be deformed due to heat generation. In other words, due to the heat generation of the first power supply wire 1350 occurring in the second peripheral region 22, the conventional OLED display device may become defective.

In some exemplary embodiments of the invention, the first power supply wire 350 and the connection pattern 295 have a relatively wide width in the part of the first peripheral region 21 and the second peripheral region 22, so that a relatively greater number of openings 490 for allowing the connection pattern 295 to make direct contact with the first power supply wire 350 in the second peripheral region 22 may be formed. Accordingly, in the OLED display device 100, the heat generated in the first power supply wire 350 located in the part of the first peripheral region 21 and the second peripheral region 22 may be relatively reduced. For example, the connection pattern 295 may have step portions defining the openings 490 which connect to the second sub-power supply wire 352, and a surface area of the connection pattern 295 may be relatively increased.

Referring again to FIG. 6, the second planarization layer 275 may have a relatively thick thickness to sufficiently cover the wire pattern 215, the connection electrode 235, and the second sub-power supply wire 352, and in this case, the second planarization layer 275 may have a substantially flat top surface. In order to implement such a flat top surface of the second planarization layer 275, the planarization process may be additionally performed on the second planarization layer 275. Alternatively, the second planarization layer 275 may cover the wire pattern 215, the connection electrode 235, and the second sub-power supply wire 352, and may be disposed along profiles of the wire pattern 215, the connection electrode 235, and the second sub-power supply wire 352 with a uniform thickness. The second planarization layer 275 may be formed of an organic material or an inorganic material. In some exemplary embodiments, the second planarization layer 275 may include the organic material.

The first blocking pattern 371 may be disposed in the peripheral region 20 on the protective insulating layer 400 and the first sub-power supply wire 351. The first blocking pattern 371 may be spaced apart from the second planarization layer 275 in the direction from the display region 10 to the peripheral region 20, and may cover a first end of the second sub-power supply wire 352 disposed in the second opening 402. For example, the first blocking pattern 371 may be disposed along a profile of an outer peripheral edge of the display region 10. In other words, the first blocking pattern 371 may surround the display region 10 in the first peripheral region 21, the second peripheral region 22, and the third peripheral region 23. In some exemplary embodiments, the first blocking pattern 371 may serve to block leakage of the second thin film encapsulation layer 452. The first blocking pattern 371 may include an organic material or an inorganic material. In some exemplary embodiments, the first blocking pattern 371 may include the organic material. In addition, top surfaces of the second planarization layer 275 and the first blocking pattern 371 may be at the same level.

The lower electrode 290 may be disposed in the display region 10 on the second planarization layer 275. The lower electrode 290 may be connected to the connection electrode 235 through a contact hole formed by removing a part of the second planarization layer 275, and the lower electrode 290 may be electrically connected to the semiconductor element 250. The lower electrode 290 may include a metal, an alloy of a metal, metal nitride, conductive metal oxide, a transparent conductive material, etc. These may be used alone or in combination with each other. In other exemplary embodiments, the lower electrode 290 may have a multilayer structure including a plurality of layers.

The connection pattern 295 may be disposed in the peripheral region 20 on the second planarization layer 275, the protective insulating layer 400, the first blocking pattern 371, and the second sub-power supply wire 352. The connection pattern 295 may have a shape of a lower opening ring. The connection pattern 295 may be disposed on the second planarization layer 275, inner sides of the openings 490 of the second planarization layer 275 shown in FIG. 6, the protective insulating layer 400, the first blocking pattern 371, and the second sub-power supply wire 352 disposed in the second opening 402, and may extend in the direction from the display region 10 to the peripheral region 20. In other words, the connection pattern 295 may be disposed above the second planarization layer 275, which is also above the protective insulating layer 400, the first blocking pattern 371, and the second sub-power supply wire 352. In some exemplary embodiments, the connection pattern 295 may be overlapped with the first power supply wire 350 in a part of the first peripheral region 21, and the ends of the first power supply wire 350 may be aligned with the ends of the connection pattern 295. The connection pattern 295 may include a metal, an alloy of a metal, metal nitride, conductive metal oxide, a transparent conductive material, etc.

These may be used alone or in combination with each other. In other exemplary embodiments, the connection pattern 295 may have a multilayer structure including a plurality of layers. In some exemplary embodiments, a top surface of the lower electrode 290 and an uppermost surface of the connection pattern 295 may be at the same level.

The pixel defining layer 310 may be disposed in the display region 10 and the peripheral region 20 on the second planarization layer 275. In some exemplary embodiments, as shown in FIG. 6, the pixel defining layer 310 may expose a part of the lower electrode 290 in the display region 10 while extending in the direction from the display region 10 to the peripheral region 20, and may be disposed on the connection pattern 295 while exposing the connection pattern 295 disposed in the openings 490 in the second peripheral region 22. Alternatively, as shown in FIG. 7, the pixel defining layer 310 may expose the part of the lower electrode 290 in the display region 10 while extending in the direction from the display region 10 to the peripheral region 20, and may be disposed on the connection pattern 295 while exposing the connection pattern 295 disposed on the second planarization layer 275 in the first peripheral region 21. The pixel defining layer 310 may be formed of an organic material or an inorganic material. In some exemplary embodiments, the pixel defining layer 310 may include the organic material.

The second blocking pattern 372 may be disposed in the peripheral region 20 on the connection pattern 295. The second blocking pattern 372 may be spaced apart from the pixel defining layer 310 in the direction from the display region 10 to the peripheral region 20, and may cover the connection pattern 295 disposed on the first blocking pattern 371. For example, the second blocking pattern 372 may be disposed along a profile of the display region 10. In other words, the second blocking pattern 372 may surround the display region 10 in the first peripheral region 21, the second peripheral region 22, and the third peripheral region 23. In some exemplary embodiments, the second blocking pattern 372 may serve to block leakage of the second thin film encapsulation layer 452 together with the first blocking pattern 371. The second blocking pattern 372 may include an organic material or an inorganic material. In some exemplary embodiments, the second blocking pattern 372 may include the organic material. In addition, top surfaces of the pixel defining layer 310 and the second blocking pattern 372 may be at the same level.

Accordingly, the blocking structure 370 including the first blocking pattern 371 and the second blocking pattern 372 may be provided in the above configuration.

Although the OLED display device 100 has been described as including one blocking structure 370, the configuration of exemplary embodiments is not limited thereto. For example, in other exemplary embodiments, at least one blocking structure may be further provided while being spaced apart from the blocking structure 370 in the direction from the display region 10 to the peripheral region 20. In other words, the OLED display device 100 may include at least two blocking structures.

A portion formed between the pixel defining layer 310 and the blocking structure 370 may be defined as a first blocking region. The first blocking region may be located parallel to the blocking structure 370, and the first planarization layer 270, the second planarization layer 275, and the pixel defining layer 310 might not be disposed in the first blocking region. For example, in order to prevent moisture of humidity from penetrating into the display region 10 through the first planarization layer 270, the second planarization layer 275, and the pixel defining layer 310 disposed in the peripheral region 20, the first planarization layer 270, the second planarization layer 275, and the pixel defining layer 310 might not be disposed in the first blocking region. In other exemplary embodiments, when the OLED display device 100 further includes an additional blocking structure, a second blocking region may be additionally formed between the blocking structure 370 and the additional blocking structure.

Figure 21:
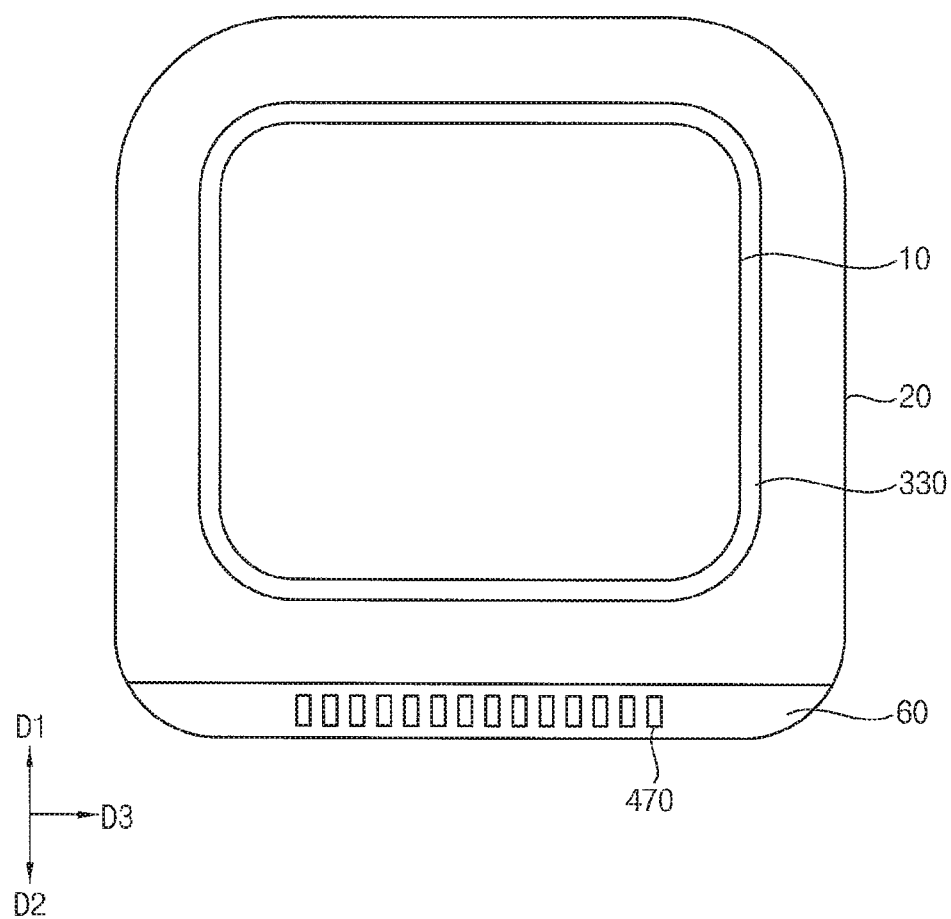

The light emitting layer 330 may be disposed in the display region 10 and a part of the peripheral region 20 on the substrate 110 (see FIG. 21). For example, the light emitting layer 330 may be disposed on the pixel defining layer 310 and the lower electrode 290 in the display region 10 while extending in the direction from the display region 10 to the peripheral region 20, and may be disposed on a part of the pixel defining layer 310 in the peripheral region 20. In other words, the light emitting layer 330 may be disposed above the pixel defining layer 310 and the lower electrode 290. In some exemplary embodiments, the light emitting layer 330 might not be overlapped with the connection pattern 295 exposed by the openings 490 located in the second peripheral region 22 and the pixel defining layer 310 located in the first peripheral region 21.

The light emitting layer 330 may have a multilayer structure including an organic light emission layer ("EML"), a hole injection layer ("HIL"), a hole transport layer ("HTL"), an electron transport layer ("ETL"), an electron injection layer ("EIL"), etc. In some exemplary embodiments, the EML, the HIL, the HTL, the ETL, and the EIL may be disposed in the peripheral region 20. In other exemplary embodiments, the HIL, the HTL, the ETL, and the EIL may be disposed in the peripheral region 20 except for the EML.

The EML of the light emitting layer 330 may be formed using at least one of light emitting materials for emitting different color lights (i.e., red light, green light, blue light, etc.) according to sub-pixels. Alternatively, the EML of the light emitting layer 330 may be formed by laminating a plurality of light emitting materials for emitting the different color lights such as red light, green light, or blue light to emit white light as a whole. In this case, a color filter may be disposed on the light emitting layer 330 which is disposed on the lower electrode 290. The color filter may include at least one of a red color filter, a green color filter, and a blue color filter. Alternatively, the color filter may include a yellow color filter, a cyan color filter, and a magenta color filter. The color filter may include a photosensitive resin or color photoresist.

Figure 23:
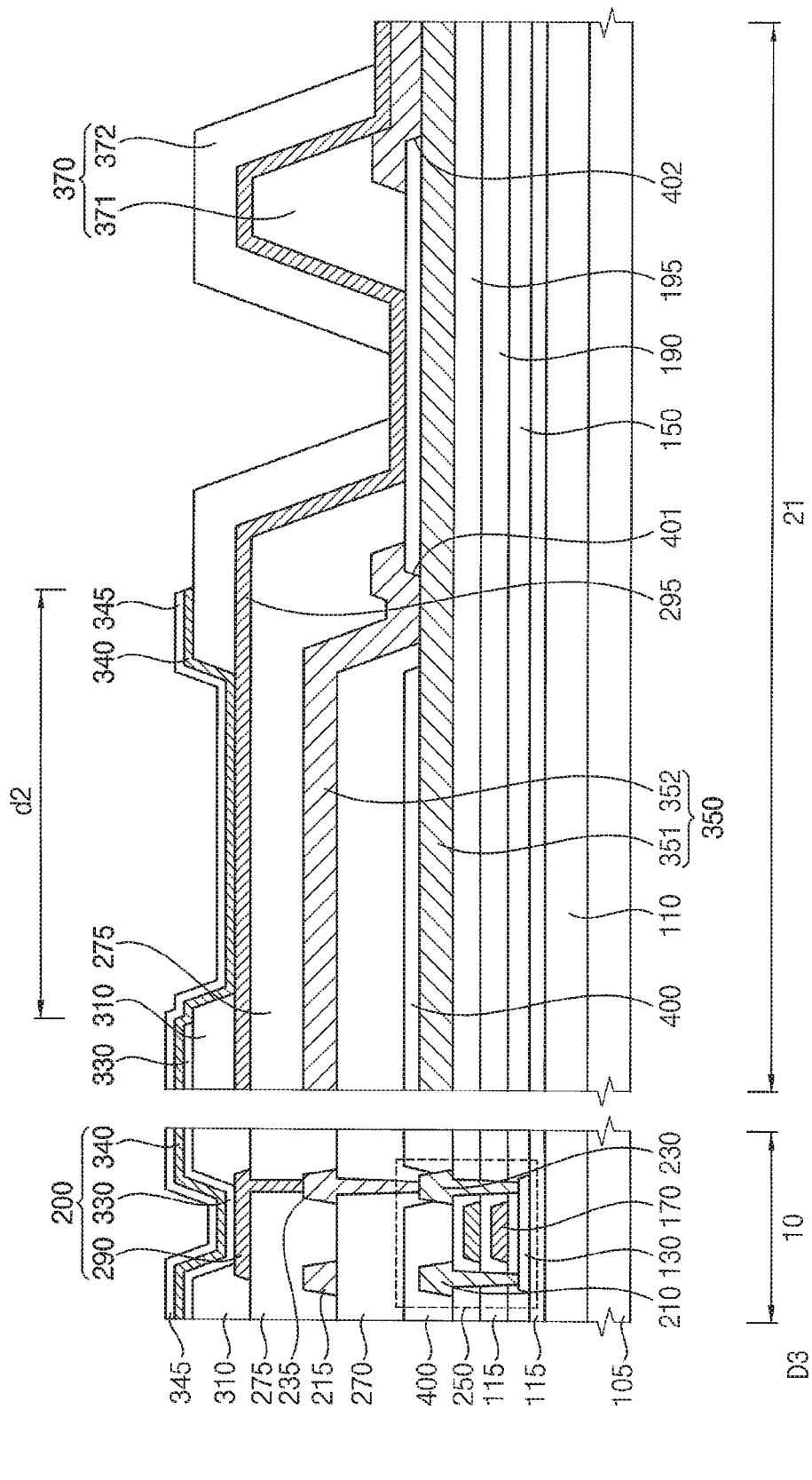

The upper electrode 340 may be disposed in the display region 10 and a part of the peripheral region 20 on the substrate 110 (see FIG. 23). For example, the upper electrode 340 may be disposed on the light emitting layer 330 in the display region 10 while extending in the direction from the display region 10 to the peripheral region 20, and may be disposed on the light emitting layer 330, a part of the pixel defining layer 310, the connection pattern 295 disposed in the openings 490 shown in FIG. 6, and the connection pattern 295 exposed by the pixel defining layer 310 shown in FIG. 7 in the peripheral region 20. In other words, the upper electrode 340 may be disposed above the light emitting layer 330, the pixel defining layer 310, and the connection pattern 295. In some exemplary embodiments, the upper electrode 340 may make direct contact with the connection pattern 295 disposed in the openings 490 shown in FIG. 6 and the connection pattern 295 exposed by the pixel defining layer 310 shown in FIG. 7, and may receive the low power supply voltage ELVSS from the connection pattern 295. The upper electrode 340 may include a metal, an alloy of a metal, metal nitride, conductive metal oxide, a transparent conductive material, etc. These may be used alone or in combination with each other. In other exemplary embodiments, the upper electrode 340 may have a multi-layer structure including a plurality of layers.

Accordingly, the sub-pixel structure 200 including the lower electrode 290, the light emitting layer 330, and the upper electrode 340 may be disposed.

Although the sub-pixel structure 200 of FIG. 6 and the sub-pixel structure 200 of FIG. 7 are assumed to have an identical reference numeral for convenience of explanation, the sub-pixel structure 200 of FIG. 6 and the sub-pixel structure 200 of FIG. 7 may be sub-pixel structures that are different from each other. In other words, the sub-pixel structure 200 of FIG. 6 may be a sub-pixel structure disposed in the display region 10 adjacent to the second peripheral region 22, and the sub-pixel structure 200 of FIG. 7 may be a sub-pixel structure disposed in the display region 10 adjacent to the first peripheral region 21.

The capping layer 345 may be disposed in the display region 10 and a part of the second peripheral region 22 on the substrate 110. For example, the capping layer 345 may be disposed on the upper electrode 340 in the display region 10 while extending in the direction from the display region 10 to the peripheral region 20, and may be disposed on the upper electrode 340 in the peripheral region 20. In other words, the capping layer 345 may be disposed above the upper electrode 340 in the display region 10 and the peripheral region 20. In some exemplary embodiments, the capping layer 345 may be overlapped with the upper electrode 340 in the peripheral region 20. The capping layer 345 may protect the sub-pixel structure 200, and may include an organic material or an inorganic material. In some exemplary embodiments, the capping layer 345 may include a triamine derivative, an arylenediamine derivative, 4,4'-N,N'-dicarbazole-biphenyl (4,4'-bis(N-carbazolyl)-1,1'-biphenyl) (CBP), tris-8-hydroxyquinoline aluminum (Alq3), etc.

The first thin film encapsulation layer 451 may be disposed in the display region and the peripheral region 20 on the substrate 110. For example, the first thin film encapsulation layer 451 may be disposed on the capping layer 345 in the display region 10 while extending in the direction from the display region 10 to the peripheral region 20, and may be disposed on the capping layer 345, the pixel defining layer 310, the blocking structure 370, and the connection pattern 295 in the peripheral region 20. In other words, the first thin film encapsulation layer 451 may be disposed above the capping layer 345, the pixel defining layer 310, the blocking structure 370, and the connection pattern 295. In some exemplary embodiments, the first thin film encapsulation layer 451 may make direct contact with the capping layer 345 in the openings 490, and may make direct contact with the connection pattern 295 in the blocking region (e.g., portion located between pixel defining layer 310 and blocking structure 370 in second peripheral region 22). The first thin film encapsulation layer 451 may prevent the sub-pixel structure 200 from being deteriorated due to penetration of moisture, oxygen, etc. In addition, the first thin film encapsulation layer 451 may function to protect the sub-pixel structure 200 from an external impact. The first thin film encapsulation layer 451 may include flexible inorganic materials.

The second thin film encapsulation layer 452 may be disposed in the display region 10 and a part of the peripheral region 20 on the first thin film encapsulation layer 451. The second thin film encapsulation layer 452 may be overlapped with a part of a side wall of the blocking structure 370. Alternatively, the second thin film encapsulation layer 452 might not be overlapped with the blocking structure 370, or may cover the blocking structure 370 while extending in the direction from the display region 10 to the peripheral region 20. The second thin film encapsulation layer 452 may improve flatness of the OLED display device 100, and may protect the sub-pixel structure 200. The second thin film encapsulation layer 452 may include flexible organic materials.

The third thin film encapsulation layer 453 may be disposed on the second thin film encapsulation layer 452 and the first thin film encapsulation layer 451. The third thin film encapsulation layer 453 may cover the second thin film encapsulation layer 452 in the display region 10 while being disposed along a profile of the second thin film encapsulation layer 452 with a uniform thickness, and may extend to the peripheral region 20. The third thin film encapsulation layer 453 may be disposed along profiles of the first thin film encapsulation layer 451 and a part of the second thin film encapsulation layer 452 in the peripheral region 20. The third thin film encapsulation layer 453 may prevent the sub-pixel structure 200 from being deteriorated due to the penetration of moisture, oxygen, etc., together with the first thin film encapsulation layer 451. In addition, the third thin film encapsulation layer 453 may function to protect the sub-pixel structure 200 from an external impact together with the first thin film encapsulation layer 451 and the second thin film encapsulation layer 452. The third thin film encapsulation layer 453 may include flexible inorganic materials.

Accordingly, the thin film encapsulation structure 450 including the first thin film encapsulation layer 451, the second thin film encapsulation layer 452, and the third thin film encapsulation layer 453 may be disposed. Alternatively, the thin film encapsulation structure 450 may have a five-layer structure formed by laminating first to fifth thin film encapsulation layers or a seven-layer structure formed by laminating first to seventh thin film encapsulation layers.

As described above, the OLED display device 100 shown in FIGS. 6 and 7 may be provided in the above configuration.

The OLED display device 100 according to some exemplary embodiments of the invention include the first power supply wire 350 and the connection pattern 295 that have a relatively wide width, so that in the OLED display device 100, the heat generated in the first power supply wire 350 located in the part of the first peripheral region 21 and the second peripheral region 22 may be relatively reduced.

In addition, the OLED display device 100 includes the first power supply wire 350 and the connection pattern 295 that have a relatively wide width, so that in the OLED display device 100, a relatively greater number of openings 490 for allowing the connection pattern 295 to make direct contact with the first power supply wire 350 in the second peripheral region 22 may be formed. In other words, in the OLED display device 100, the heat generated in the first power supply wire 350 located in the part of the first peripheral region 21 and the second peripheral region 22 may be further reduced. Accordingly, defects of the OLED display device 100 due to the heat generation of the first power supply wire 350 occurring in a part of the first peripheral region 21 and the second peripheral region 22 may be relatively reduced.

Figure 24:
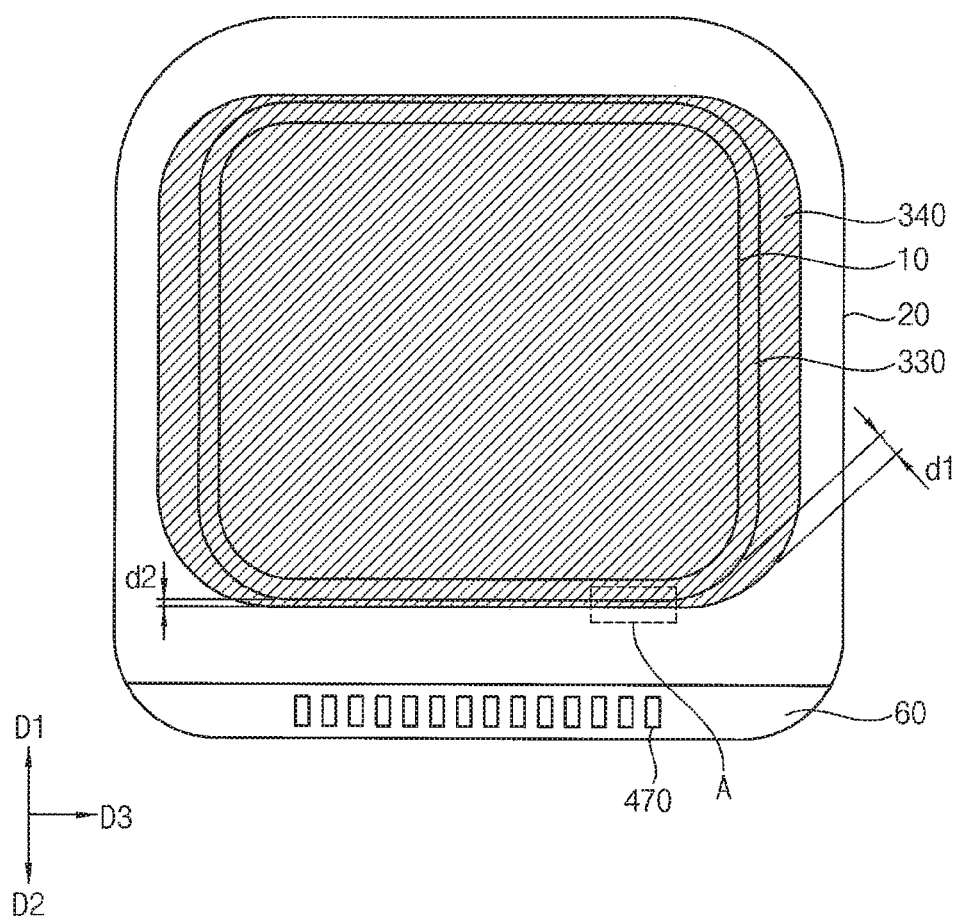

FIGS. 8 to 26 are cross-sectional views showing a method of manufacturing an organic light emitting diode display device according to exemplary embodiments of the invention. For example, FIGS. 8 to 20, 22, 23, 25, and 26 are cross-sectional views showing the method of manufacturing the organic light emitting diode display device, FIG. 21 is a plan view showing a light emitting layer included in the organic light emitting diode display device, and FIG. 24 is a plan view showing an upper electrode included in the organic light emitting diode display device.

Figure 8:
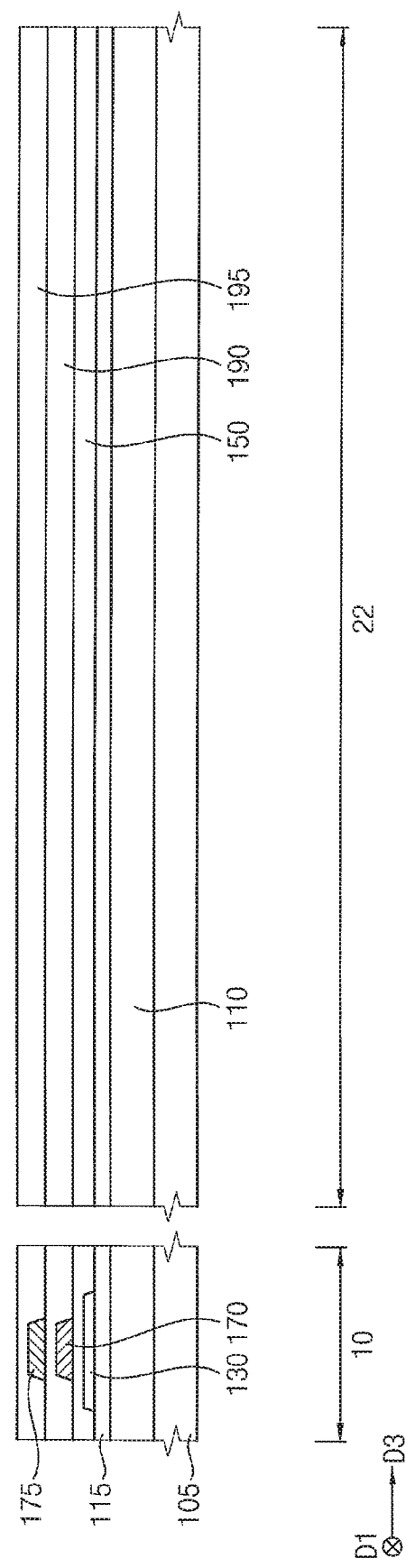
FIGS. 8, 9, 10, 11, 12, 13, 14, 15, 16, 17, 18, 19, 20, 21, 22, 23, 24, 25, and 26 are cross-sectional views showing a method of manufacturing an organic light emitting diode display device according to exemplary embodiments of the invention.

Referring to FIG. 8, a rigid glass substrate 105 may be provided. The substrate 110 including transparent or opaque materials may be formed on the rigid glass substrate 105. The substrate 110 may be formed by using a flexible transparent resin substrate. In some exemplary embodiments, the substrate 110 may have a configuration in which the first organic layer, the first barrier layer, the second organic layer, and the second barrier layer are sequentially laminated. The first barrier layer and the second barrier layer may include an inorganic material such as silicon oxide. In addition, the first organic layer and the second organic layer may include an organic material such as a polyimide-based resin. In this case, each of the first and second barrier layers may block moisture penetrating through the first and second organic layers.

A buffer layer 115 may be formed on the substrate 110. In some exemplary embodiments, the buffer layer 115 may be formed in the display region 10 and the second peripheral region 22 on the entire substrate 110. Depending on the type of the substrate 110, at least two buffer layers 115 may be provided on the substrate 110, or the buffer layer 115 might not be provided on the substrate 110. The buffer layer 115 may be formed using a silicon compound, metal oxide, etc. For example, the buffer layer 115 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, etc.

An active layer 130 may be formed in the display region 10 on the buffer layer 115. The active layer 130 may be formed using an oxide semiconductor, an inorganic semiconductor, an organic semiconductor, etc. The active layer 130 may have a source region, a drain region, and a channel region located between the source region and the drain region.

A gate insulating layer 150 may be formed on the active layer 130. The gate insulating layer 150 may cover the active layer 130 in the display region 10 on the buffer layer 115, and may extend in the direction from the display region 10 to the peripheral region 20. For example, the gate insulating layer 150 may sufficiently cover the active layer 130 on the buffer layer 115, and may have a substantially flat top surface without creating a step around the active layer 130. Alternatively, the gate insulating layer 150 may cover the active layer 130 on the buffer layer 115 while being formed along the profile of the active layer 130 with a uniform thickness, or may be formed in the display region 10 and the second peripheral region 22 on the entire buffer layer 115. The gate insulating layer 150 may be formed using a silicon compound, metal oxide, etc. In other exemplary embodiments, the gate insulating layer 150 may have a multilayer structure with a plurality of insulating layers including materials which are different from each other.

A first gate electrode 170 may be formed in the display region 10 on the gate insulating layer 150. The first gate electrode 170 may be formed on a portion of the gate insulating layer 150 under which the active layer 130 is located. The first gate electrode 170 may be formed using a metal, an alloy of a metal, metal nitride, conductive metal oxide, a transparent conductive material, etc. These may be used alone or in combination with each other. In other exemplary embodiments, the first gate electrode 170 may have a multilayer structure including a plurality of layers.

A first insulating interlayer 190 may be formed on the first gate electrode 170. The first insulating interlayer 190 may cover the first gate electrode 170 in the display region 10 on the gate insulating layer 150, and may extend in the direction from the display region 10 to the peripheral region 20. For example, the first insulating interlayer 190 may sufficiently cover the first gate electrode 170 on the gate insulating layer 150, and may have a substantially flat top surface without creating a step around the first gate electrode 170. Alternatively, the first insulating interlayer 190 may cover the first gate electrode 170 on the gate insulating layer 150, and may be formed along the profile of the first gate electrode 170 with a uniform thickness. The first insulating interlayer 190 may be formed using a silicon compound, metal oxide, etc. In other exemplary embodiments, the first insulating interlayer 190 may have a multilayer structure having a plurality of insulating layers including materials which are different from each other.

A second gate electrode 175 may be formed in the display region 10 on the first insulating interlayer 190. The second gate electrode 175 may be formed on a portion of the first insulating interlayer 190 under which the first gate electrode 170 is located. The second gate electrode 175 may be formed using a metal, an alloy of metal, metal nitride, conductive metal oxide, a transparent conductive material, etc. These may be used alone or in combination with each other. In other exemplary embodiments, the second gate electrode 175 may have a multilayer structure including a plurality of layers.

A second insulating interlayer 195 may be formed on the second gate electrode 175. The second insulating interlayer 195 may cover the second gate electrode 175 in the display region 10 on the first insulating interlayer 190, and may extend in the direction from the display region 10 to the peripheral region 20. For example, the second insulating interlayer 195 may sufficiently cover the second gate electrode 175 on the first insulating interlayer 190, and may have a substantially flat top surface without creating a step around the second gate electrode 175. Alternatively, the second insulating interlayer 195 may cover the second gate electrode 175 on the first insulating interlayer 190, and may be formed along the profile of the second gate electrode 175 with a uniform thickness. The second insulating interlayer 195 may be formed using a silicon compound, metal oxide, etc. In other exemplary embodiments, the second insulating interlayer 195 may have a multilayer structure with a plurality of insulating layers including materials which are different from each other.

Figure 9:
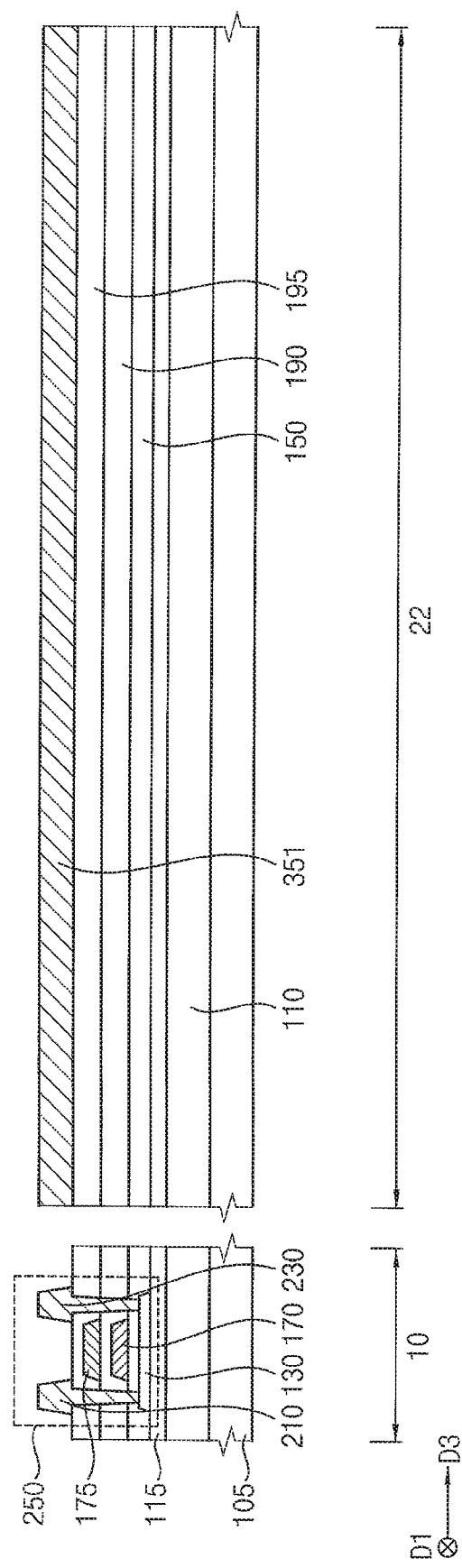

Referring to FIG. 9, a source electrode 210 and a drain electrode 230 may be formed in the display region 10 on the second insulating interlayer 195. The source electrode 210 may be connected to the source region of the active layer 130 through the contact hole formed by removing the first sections of the gate insulating layer 150, the first insulating interlayer 190, and the second insulating interlayer 195, and the drain electrode 230 may be connected to the drain region of the active layer 130 through the contact hole formed by removing the second sections of the gate insulating layer 150, the first insulating interlayer 190, and the second insulating interlayer 195. Each of the source electrode 210 and the drain electrode 230 may be formed using a metal, an alloy of a metal, metal nitride, conductive metal oxide, a transparent conductive material, etc. These may be used alone or in combination with each other. In other exemplary embodiments, each of the source electrode 210 and the drain electrode 230 may have a multilayer structure including a plurality of layers.

Accordingly, a semiconductor element 250 including the active layer 130, the gate insulating layer 150, the first gate electrode 170, the first insulating interlayer 190, the second gate electrode 175, the second insulating interlayer 195, the source electrode 210, and the drain electrode 230 may be formed.

A first sub-power supply wire 351 may be formed in a part of the first peripheral region 21, the second peripheral region 22, and the third peripheral region 23 on the second insulating interlayer 195 (see FIG. 2). In some exemplary embodiments, the first sub-power supply wire 351 may have the first width W1 in the part of the first peripheral region 21 and the second peripheral region 22, and may have the second width W2 that is smaller than the first width W1 in the third peripheral region 23. In other words, the first sub-power supply wire 351 may have different widths in the first and second peripheral regions 21 and 22 and the third peripheral region 23. The first sub-power supply wire 351 may be formed using a metal, an alloy of a metal, metal nitride, conductive metal oxide, a transparent conductive material, etc. For example, the first sub-power supply wire 351 may be formed using Au, Ag, Al, Pt, Ni, Ti, Pd, Mg, Ca, Li, Cr, Ta, W, Cu, Mo, Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, etc. These may be used alone or in combination with each other. Alternatively, the first sub-power supply wire 351 may have a multilayer structure including a plurality of layers. In some exemplary embodiments, the source electrode 210, the drain electrode 230, and the first sub-power supply wire 351 may be formed simultaneously using an identical material on the same layer with each other.

For example, after a preliminary first electrode layer is formed on the second insulating interlayer 195, the preliminary first electrode layer may be partially etched to simultaneously form the source electrode 210, the drain electrode 230, and the first sub-power supply wire 351.

Figure 10:
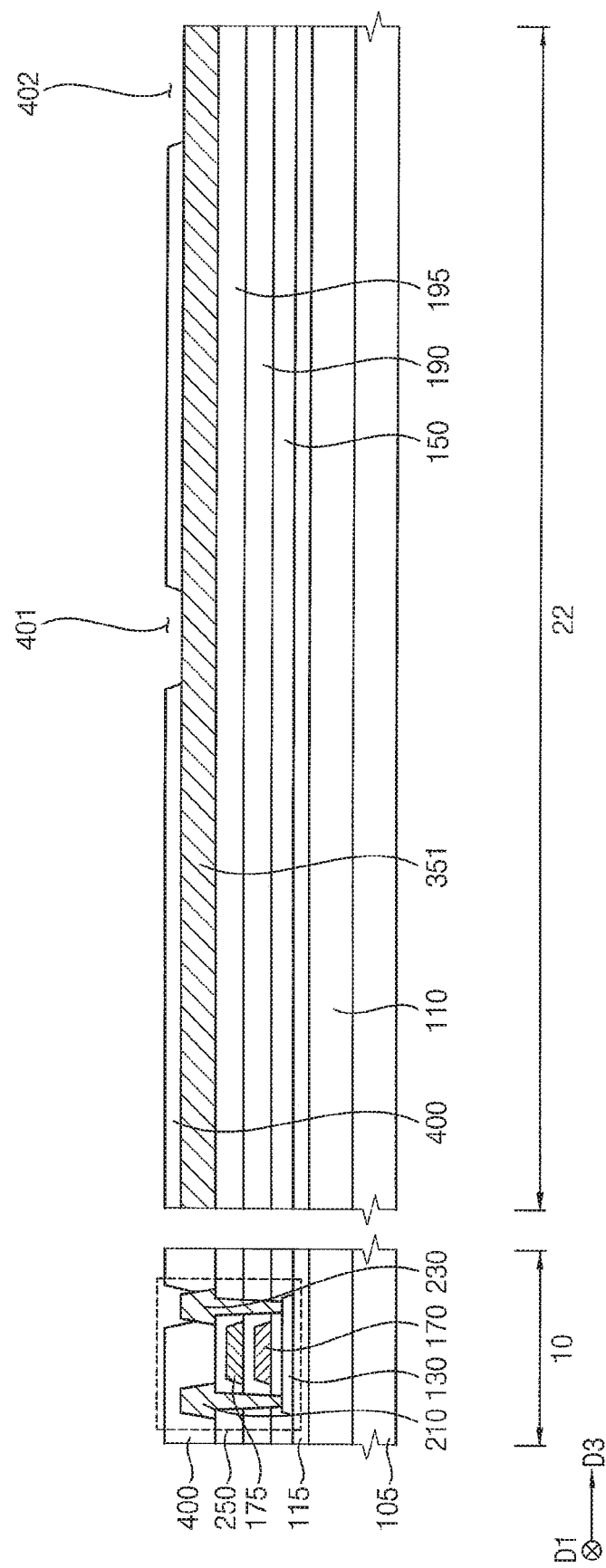

Referring to FIG. 10, a protective insulating layer 400 may be formed on the second insulating interlayer 195, the source and drain electrodes 210 and 230, and the first sub-power supply wire 351. The protective insulating layer 400 may cover the source and drain electrodes 210 and 230 in the display region 10 on the second insulating interlayer 195, and may cover the first sub-power supply wire 351 in the second peripheral region 22 on the second insulating interlayer 195. In some exemplary embodiments, the protective insulating layer 400 may have a first opening 401 and a second opening 402 for exposing a part of the first sub-power supply wire 351 in the peripheral region 20 (or first peripheral region 21 and second peripheral region 22). In addition, the protective insulating layer 400 may have an opening for exposing a part of the drain electrode 230 in the display region 10. For example, the protective insulating layer 400 may sufficiently cover the source and drain electrodes 210 and 230 and the first sub-power supply wire 351 on the second insulating interlayer 195, and may have a substantially flat top surface without creating a step around the source and drain electrodes 210 and 230, and the first sub-power supply wire 351. Alternatively, the protective insulating layer 400 may cover the source and drain electrodes 210 and 230 and the first sub-power supply wire 351 on the second insulating interlayer 195, and may be formed as a substantially uniform thickness along the profiles of the source and drain electrodes 210 and 230 and the first sub-power supply wire 351. The protective insulating layer 400 may be formed using a silicon compound, metal oxide, etc. In other exemplary embodiments, the protective insulating layer 400 may have a multilayer structure with a plurality of insulating layers including materials which are different from each other.

Figure 11:
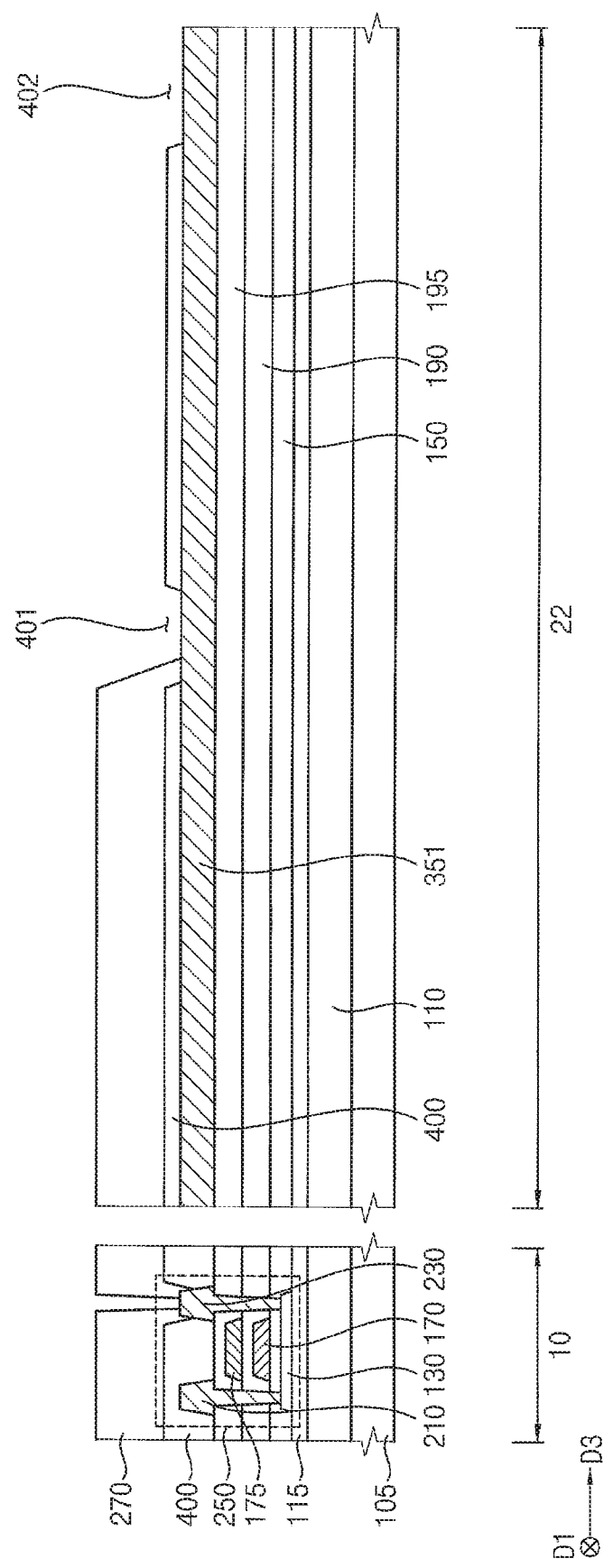

Referring to FIG. 11, a first planarization layer 270 may be formed on the protective insulating layer 400. The first planarization layer 270 may be formed in the display region 10 and a part of the peripheral region 20 (e.g., part of first peripheral region 21 and part of second peripheral region 22) on the protective insulating layer 400. In other words, the first planarization layer 270 may cover the protective insulating layer 400 in the display region 10 while extending in the direction from the display region 10 to the peripheral region 20, and may expose the first opening 401 and the second opening 402 of the protective insulating layer 400 in the peripheral region 20. In other words, the first planarization layer 270 may extend from the display region 10 to the peripheral region 20 to cover at least a part of the first opening 401. In addition, the first planarization layer 270 may have a contact hole for exposing a part of the drain electrode 230. For example, the first planarization layer 270 may have a relatively thick thickness, and in this case, the first planarization layer 270 may have a substantially flat top surface. In order to implement such a flat top surface of the first planarization layer 270, the planarization process may be additionally performed on the first planarization layer 270. Alternatively, the first planarization layer 270 may be formed along the profile of the protective insulating layer 400 on the protective insulating layer 400 with a uniform thickness. The first planarization layer 270 may be formed using an organic material. For example, the first planarization layer 270 may include photoresist, a polyacryl-based resin, a polyimide-based resin, a polyamide-based resin, a siloxane-based resin, an acryl-based resin, an epoxy-based resin, etc.

Figure 12:
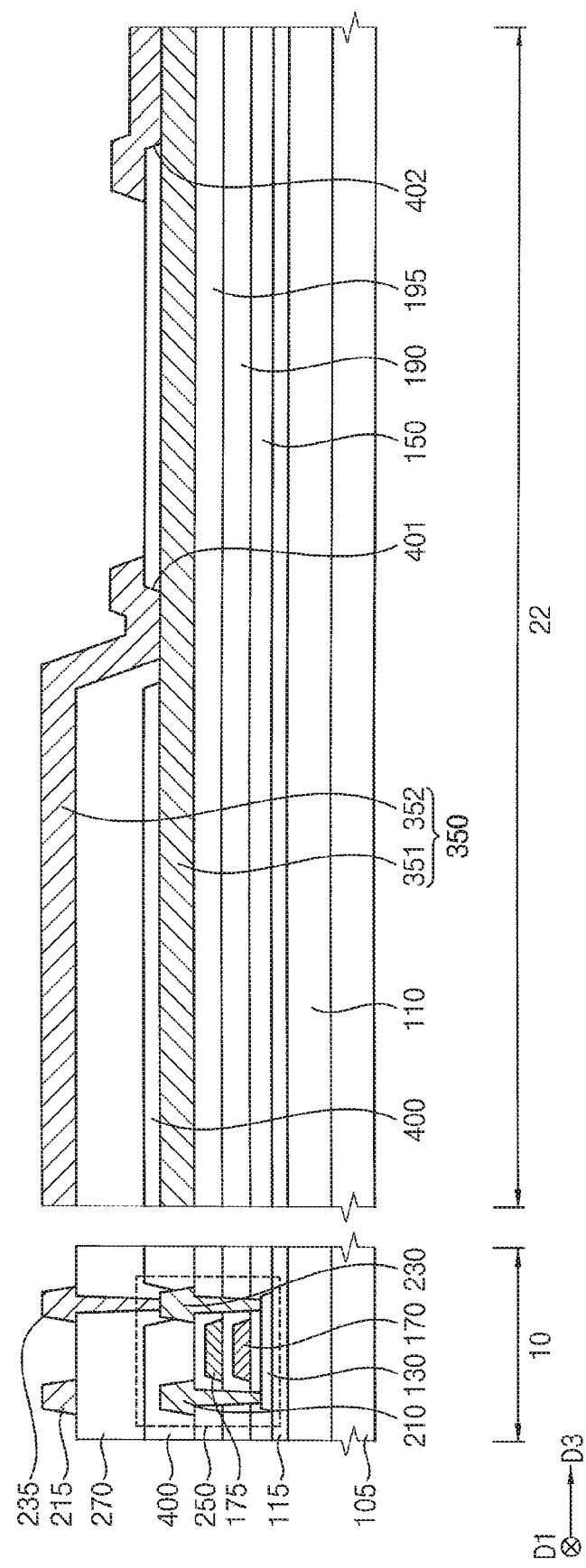

Referring to FIG. 12, a wire pattern 215 and a connection electrode 235 may be formed in the display region 10 on the first planarization layer 270. The connection electrode 235 may be spaced apart from the wire pattern 215 in the display region 10 on the first planarization layer 270. The connection electrode 235 may be connected to the drain electrode 230 through the contact hole of the first planarization layer 270 located in the display region 10. Each of the wire pattern 215 and the connection electrode 235 may be formed using a metal, an alloy of a metal, metal nitride, conductive metal oxide, a transparent conductive material, etc. These may be used alone or in combination with each other. In other exemplary embodiments, each of the wire pattern 215 and the connection electrode 235 may have a multilayer structure including a plurality of layers.

A second sub-power supply wire 352 may be formed in the peripheral region 20 on the first planarization layer 270 (see FIG. 2). In some exemplary embodiments, the second sub-power supply wire 352 may have the first width W1 in the part of the first peripheral region 21 and the second peripheral region 22, and may have the second width W2 that is smaller than the first width W1 in the third peripheral region 23. In other words, the second sub-power supply wire 352 may have different widths in the second peripheral region 22 and the third peripheral region 23. The second sub-power supply wire 352 may make direct contact with the first sub-power supply wire 351 through the first opening 401 in the first and second peripheral regions 21 and 22, and may make direct contact with the first sub-power supply wire 351 through the second opening 402. In addition, the second sub-power supply wire 352 may have the opening for exposing the top surface of the protective insulating layer 400 between the first opening 401 and the second opening 402 in the first and second peripheral regions 21 and 22. Alternatively, the second sub-power supply wire 352 may be continuously formed without the opening in the first and second peripheral regions 21 and 22. The second sub-power supply wire 352 may be formed using a metal, an alloy of a metal, metal nitride, conductive metal oxide, a transparent conductive material, etc. These may be used alone or in combination with each other. Alternatively, the second sub-power supply wire 352 may have a multilayer structure including a plurality of layers. In some exemplary embodiments, the wire pattern 215, the connection electrode 235, and the second sub-power supply wire 352 may be formed simultaneously using an identical material on the same layer with each other.

For example, after a preliminary second electrode layer is formed on the first planarization layer 270, the first sub-power supply wire 351, and the protective insulating layer 400, the preliminary second electrode layer may be partially etched to simultaneously form the wire pattern 215, the connection electrode 235, and the second sub-power supply wire 352.

Figure 13:
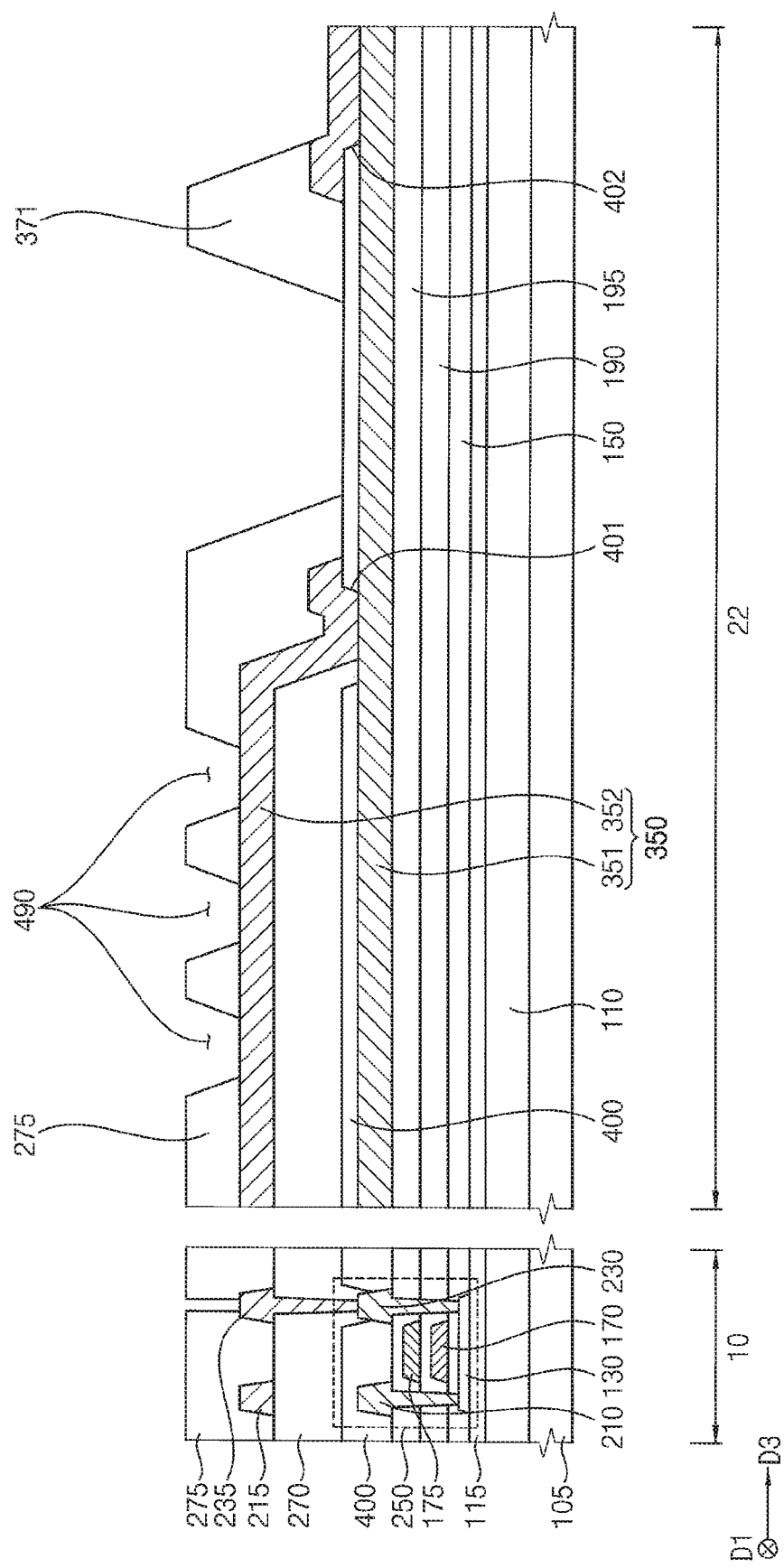
Figure 14:
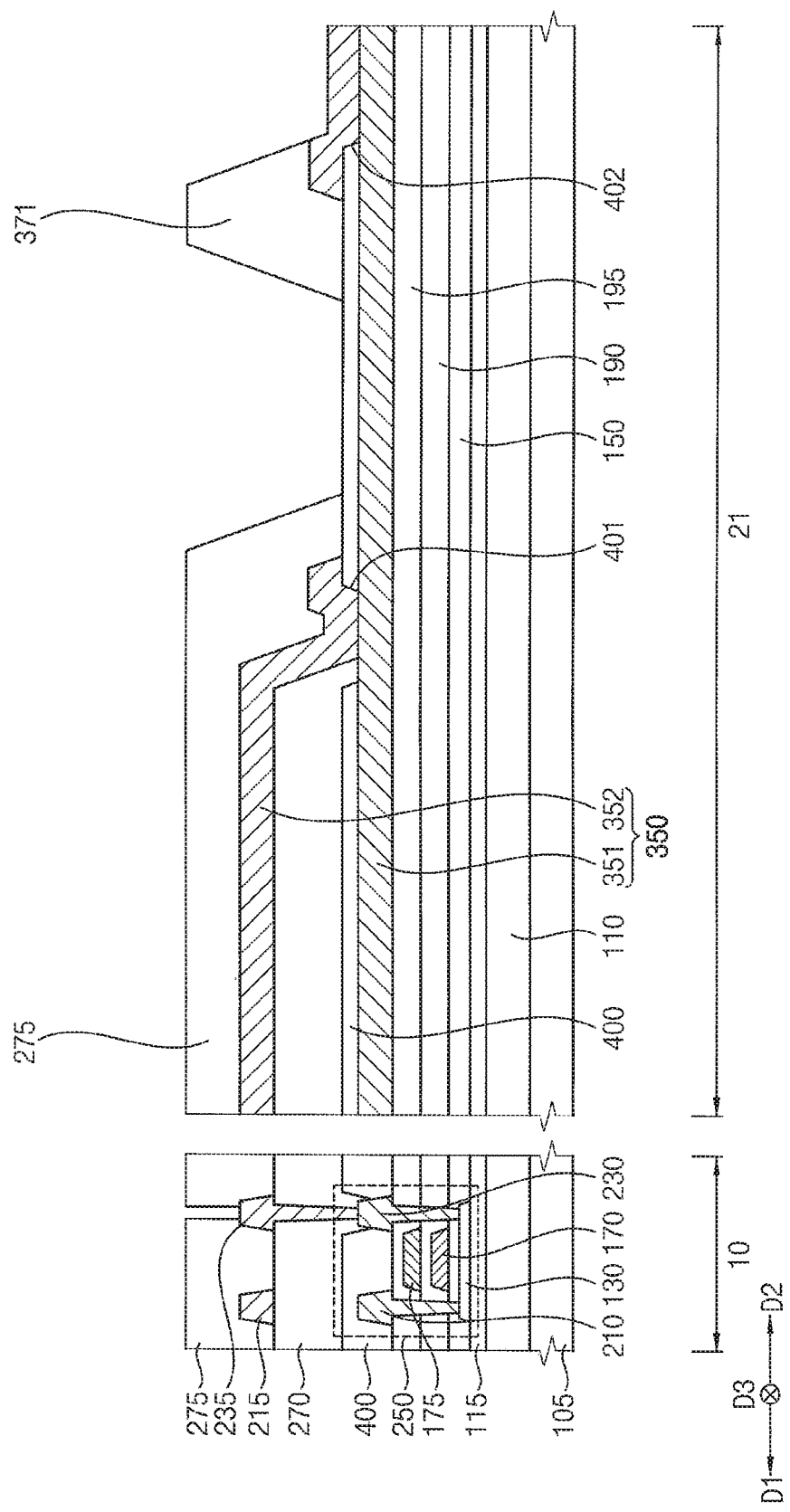

Referring to FIGS. 13 and 14, a second planarization layer 275 may be formed on the wire pattern 215, the connection electrode 235, the second sub-power supply wire 352, and the first planarization layer 270. The second planarization layer 275 may cover the wire pattern 215 and the connection electrode 235 in the display region 10 on the first planarization layer 270 while extending in the direction from the display region 10 to the peripheral region 20 so as to cover the second sub-power supply wire 352 in the peripheral region 20. In some exemplary embodiments, as shown in FIG. 13, the second planarization layer 275 may have openings 490 for exposing the top surface of the second sub-power supply wire 352 in the second peripheral region 22. In addition, the openings 490 may be formed in a portion where the first power supply wire 350 and the connection pattern 295 are overlapped with each other in the third peripheral region 23. Alternatively, as shown in FIG. 14, the second planarization layer 275 is configured without the openings for exposing the top surface of the second sub-power supply wire 352 in the first peripheral region 21. In other words, the second planarization layer 275 located in the first peripheral region 21 may cover the second sub-power supply wire 352 adjacent to the display region 10.

Moreover, the second planarization layer 275 may cover the end of the second sub-power supply wire 352 formed in the first opening 401 in the peripheral region 20, and may have a contact hole for exposing the connection electrode 235 in the display region 10. The second planarization layer 275 may have a relatively thick thickness to sufficiently cover the wire pattern 215, the connection electrode 235, and the second sub-power supply wire 352, and in this case, the second planarization layer 275 may have a substantially flat top surface. In order to implement such a flat top surface of the second planarization layer 275, the planarization process may be additionally performed on the second planarization layer 275. Alternatively, the second planarization layer 275 may cover the wire pattern 215, the connection electrode 235, and the second sub-power supply wire 352, and may be formed along the profiles of the wire pattern 215, the connection electrode 235, and the second sub-power supply wire 352 with a uniform thickness. The second planarization layer 275 may be formed using an organic material.

A first blocking pattern 371 may be formed in the peripheral region 20 on the protective insulating layer 400 and the first sub-power supply wire 351. The first blocking pattern 371 may be spaced apart from the second planarization layer 275 in the direction from the display region 10 to the peripheral region 20, and may cover a first end of the second sub-power supply wire 352 formed in the second opening 402. For example, the first blocking pattern 371 may be formed along the profile of the outer peripheral edge of the display region 10. In other words, the first blocking pattern 371 may surround the display region 10 in the first peripheral region 21, the second peripheral region 22, and the third peripheral region 23. In some exemplary embodiments, the second planarization layer 275 and the first blocking pattern 371 may be formed simultaneously using an identical material.

Figure 15:
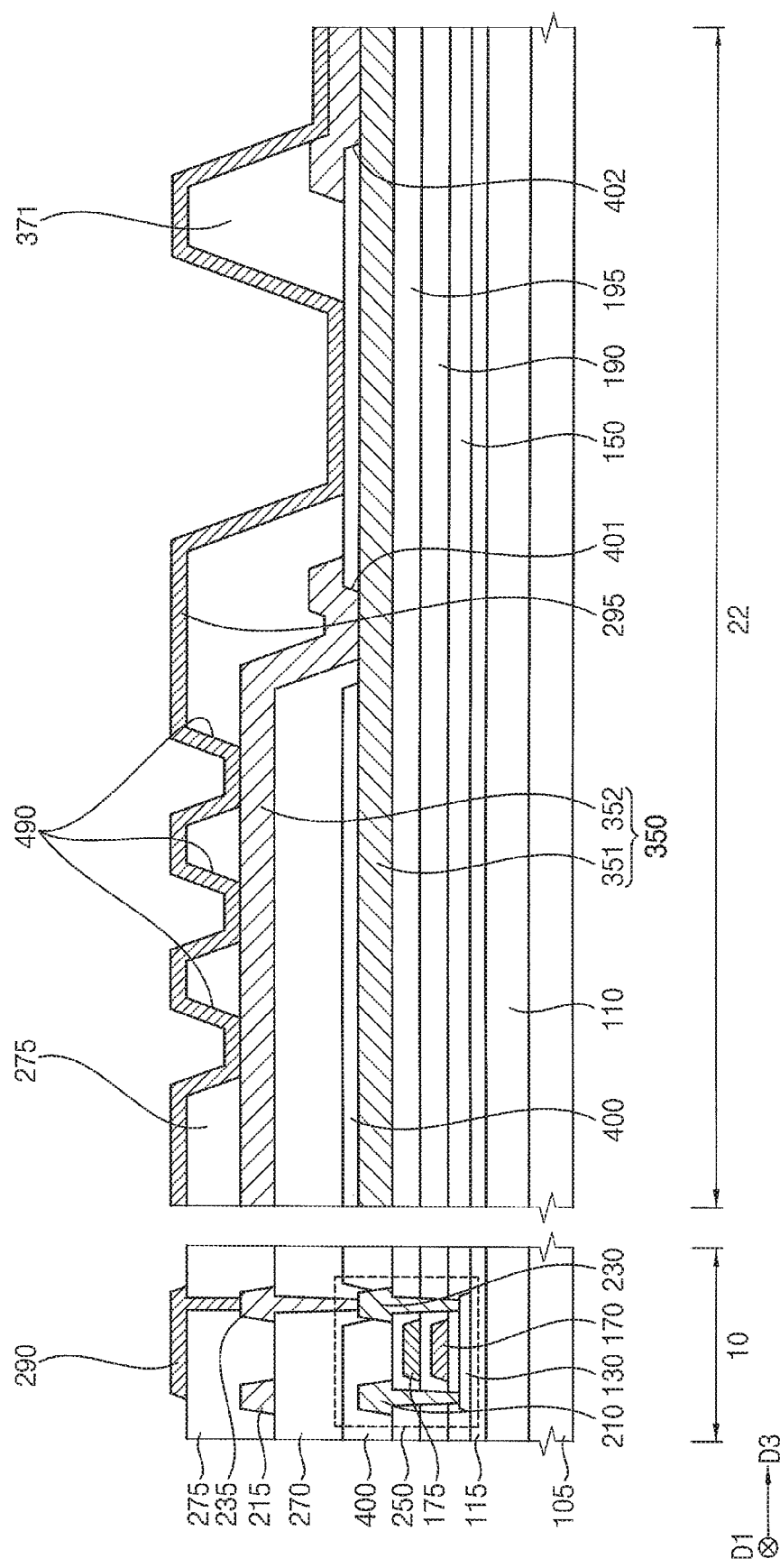
Figure 16:
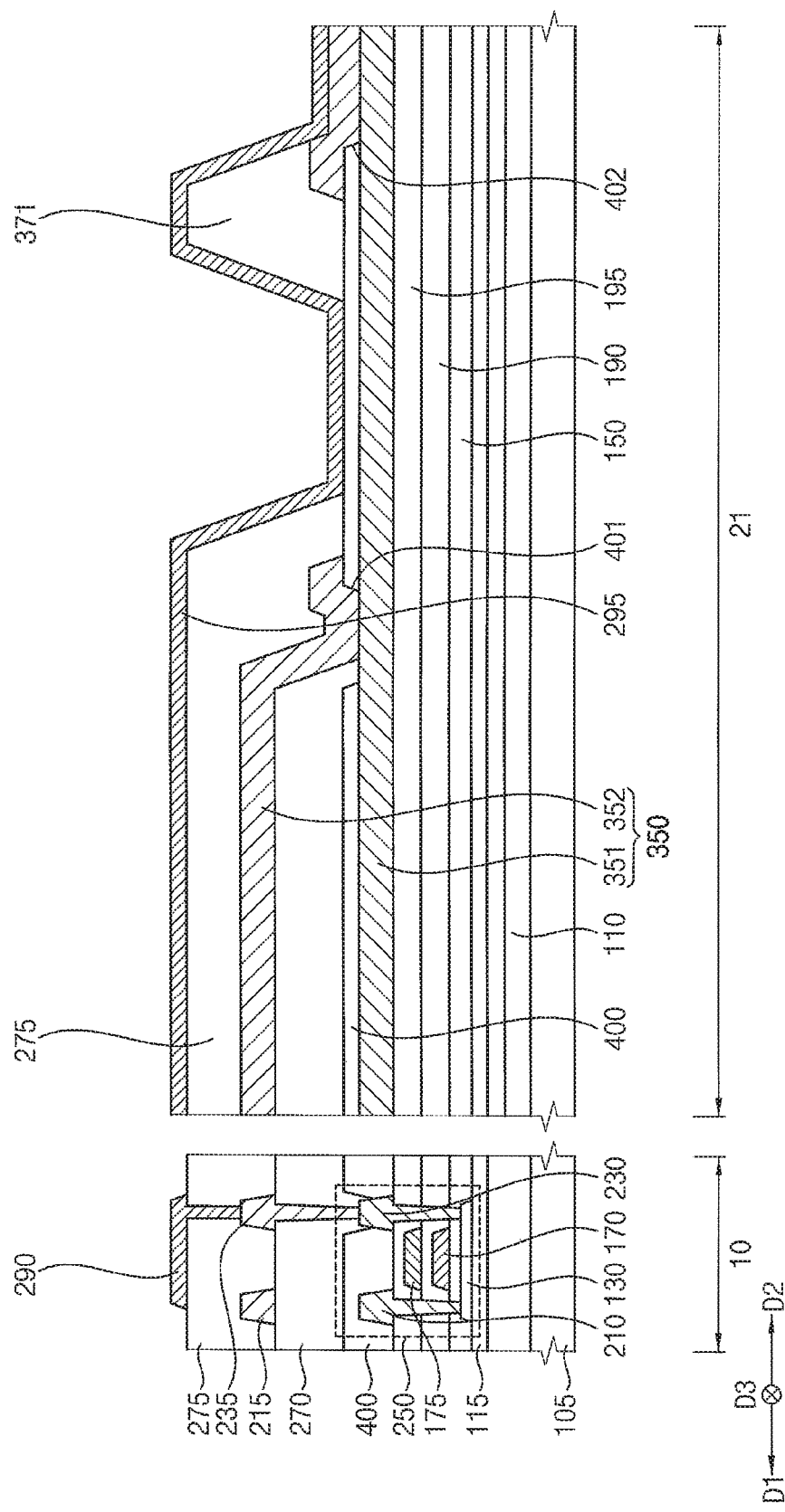

Referring to FIGS. 15 and 16, a lower electrode 290 may be formed in the display region 10 on the second planarization layer 275. The lower electrode 290 may be connected to the connection electrode 235 through the contact hole formed by removing a part of the second planarization layer 275. The lower electrode 290 may be formed using a metal, an alloy of a metal, metal nitride, conductive metal oxide, a transparent conductive material, etc. These may be used alone or in combination with each other. In other exemplary embodiments, the lower electrode 290 may have a multi-layer structure including a plurality of layers.

A connection pattern 295 may be formed in the peripheral region 20 on the second planarization layer 275, the protective insulating layer 400, the first blocking pattern 371, and the second sub-power supply wire 352. The connection pattern 295 may be formed on the second planarization layer 275, the inner sides of the openings 490 of the second planarization layer 275 shown in FIG. 15, the protective insulating layer 400 located between the second planarization layer 275 and the first blocking pattern 371, the first blocking pattern 371, and the second sub-power supply wire 352 formed in the second opening 402, and may extend in the direction from the display region 10 to the peripheral region 20. In other words, the connection pattern 295 may be formed along the profiles of the second planarization layer 275, the protective insulating layer 400, the first blocking pattern 371, and the second sub-power supply wire 352. The connection pattern 295 may be formed using a metal, an alloy of a metal, metal nitride, conductive metal oxide, a transparent conductive material, etc. These may be used alone or in combination with each other. In other exemplary embodiments, the connection pattern 295 may have a multilayer structure including a plurality of layers. In some exemplary embodiments, the lower electrode 290 and the connection pattern 295 may be formed simultaneously using an identical material.

For example, after a preliminary third electrode layer is formed on the second planarization layer 275, the second sub-power supply wire 352, and the protective insulating layer 400, the preliminary third electrode layer may be partially etched to simultaneously form the lower electrode 290 and the connection pattern 295.

Figure 17:
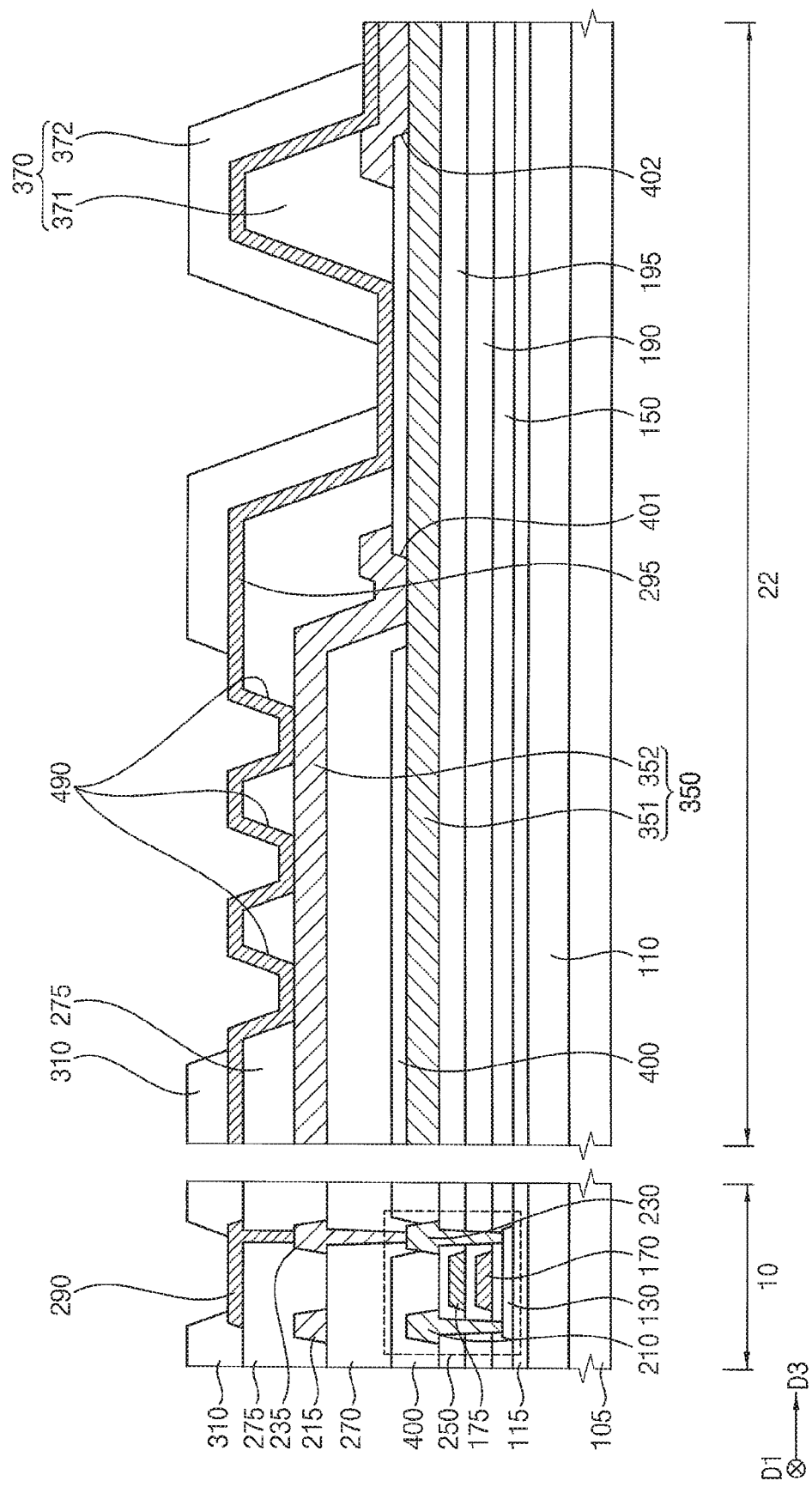
Figure 18:
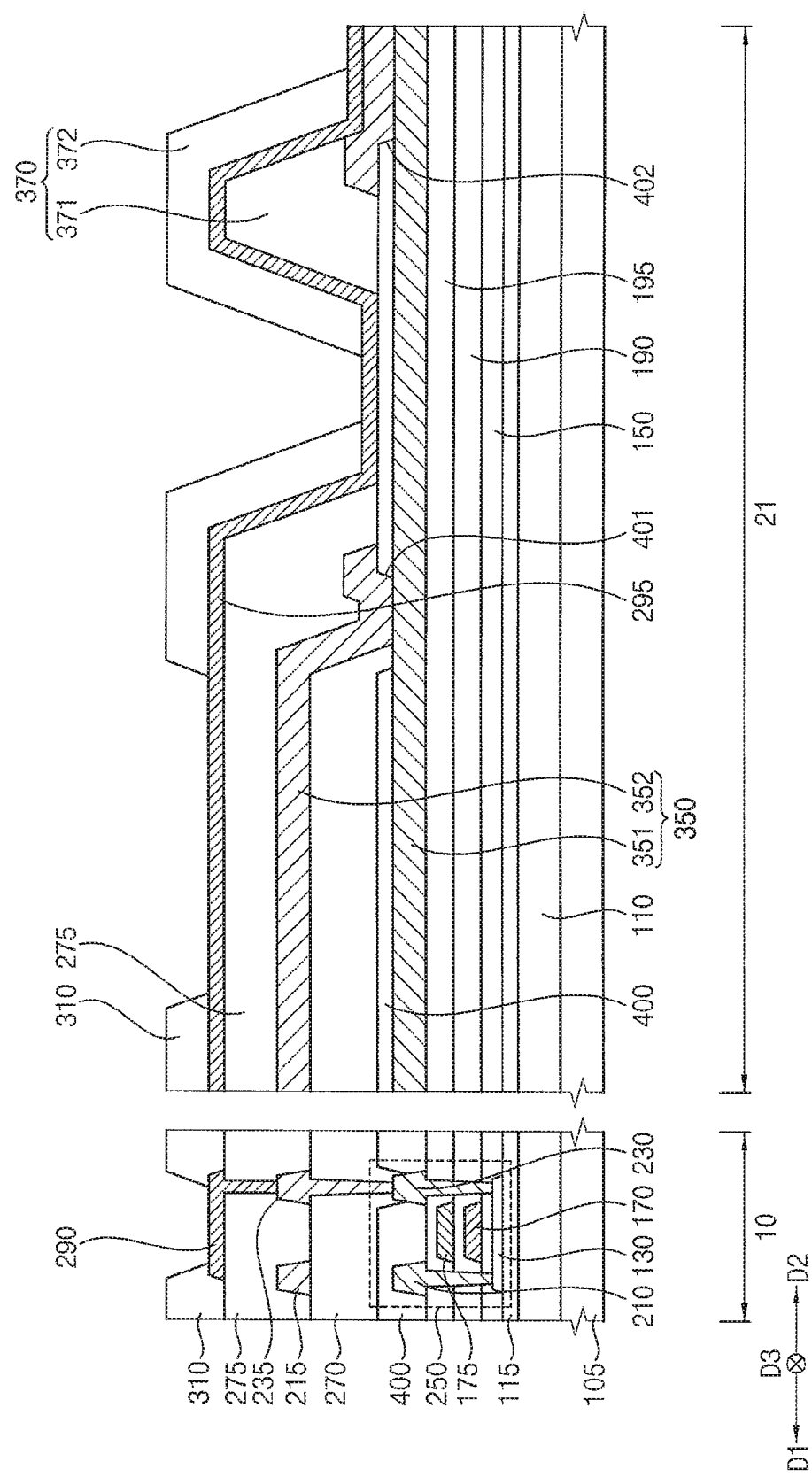

Referring to FIGS. 17 and 18, a pixel defining layer 310 may be formed in the display region 10 and the peripheral region 20 on the second planarization layer 275. In some exemplary embodiments, as shown in FIG. 17, the pixel defining layer 310 may expose a part of the lower electrode 290 in the display region 10 while extending in the direction from the display region 10 to the peripheral region 20, and may be formed on the connection pattern 295 while exposing the connection pattern 295 formed in the openings 490 in the second peripheral region 22. Alternatively, as shown in FIG. 18, the pixel defining layer 310 may expose the part of the lower electrode 290 in the display region 10 while extending in the direction from the display region 10 to the peripheral region 20, and may be formed on the connection pattern 295 while exposing the connection pattern 295 formed on the second planarization layer 275 in the first peripheral region 21. The pixel defining layer 310 may be formed using an organic material.

A second blocking pattern 372 may be formed in the peripheral region 20 on the connection pattern 295. The second blocking pattern 372 may be spaced apart from the pixel defining layer 310 in the direction from the display region 10 to the peripheral region 20, and may cover the connection pattern 295 formed on the first blocking pattern 371. For example, the second blocking pattern 372 may be formed along the profile of the outer peripheral edge of the display region 10. In other words, the second blocking pattern 372 may surround the display region 10 in the first peripheral region 21, the second peripheral region 22, and the third peripheral region 23. The second blocking pattern 372 may be formed using an organic material. In addition, the pixel defining layer 310 and the second blocking pattern 372 may be formed simultaneously using an identical material.

Accordingly, a blocking structure 370 including the first blocking pattern 371 and the second blocking pattern 372 may be formed.

Figure 19:
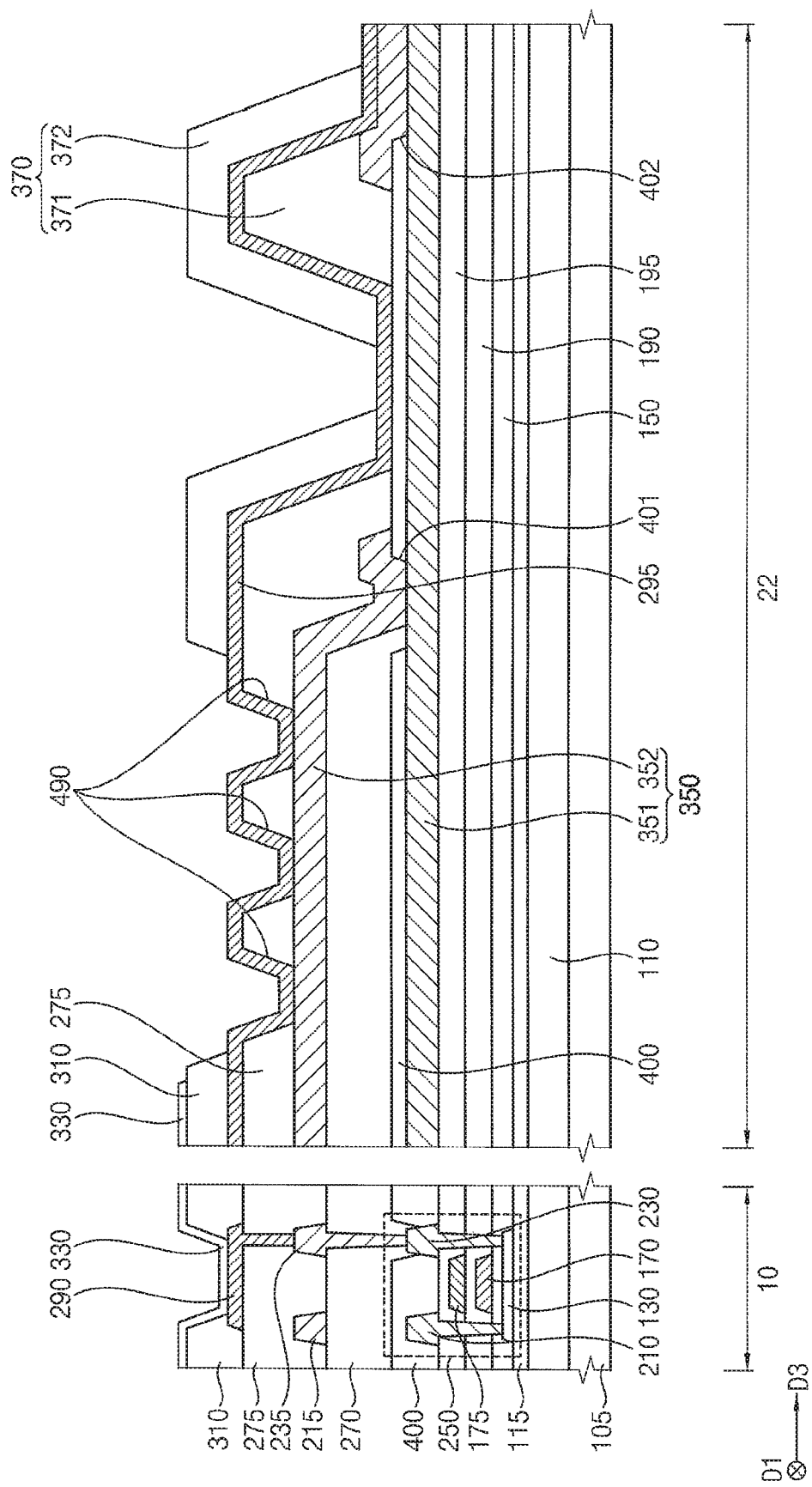
Figure 20:
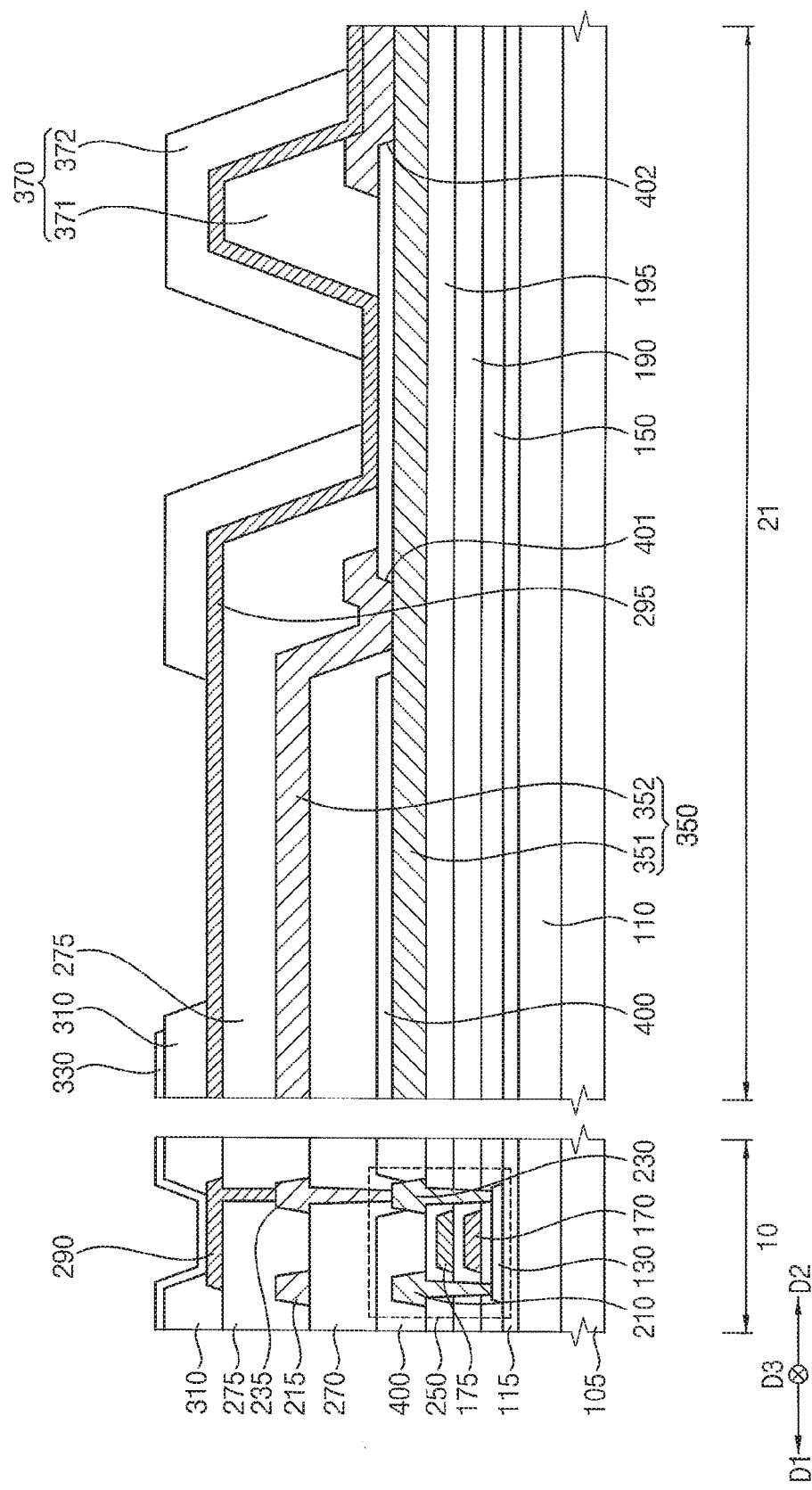

Referring to FIGS. 19, 20, and 21, a light emitting layer 330 may be formed in the display region 10 and a part of the peripheral region 20 on the substrate 110. For example, the light emitting layer 330 may be formed on the pixel defining layer 310 and the lower electrode 290 in the display region 10 while extending in the direction from the display region 10 to the peripheral region 20, and may be formed on a part of the pixel defining layer 310 in the peripheral region 20. In other words, the light emitting layer 330 may be formed along the profiles of the pixel defining layer 310 and the lower electrode 290. In some exemplary embodiments, the light emitting layer 330 might not be overlapped with the connection pattern 295 exposed by the openings 490 located in the second peripheral region 22 and the pixel defining layer 310 located in the first peripheral region 21. The light emitting layer 330 may have a multilayer structure including an EML, an HIL, an HTL, an ETL, an EIL, etc. The EML of the light emitting layer 330 may be formed using at least one of the light emitting materials for emitting the different color lights according to the sub-pixels. Alternatively, the EML of the light emitting layer 330 may be formed by laminating a plurality of light emitting materials for emitting the different color lights such as the red light, the green light, or the blue light to emit the white light as a whole. In this case, the color filter may be formed on the light emitting layer 330 which is formed on the lower electrode 290. The color filter may include at least one of the red color filter, the green color filter, and the blue color filter. Alternatively, the color filter may include the yellow color filter, the cyan color filter, and the magenta color filter. The color filter may be formed using a photosensitive resin or color photoresist.

Figure 22:
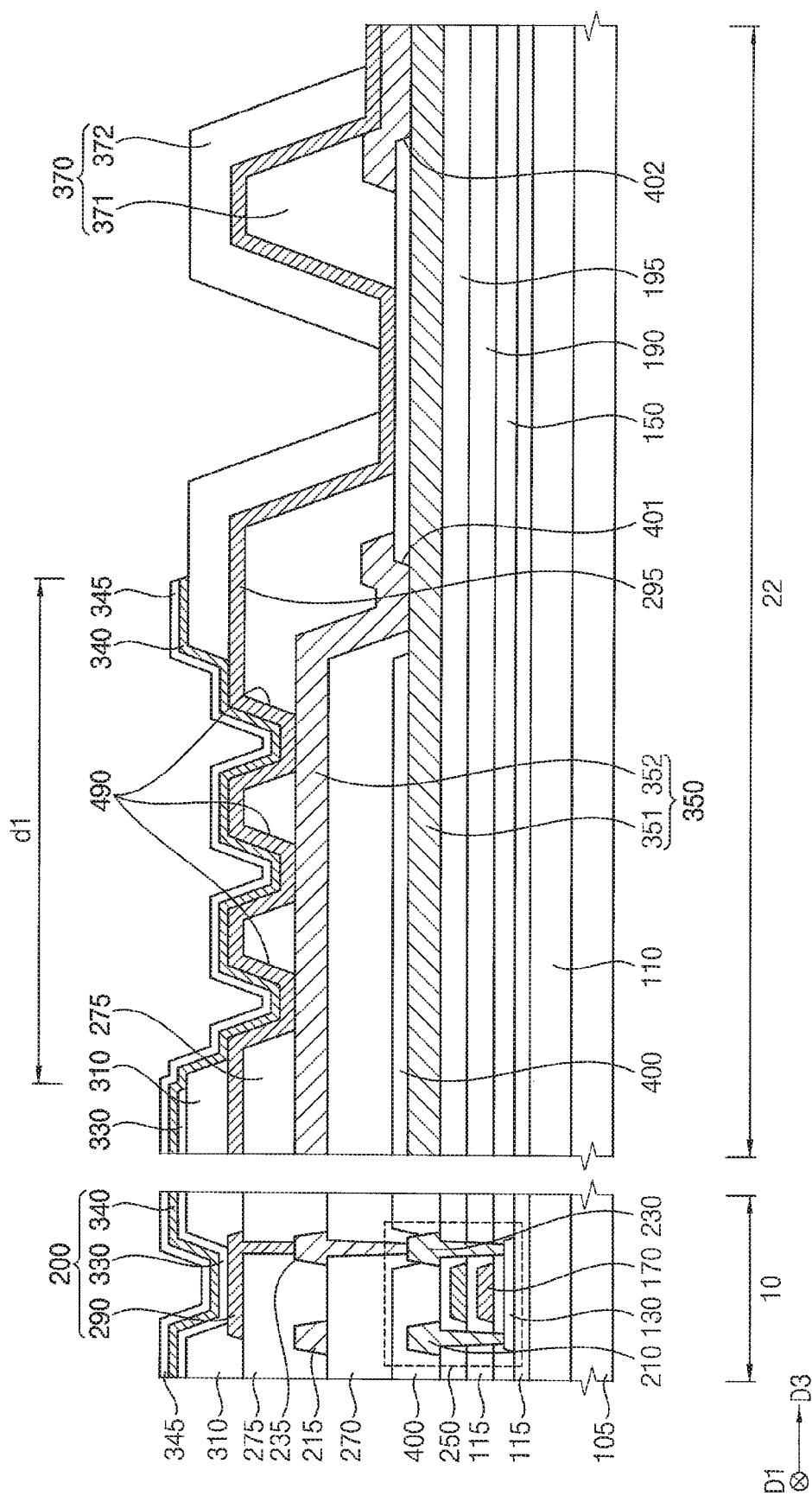

Referring to FIGS. 22, 23, and 24, an upper electrode 340 may be formed in the display region 10 and a part of the peripheral region 20 on the substrate 110. For example, the upper electrode 340 may be formed on the light emitting layer 330 in the display region 10 while extending in the direction from the display region 10 to the peripheral region 20, and may be formed on the light emitting layer 330, a part of the pixel defining layer 310, the connection pattern 295 formed in the openings 490 shown in FIG. 22, and the connection pattern 295 exposed by the pixel defining layer 310 shown in FIG. 23 in the peripheral region 20. In other words, the upper electrode 340 may be formed along the profiles of the light emitting layer 330, the pixel defining layer 310, and the connection pattern 295. In some exemplary embodiments, the upper electrode 340 may make direct contact with the connection pattern 295 formed in the openings 490 shown in FIG. 22 and the connection pattern 295 exposed by the pixel defining layer 310 shown in FIG. 23. The upper electrode 340 may be formed using a metal, an alloy of a metal, metal nitride, conductive metal oxide, a transparent conductive material, etc. These may be used alone or in combination with each other. In other exemplary embodiments, the upper electrode 340 may have a multilayer structure including a plurality of layers.

Accordingly, a sub-pixel structure 200 including the lower electrode 290, the light emitting layer 330, and the upper electrode 340 may be formed.

As shown in FIGS. 22, 23, and 24, the upper electrode 340 may protrude from the light emitting layer 330 in the direction from the display region 10 to the peripheral region 20 by a first distance d1. In other words, an area of the upper electrode 340 may be larger than an area of the light emitting layer 330. In addition, the display region 10 may have a rectangular shape with curved corners when viewed in plan, and the light emitting layer 330 and the upper electrode 340 may also have a rectangular shape with curved corners when viewed in plan.

Due to the rectangular shape with the curved corners when viewed in plan, distances by which the upper electrode 340 protrudes from the light emitting layer 330 in the direction from the display region 10 to the peripheral region 20 may be different from each other in the first peripheral region 21, the second peripheral region 22, and the third peripheral region 23. For example, a second distance d2 by which the upper electrode 340 protrudes from the light emitting layer 330 in a region A may be relatively smaller than a distance by which the upper electrode protrudes from the light emitting layer 330 in other regions. In this case, since the second distance d2 is too small in the region A, it may be difficult to form an opening for exposing the second sub-power supply wire 352 in the second planarization layer 275. Therefore, the openings 490 are not formed in the second planarization layer 275 in the region A (see FIG. 23).

Referring again to FIGS. 22 and 23, a capping layer 345 may be formed in the display region 10 and a part of the second peripheral region 22 on the substrate 110. For example, the capping layer 345 may be formed on the upper electrode 340 in the display region while extending in the direction from the display region 10 to the peripheral region 20, and may be formed on the upper electrode 340 in the peripheral region 20. In other words, the capping layer 345 may be formed along the profile of the upper electrode 340 in the display region 10 and the peripheral region 20. In some exemplary embodiments, the capping layer 345 may be overlapped with the upper electrode 340 in the peripheral region 20. The capping layer 345 may be formed using a triamine derivative, an arylenediamine derivative, 4,4'-N,N'-dicarbazole-biphenyl CBP, Alq3, etc.

Figure 25:
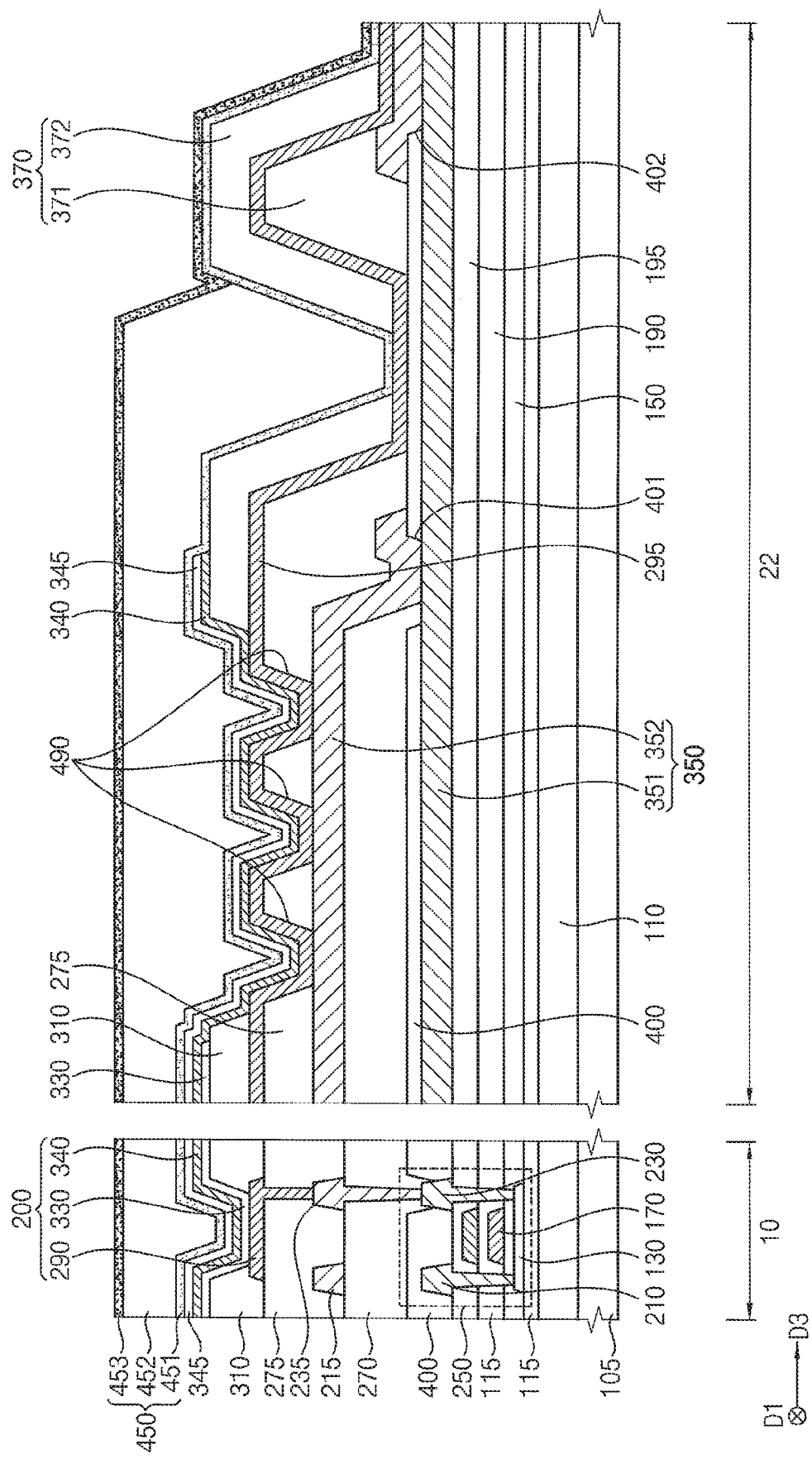
Figure 26:
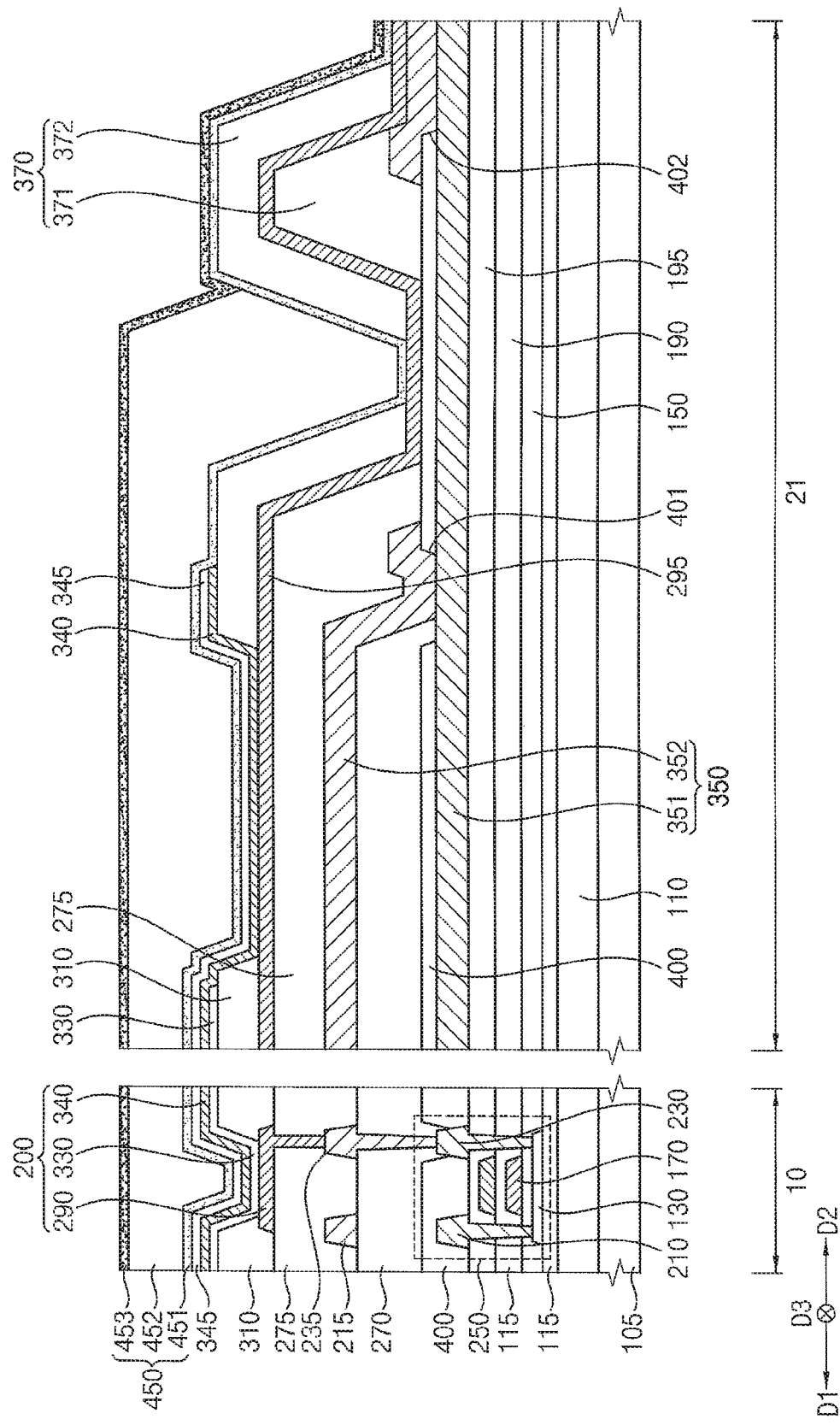

Referring to FIGS. 25 and 26, a first thin film encapsulation layer 451 may be formed in the display region 10 and the peripheral region 20 on the substrate 110. For example, the first thin film encapsulation layer 451 may be formed on the capping layer 345 in the display region 10 while extending in the direction from the display region 10 to the peripheral region 20, and may be formed on the capping layer 345, the pixel defining layer 310, the blocking structure 370, and the connection pattern 295 in the peripheral region 20. In other words, the first thin film encapsulation layer 451 may be formed along the profiles of the capping layer 345, the pixel defining layer 310, the blocking structure 370, and the connection pattern 295. In some exemplary embodiments, the first thin film encapsulation layer 451 may make direct contact with the capping layer 345 in the openings 490, and may make direct contact with the connection pattern 295 in a portion located between the pixel defining layer 310 and the blocking structure 370 in the second peripheral region 22. The first thin film encapsulation layer 451 may be formed using flexible inorganic materials.

A second thin film encapsulation layer 452 may be formed in the display region and a part of the peripheral region 20 on the first thin film encapsulation layer 451. The second thin film encapsulation layer 452 may be overlapped with a part of the side wall of the blocking structure 370. Alternatively, the second thin film encapsulation layer 452 might not be overlapped with the blocking structure 370, or may cover the blocking structure 370 while extending in the direction from the display region 10 to the peripheral region 20. The second thin film encapsulation layer 452 may be formed using flexible organic materials.

A third thin film encapsulation layer 453 may be formed on the second thin film encapsulation layer 452 and the first thin film encapsulation layer 451. The third thin film encapsulation layer 453 may cover the second thin film encapsulation layer 452 in the display region 10 while being formed along the profile of the second thin film encapsulation layer 452 with a uniform thickness, and may extend to the peripheral region 20. The third thin film encapsulation layer 453 may be formed along the profiles of the first thin film encapsulation layer 451 and a part of the second thin film encapsulation layer 452 in the peripheral region 20. The third thin film encapsulation layer 453 may be formed using flexible inorganic materials.

Accordingly, a thin film encapsulation structure 450 including the first thin film encapsulation layer 451, the second thin film encapsulation layer 452, and the third thin film encapsulation layer 453 may be formed. Alternatively, the thin film encapsulation structure 450 may have a five-layer structure formed by laminating first to fifth thin film encapsulation layers or a seven-layer structure formed by laminating first to seventh thin film encapsulation layers.

After the thin film encapsulation structure 450 is formed, the glass substrate 105 may be removed from the substrate 110. Accordingly, the OLED display device 100 shown in FIGS. 6 and 7 may be manufactured through the above process steps.

Figure 27:
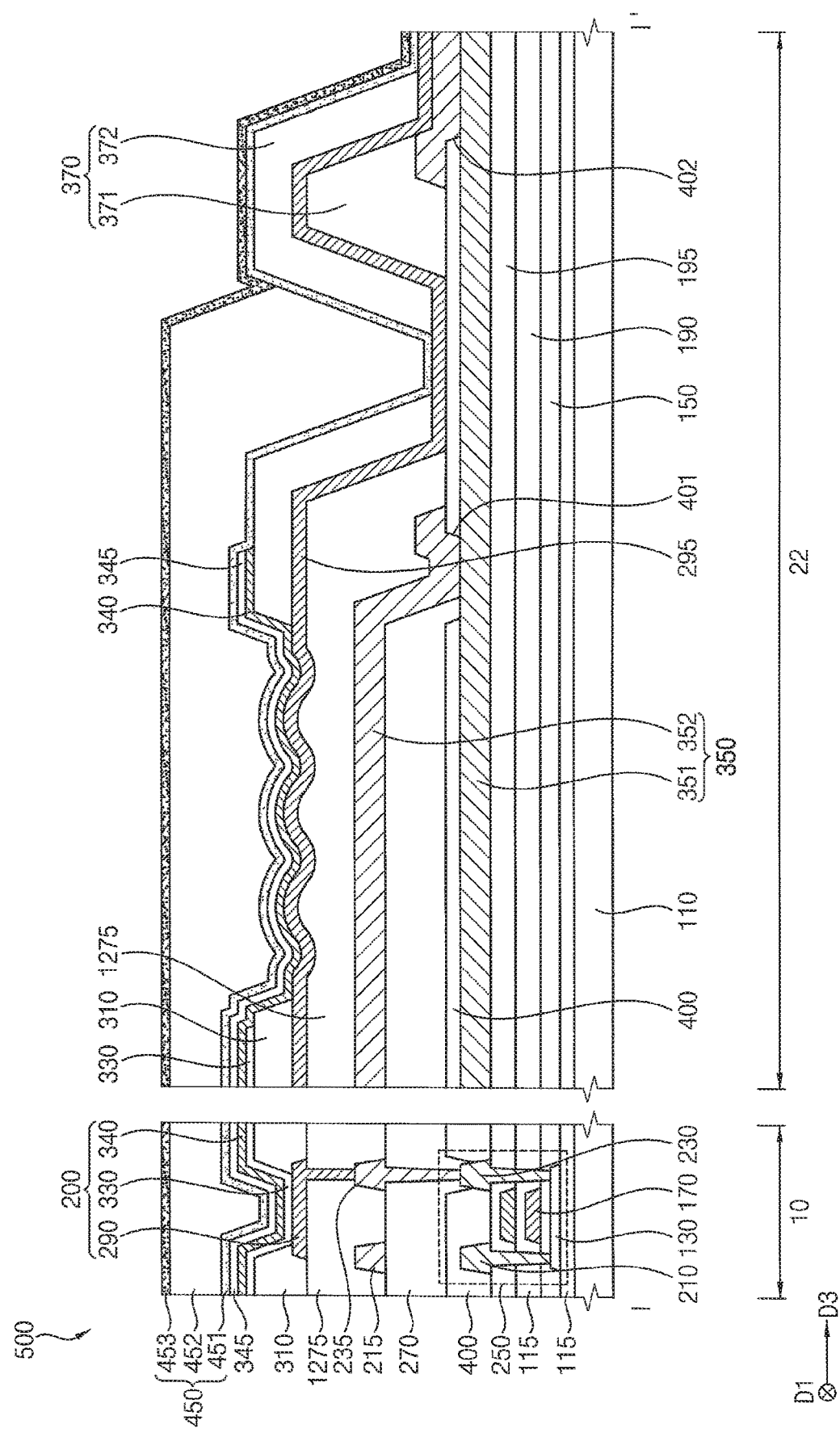
FIGS. 27 and 28 are cross-sectional views showing an organic light emitting diode display device according to exemplary embodiments of the invention.
Figure 28:
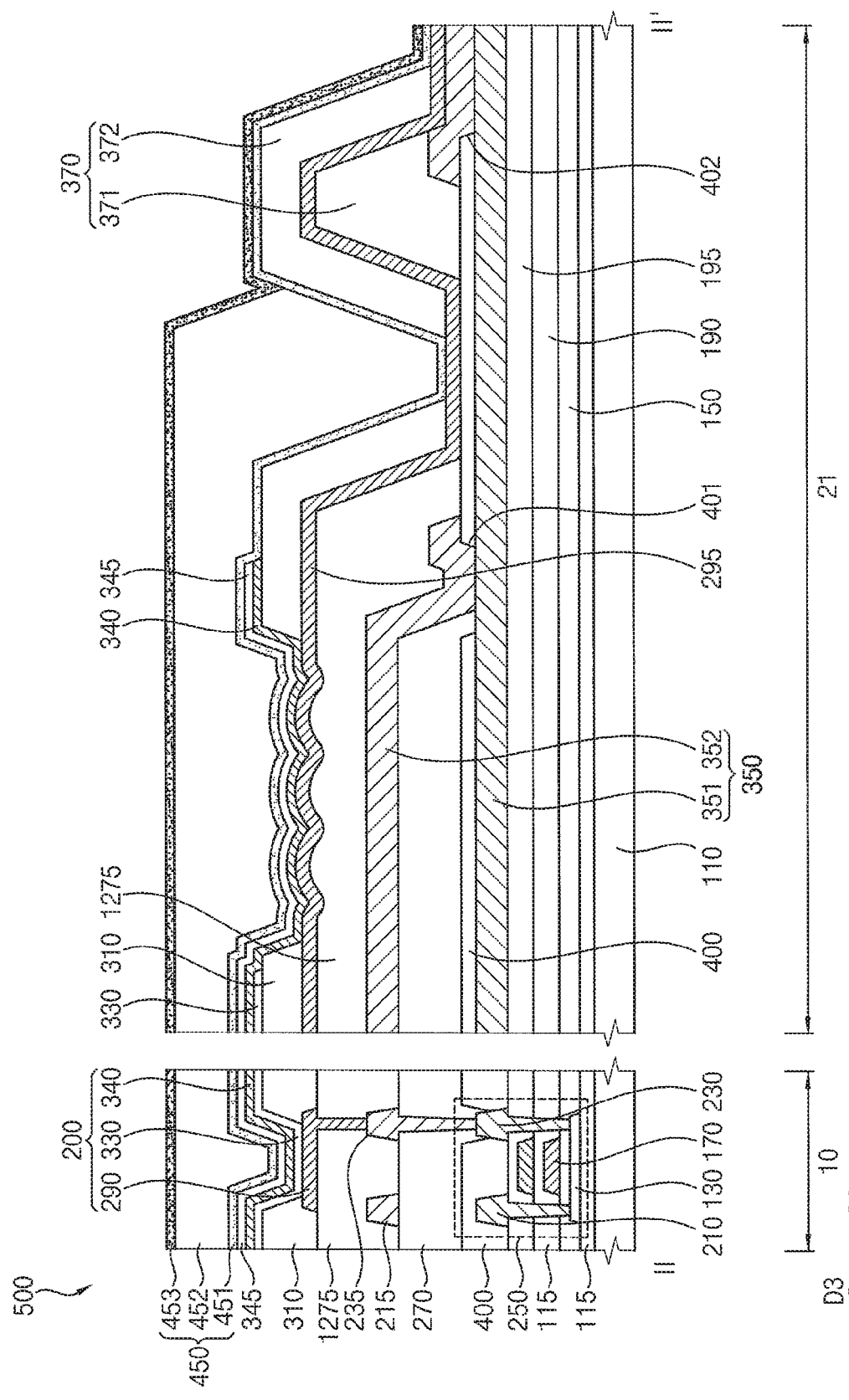

FIGS. 27 and 28 are cross-sectional views showing an organic light emitting diode display device according to exemplary embodiments of the invention. For example, FIG. 27 is a cross-sectional view taken along line I-I' of FIG. 3A, and FIG. 28 is a cross-sectional view taken along line II-II' of FIG. 3A. An organic light emitting diode display device 500 illustrated in FIGS. 27 and 28 may have a configuration which is substantially identical or similar to the OLED display device 100 described with reference to FIGS. 1 to 7 except for a second planarization layer 1275 having an undulating, e.g., a wavy) shape as shown in the figures. In FIGS. 27 and 28, redundant descriptions for elements which are substantially identical or similar to the elements described with reference to FIGS. 1 to 7 will be omitted to avoid redundancy.

Referring to FIGS. 27 and 28, an OLED display device 500 may include a substrate 110, a buffer layer 115, a semiconductor element 250, a protective insulating layer 400, a first power supply wire 350, a first planarization layer 270, a wire pattern 215, a connection electrode 235, a second planarization layer 1275, a pixel defining layer 310, a sub-pixel structure 200, a capping layer 345, a blocking structure 370, a thin film encapsulation structure 450, etc. In this case, the first power supply wire 350 may include a first sub-power supply wire 351 and a second sub-power supply wire 352, and the sub-pixel structure 200 may include a lower electrode 290, a light emitting layer 330, and an upper electrode 340. In addition, the thin film encapsulation structure 450 may include a first thin film encapsulation layer 451, a second thin film encapsulation layer 452, and a third thin film encapsulation layer 453.

The second planarization layer 1275 may be disposed on the wire pattern 215, the connection electrode 235, the second sub-power supply wire 352, and the first planarization layer 270. The second planarization layer 1275 may cover the wire pattern 215 and the connection electrode 235 in the display region 10 on the first planarization layer 270 while extending in the direction from the display region 10 to the peripheral region 20 so as to cover the second sub-power supply wire 352 in the peripheral region 20. In some exemplary embodiments, the second planarization layer 1275 is configured without openings for exposing a top surface of the second sub-power supply wire 352 in the first peripheral region 21 and the second peripheral region 22. In other words, the second planarization layer 1275 located in the first peripheral region 21 and the second peripheral region 22 may cover the second sub-power supply wire 352 adjacent to the display region 10. In addition, the second planarization layer 1275 may have a wavy shape in the first peripheral region 21 and the second peripheral region 22. The second planarization layer 1275 has the wavy shape in the first peripheral region 21 and the second peripheral region 22, so that the connection pattern 295, the upper electrode 340, the capping layer 345, and the first thin film encapsulation layer 451 disposed in the first peripheral region 21 and the second peripheral region 22 on the second planarization layer 1275 may also have a wave shape. In this case, areas of the connection pattern 295 disposed in the first peripheral region 21 and the second peripheral region 22 and the upper electrode 340 making direct contact with the connection pattern 295 may be relatively increased. Alternatively, the second planarization layer 1275 may have the wavy shape in the first peripheral region 21 or the second peripheral region 22. In other exemplary embodiments, the first planarization layer 270 may have the wave shape. In addition, the second planarization layer 1275 and/or the first planarization layer 270 disposed in the third peripheral region 23 may have the wave shape.

In some exemplary embodiments of the invention, the second planarization layer 1275 has a wavy shape in the first peripheral region 21 and the second peripheral region 22, so that areas of the connection pattern 295 and the upper electrode 340 disposed in the first peripheral region 21 may be relatively increased. Accordingly, in the OLED display device 500, the heat generated in the first power supply wire 350 located in a part of the first peripheral region 21 and the second peripheral region 22 may be relatively reduced.

Figure 29:
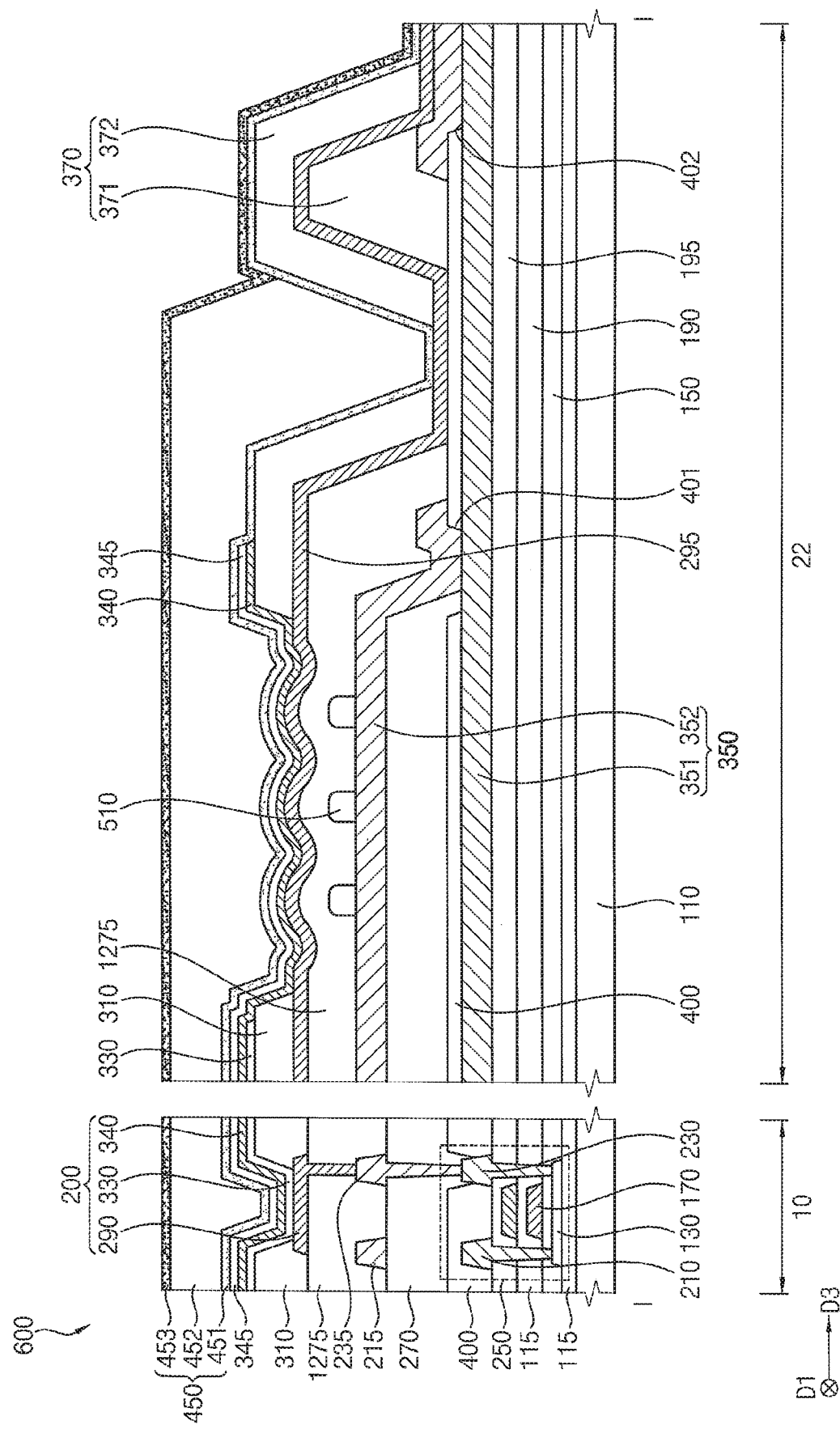
FIGS. 29 and 30 are cross-sectional views showing an organic light emitting diode display device constructed according to exemplary embodiments of the invention.
Figure 30:
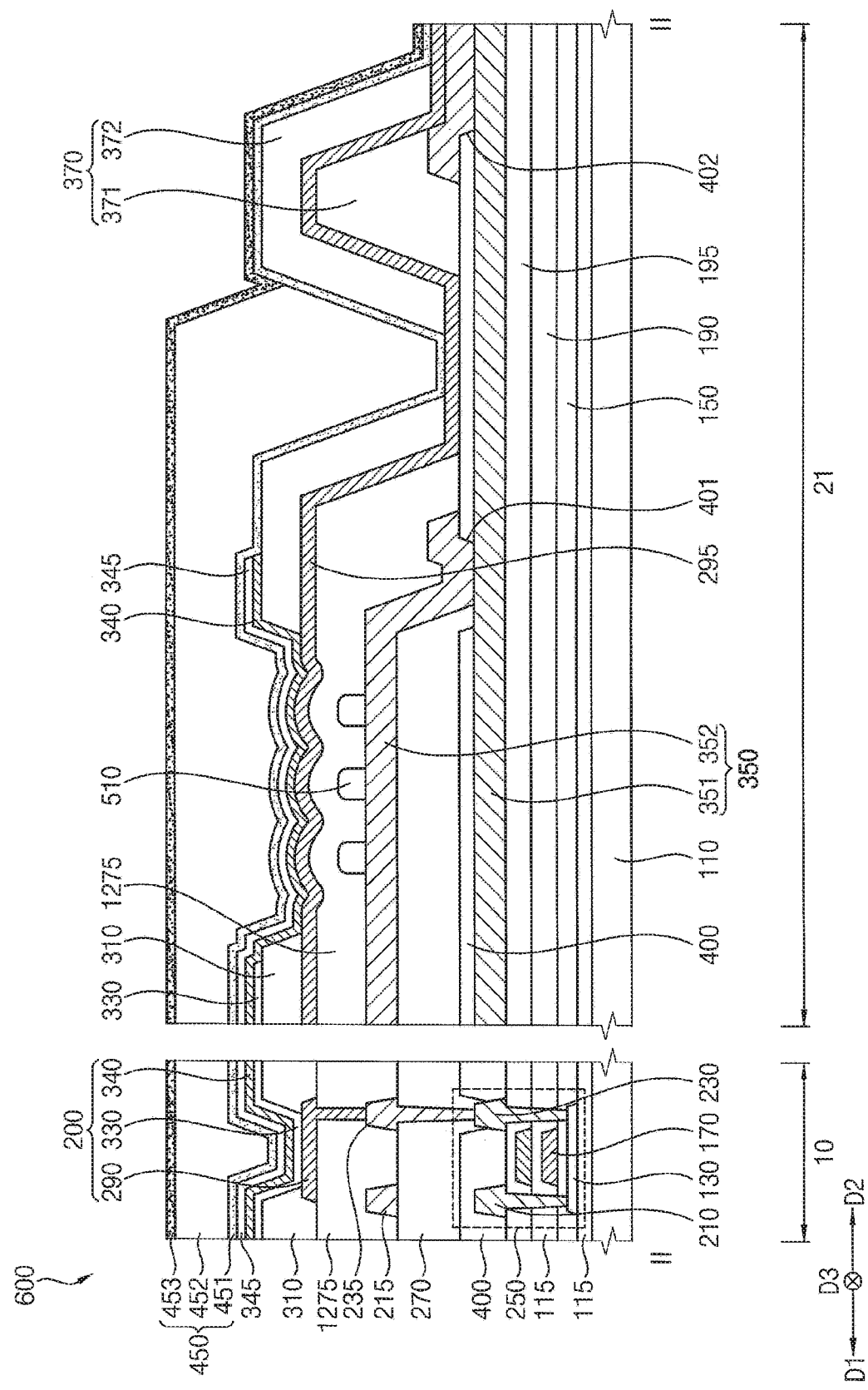

FIGS. 29 and 30 are cross-sectional views showing an organic light emitting diode display device according to exemplary embodiments of the invention. For example, FIG. 29 is a cross-sectional view taken along line I-I' of FIG. 3A, and FIG. 30 is a cross-sectional view taken along line II-II' of FIG. 3A. An OLED display device 600 illustrated in FIGS. 29 and 30 may have a configuration which is substantially identical or similar to the OLED display device 500 described with reference to FIGS. 27 and 28 except for a concavo-convex pattern 510. In FIGS. 29 and 30, redundant descriptions for elements which are substantially identical or similar to the elements described with reference to FIGS. 27 and 28 will be omitted to avoid redundancy.

Referring to FIGS. 29 and 30, an OLED display device 600 may include a substrate 110, a buffer layer 115, a semiconductor element 250, a protective insulating layer 400, a first power supply wire 350, a first planarization layer 270, a wire pattern 215, a connection electrode 235, concavo-convex patterns 510, a second planarization layer 1275, a pixel defining layer 310, a sub-pixel structure 200, a capping layer 345, a blocking structure 370, a thin film encapsulation structure 450, etc. In this case, the first power supply wire 350 may include a first sub-power supply wire 351 and a second sub-power supply wire 352.

A plurality of concavo-convex patterns 510 may be disposed in the first peripheral region 21 and the second peripheral region 22 on the second sub-power supply wire 352. The concavo-convex pattern 510 may assist the second planarization layer 1275 to easily have a wavy shape. For example, the concavo-convex pattern 510 may include an organic material. Alternatively, the concavo-convex pattern 510 may be disposed in the first peripheral region 21 or the second peripheral region 22 on the second sub-power supply wire 352.

In other exemplary embodiments, the concavo-convex pattern 510 may be disposed in the first peripheral region 21 and the second peripheral region 22 on the second planarization layer 1275 of FIGS. 29 and 30. In this case, the connection pattern 295 may be disposed along a profile of the concavo-convex pattern 510 in the first peripheral region 21 and the second peripheral region 22, and the connection pattern 295 may have a wavy shape. In addition, the upper electrode 340 disposed on the connection pattern 295 may have a wave shape.

The principles of the invention may be applied to various display devices including an OLED display device. For example, embodiments of the invention may be take the form of a vehicle-display device, a ship-display device, an aircraft-display device, portable communication devices, display devices for display or for information transfer, a medical-display device, etc Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light emitting diode display device comprising:
    a substrate having a display region, a peripheral region at least partially surrounding the display region and including a first peripheral region, a second peripheral region, and a third peripheral region, and a pad region disposed on one side of the peripheral region;
    a light emitting layer disposed on the substrate in the display region;
    a first power supply disposed in the second and third peripheral regions and a part of the first peripheral region on the substrate;
    a second power supply disposed in the display region, the first peripheral region, and the third peripheral region on the substrate without being disposed in the second peripheral region, and being at least partially surrounded by the first power supply;
    a conductive pattern partially overlapped with the first power supply in the second and third peripheral regions and the part of the first peripheral region on the first power supply, and electrically connected to the first power supply; and
    an upper electrode disposed in the display region and a part of the peripheral region on the conductive pattern and the light emitting layer, partially overlapped with the first power supply and the conductive pattern, and electrically connected to the conductive pattern,
    wherein the first power supply has a first width in the second peripheral region, and has a second width in the third peripheral region, the second width being smaller than the first width.

2. The organic light emitting diode display device of claim 1, further comprising a plurality of pad electrodes disposed in a first part of the pad region,
    wherein the first peripheral region is adjacent to the first part of the pad region where the pad electrodes are disposed, and
    the second peripheral region is located on opposed sides of the first peripheral region while being adjacent to a second part of the pad region where the pad electrodes are not disposed.

3. The organic light emitting diode display device of claim 2, wherein the first power supply comprises a wire electrically connected to the pad electrodes in the first peripheral region.

4. The organic light emitting diode display device of claim 1, wherein at least one of the conductive pattern and the upper electrode has an undulating shape in the first peripheral region.

5. The organic light emitting diode display device of claim 1, wherein a low power supply voltage is applied to the first power supply, and
    a high power supply voltage is applied to the second power supply.

6. The organic light emitting diode display device of claim 1, wherein the second power supply comprises a wire having:
    a first portion disposed in the first peripheral region;
    a second portion disposed in the display region and having a grid shape; and
    a third portion disposed in a part of the third peripheral region to at least partially surround the second portion, and
    the first, second, and third portions of the wire are formed integrally with each other.

7. The organic light emitting diode display device of claim 6, wherein the first and second portions of the wire are connected to each other in the first peripheral region adjacent to a part of a boundary between the display region and the peripheral region, and
    the second and third portions of the wire are connected to each other in the third peripheral region adjacent to another part of the boundary between the display region and the peripheral region.

8. The organic light emitting diode display device of claim 6, wherein the third portion of the wire is spaced apart from an inner side of the first power supply.

9. The organic light emitting diode display device of claim 6, wherein the third portion of the wire is not disposed in the second peripheral region.

10. The organic light emitting diode display device of claim 6, wherein the second portion of the wire has a lattice shape in one part of the display region, and has a bar shape in another part of the display region.

11. The organic light emitting diode display device of claim 1, wherein the display region has a rectangular shape with curved corners, and
the curved corners of the display region include:
first corners adjacent to the pad region; and
second corners facing the first corners.

12. The organic light emitting diode display device of claim 11, wherein the first corners are adjacent to the second peripheral region, and
the second corners are adjacent to the third peripheral region.

13. The organic light emitting diode display device of claim 1, further comprising:
a protective insulating layer disposed in the display region and the peripheral region between the substrate and the light emitting layer, and defining an opening in the second peripheral region;
a first planarization layer disposed in the display region and a part of the peripheral region on the protective insulating layer to expose the opening of the protective insulating layer; and
a second planarization layer disposed in the display region and a part of the peripheral region on the first planarization layer, and having a plurality of openings exposing the first power supply in the second peripheral region.

14. The organic light emitting diode display device of claim 13, wherein the second planarization layer located in the first peripheral region is formed without the plurality of openings exposing the first power supply.

15. The organic light emitting diode display device of claim 13, wherein the second planarization layer located in the first peripheral region has an undulating shape.

16. The organic light emitting diode display device of claim 13, further comprising a plurality of concave-convex patterns disposed between the first planarization layer and the second planarization layer.

17. The organic light emitting diode display device of claim 13, wherein the light emitting layer extends from the display region to the peripheral region, and
the light emitting layer located in the peripheral region is not overlapped with the plurality of openings of the second planarization layer in the second peripheral region.

18. The organic light emitting diode display device of claim 13, further comprising a lower electrode disposed in the display region on the second planarization layer, wherein the upper electrode is disposed on the lower electrode, and the upper electrode extends from the display region to the peripheral region.

19. The organic light emitting diode display device of claim 18, wherein the upper electrode makes direct contact with the conductive pattern in the second peripheral region.

20. The organic light emitting diode display device of claim 18, wherein the upper electrode has an undulating shape in the first peripheral region, and
the upper electrode makes direct contact with the conductive pattern in the first peripheral region.

21. The organic light emitting diode display device of claim 18, wherein the lower electrode is located on a same layer as the conductive pattern.

22. The organic light emitting diode display device of claim 13, wherein the first power supply comprises:
a first sub-power supply disposed between the substrate and the protective insulating layer, and exposed by the opening of the protective insulating layer; and
a second sub-power supply disposed between the first planarization layer and the second planarization layer, in direct contact with the first sub-power supply through the opening of the protective insulating layer, and exposed by the openings of the second planarization layer.

23. The organic light emitting diode display device of claim 22, wherein the conductive pattern comprises a connection pattern in direct contact with the second sub-power supply through the plurality of openings of the second planarization layer.

24. The organic light emitting diode display device of claim 22, further comprising:
a semiconductor element disposed in the display region between the substrate and the protective insulating layer; and
a wire pattern and a connection electrode disposed in the display region between the first planarization layer and the second planarization layer.

25. The organic light emitting diode display device of claim 24, wherein the wire pattern and the connection electrode are located on the same layer as the second sub-power supply.

26. The organic light emitting diode display device of claim 24, wherein the semiconductor elements includes:
an active layer disposed in the display region on the substrate;
a gate insulating layer disposed on the active layer;
a gate electrode disposed on the gate insulating layer;
an insulating interlayer disposed on the gate electrode; and
source and drain electrodes disposed on the insulating interlayer.

27. The organic light emitting diode display device of claim 26, wherein the source and drain electrodes are located on a same layer as the first sub-power supply.

* * * * *